United States Patent
Britcher et al.

(10) Patent No.: US 12,080,528 B2
(45) Date of Patent: Sep. 3, 2024

(54) SYSTEMS AND METHODS FOR CLEANING A SHOWERHEAD

(71) Applicant: Lam Research Corporation, Fremont, CA (US)

(72) Inventors: Eric Bramwell Britcher, San Jose, CA (US); Gerald Vartanian, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/769,683

(22) PCT Filed: Oct. 20, 2020

(86) PCT No.: PCT/US2020/056534
§ 371 (c)(1),
(2) Date: Apr. 15, 2022

(87) PCT Pub. No.: WO2021/086691
PCT Pub. Date: May 6, 2021

(65) Prior Publication Data
US 2022/0367159 A1    Nov. 17, 2022

Related U.S. Application Data

(60) Provisional application No. 62/929,328, filed on Nov. 1, 2019.

(51) Int. Cl.
*H01J 37/32* (2006.01)
*B08B 6/00* (2006.01)
(Continued)

(52) U.S. Cl.
CPC .......... *H01J 37/32862* (2013.01); *B08B 6/00* (2013.01); *B08B 13/00* (2013.01);
(Continued)

(58) Field of Classification Search
CPC ........... H01G 4/33; H01G 4/012; H01G 4/18; H01G 4/224; H01G 4/232; H01G 4/32; H01G 4/38
See application file for complete search history.

(56) References Cited

U.S. PATENT DOCUMENTS 5,829,087 A * 11/1998 Nishimura ........ H01L 21/67046
15/21.1
2010/0170533 A1* 7/2010 Terada .................. B82Y 40/00
15/159.1

(Continued)

FOREIGN PATENT DOCUMENTS

DE    102015107315 A1 *  1/2016   ........... A46B 13/001
KR    20100024872 A   *  3/2010

OTHER PUBLICATIONS

Machine translation of DE-102015107315-A1 (Year: 216).*
Machine translation of KR-20100024872-A (Year: 2010).*
ISR & WO PCT/US2020/056534, dated Feb. 10, 2021, 11 pages.

*Primary Examiner* — Erin F Bergner
(74) *Attorney, Agent, or Firm* — PENILLA IP, APC

(57) ABSTRACT

Systems and methods for cleaning a showerhead are described. One of the systems includes a support section and a press plate located above the support section to be supported by the support section. The system further includes a cleaning layer located above the press plate. The cleaning layer moves to clean a showerhead. The support section contacts an arm of a spindle assembly for movement with movement of the arm.

19 Claims, 43 Drawing Sheets

(51) Int. Cl.
*B08B 13/00* (2006.01)
*C23C 16/44* (2006.01)
*C23C 16/455* (2006.01)

(52) U.S. Cl.
CPC ...... *C23C 16/4407* (2013.01); *H01J 37/3244* (2013.01); *C23C 16/45565* (2013.01)

(56) References Cited

U.S. PATENT DOCUMENTS

| | | | |
|---|---|---|---|
| 2010/0175716 A1* | 7/2010 | Sugo | B08B 7/0028 15/207.2 |
| 2012/0255486 A1 | 10/2012 | Jiang et al. | |
| 2013/0344244 A1 | 12/2013 | Du et al. | |
| 2016/0233115 A1 | 8/2016 | Huang et al. | |
| 2018/0056340 A1 | 3/2018 | Teng et al. | |
| 2019/0172738 A1 | 6/2019 | Hiester et al. | |
| 2021/0111041 A1* | 4/2021 | Mochizuki | H01L 21/67046 |

* cited by examiner (Plasma Chamber)

(Load Locks for transporting clean assembly)

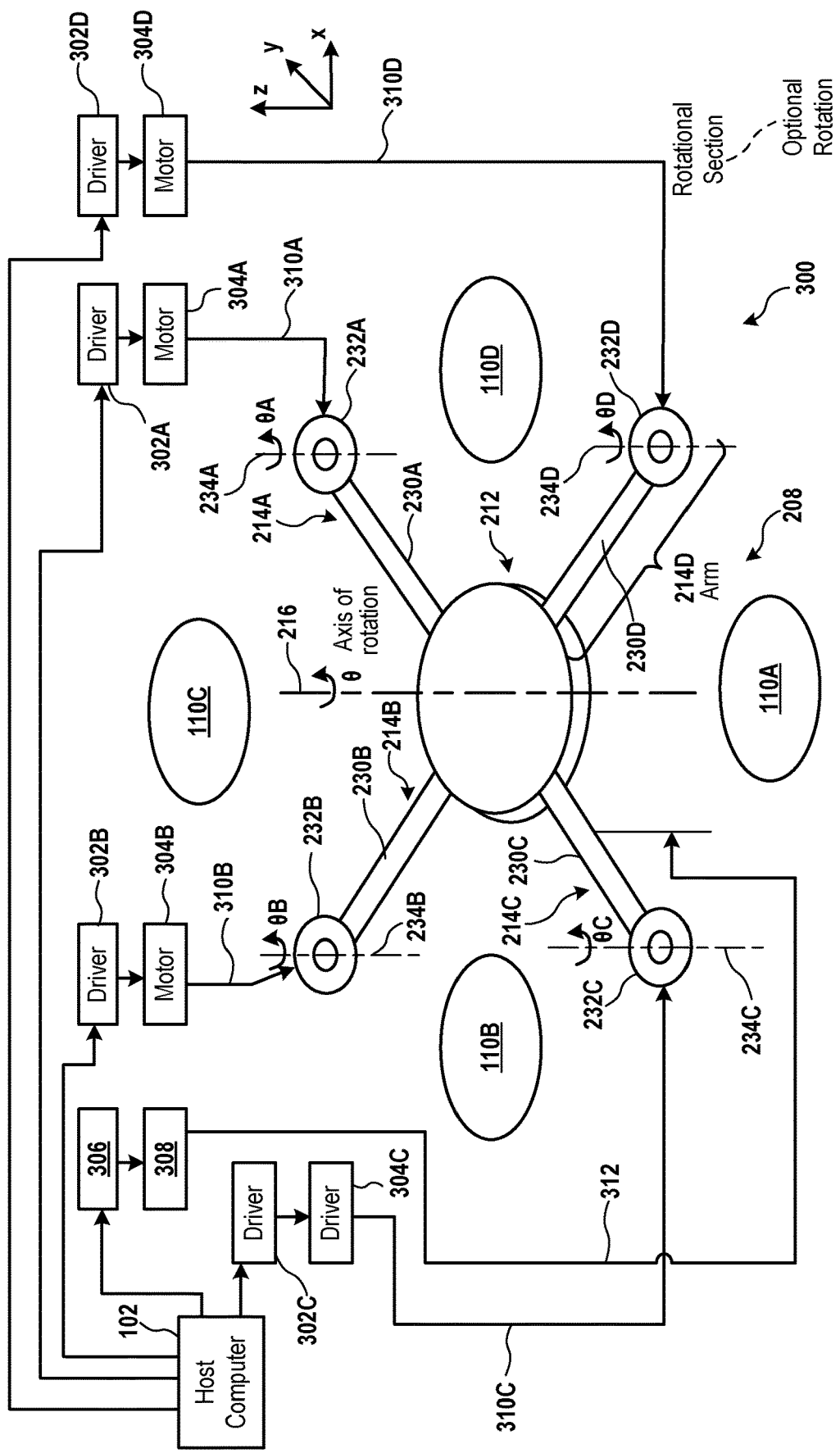
FIG. 3 (Rotation Apparatus)

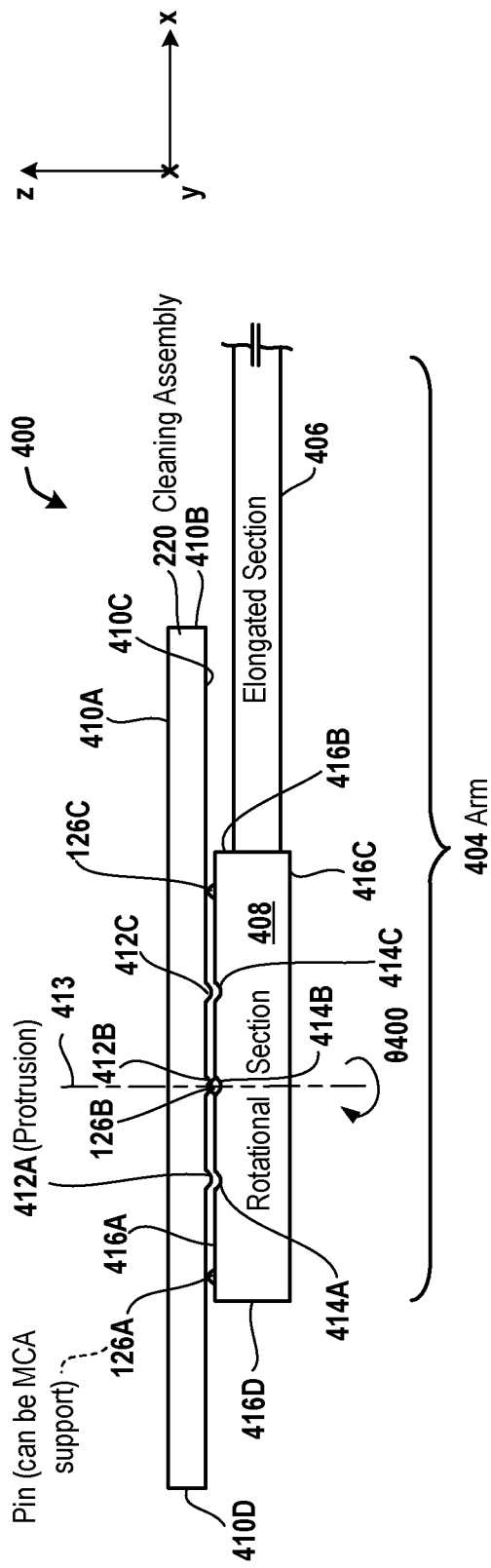
FIG. 4A (Cleaning Assembly on Arm)
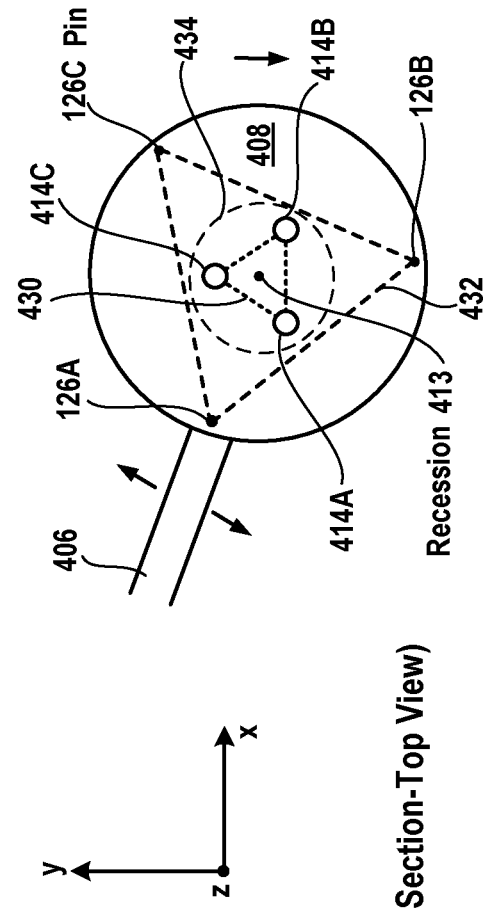
FIG. 4B (Rotational Section-Top View)

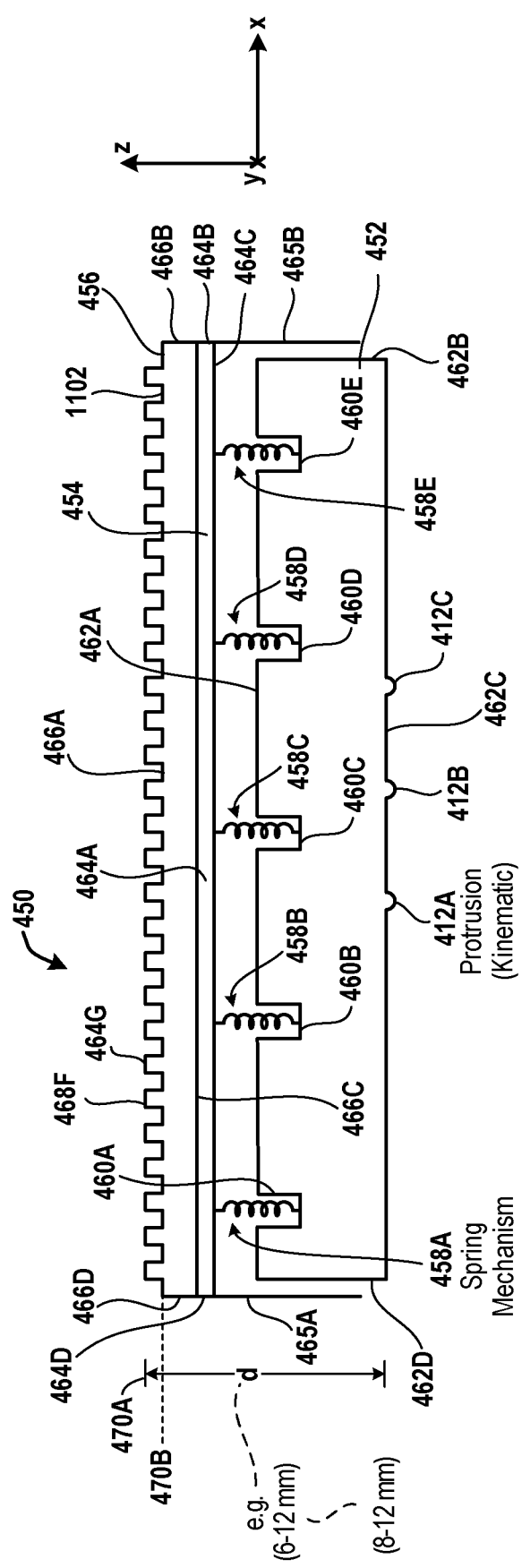
FIG. 4C (Cleaning Assembly)
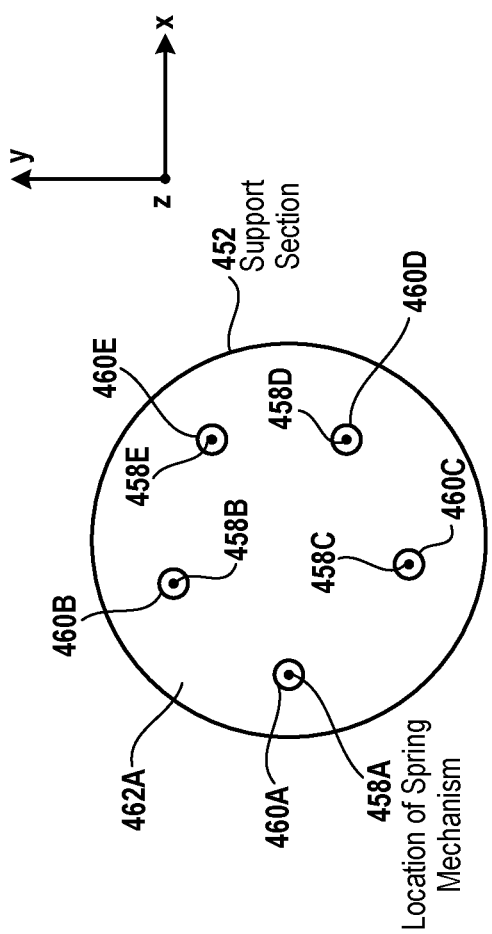
FIG. 4D (Top View of Support Section)

(Cleaning Assembly - Detail View)

(Cleaning Assembly Detail View)

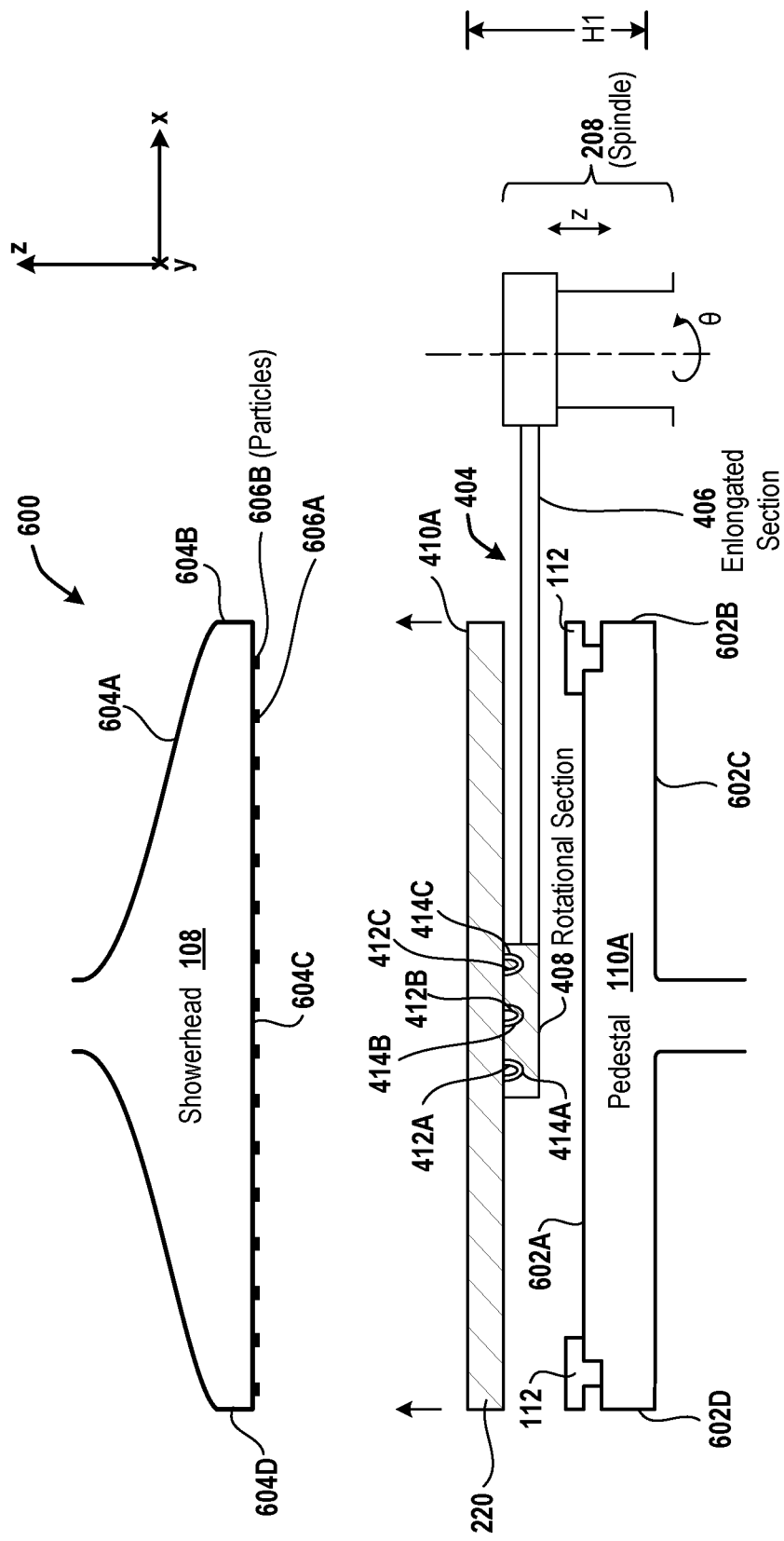
FIG. 6A (Cleaning Assembly - Lowered Position)

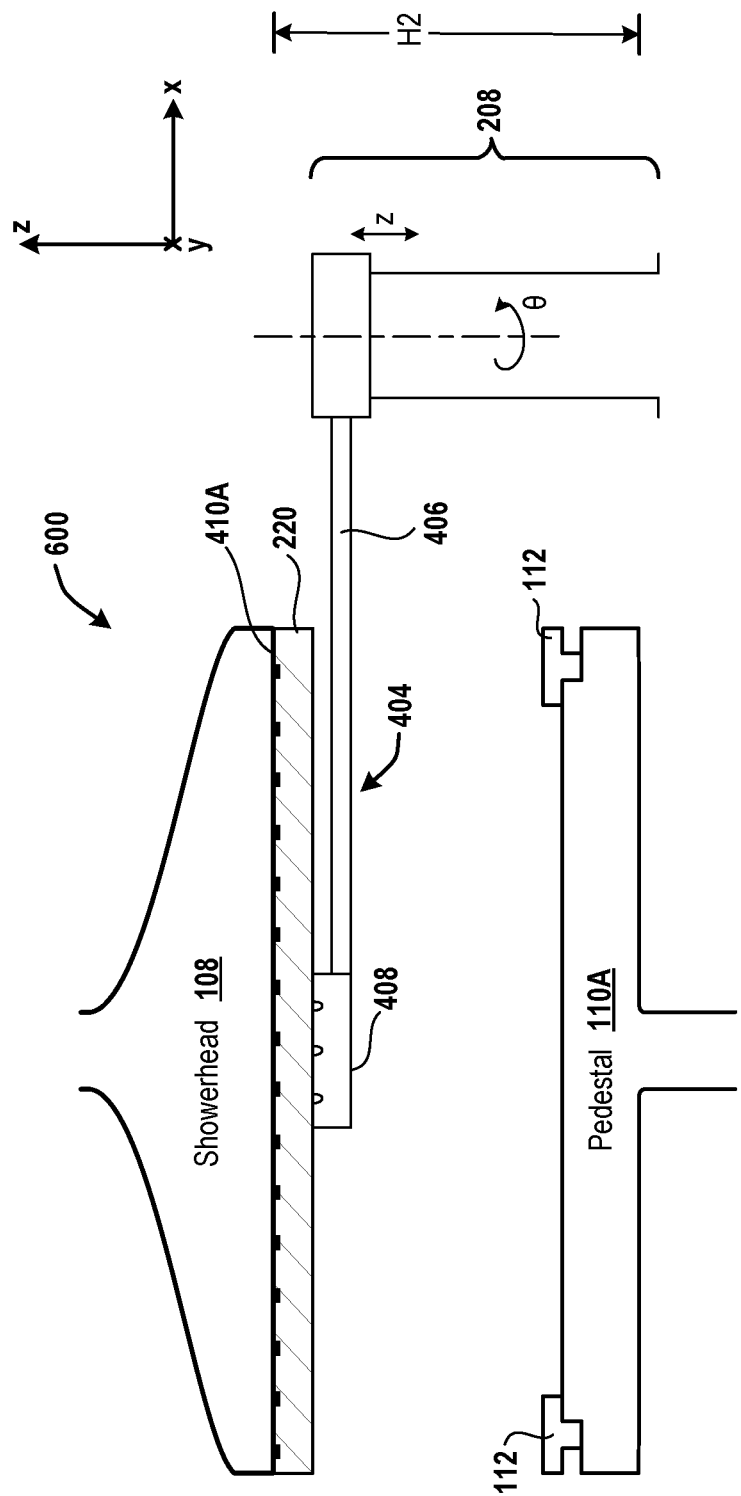
FIG. 6B (Cleaning Assembly - Raised Position)

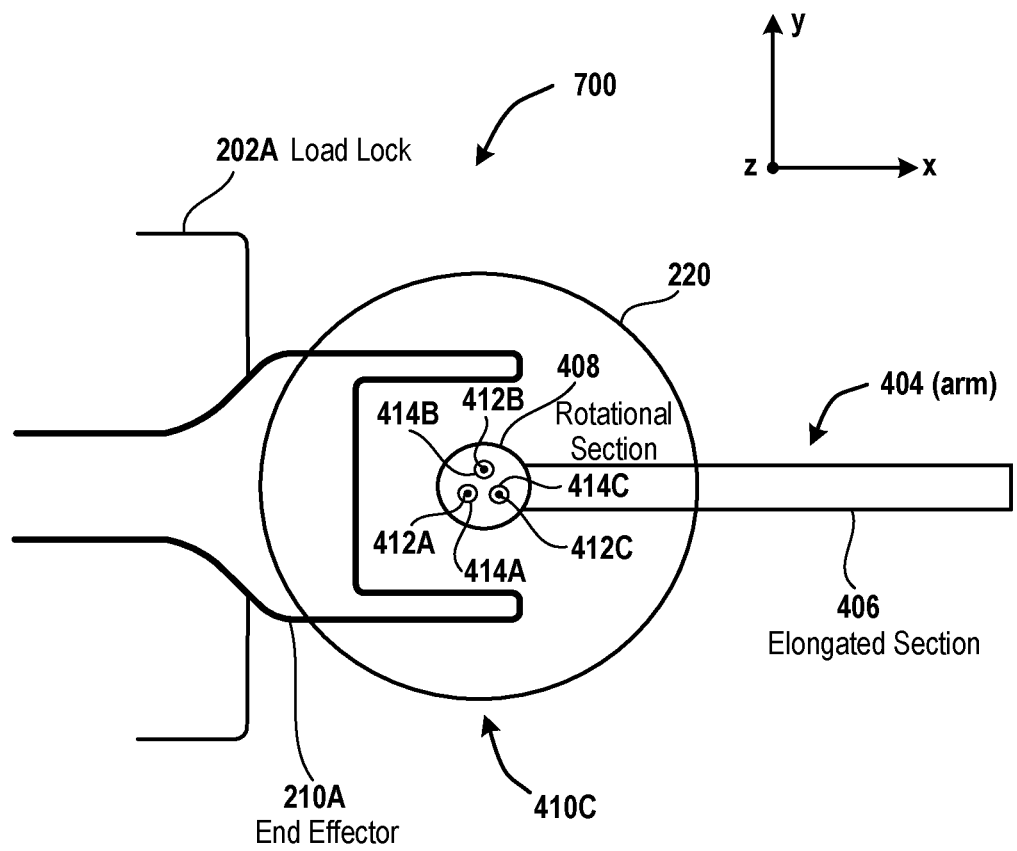
FIG. 7 (Transportation of Cleaning Assembly To & From Load Lock)

(Lift Pins To Raise Cleaning System)

(Spider Forks)

(Spider Forks For
Lifting Cleaning Assembly)

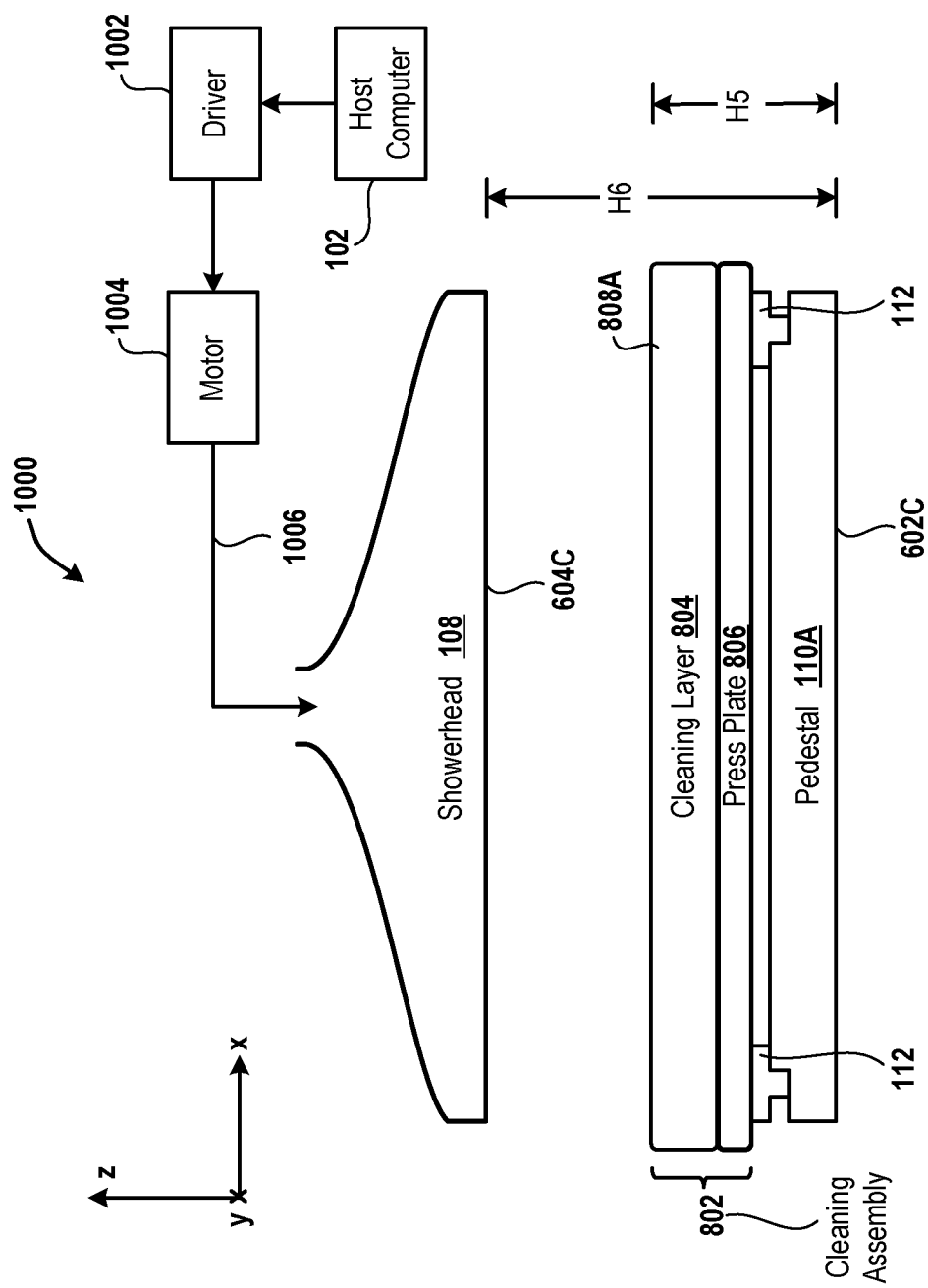
FIG. 10A (Showerhead Moved to Contact Cleaning Apparatus)

(Cleaning Assembly)

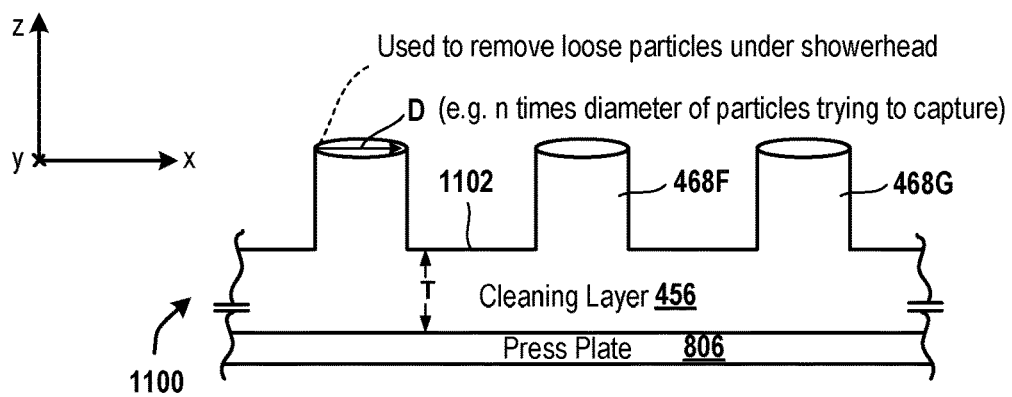
FIG. 11B (Cleaning Layer)
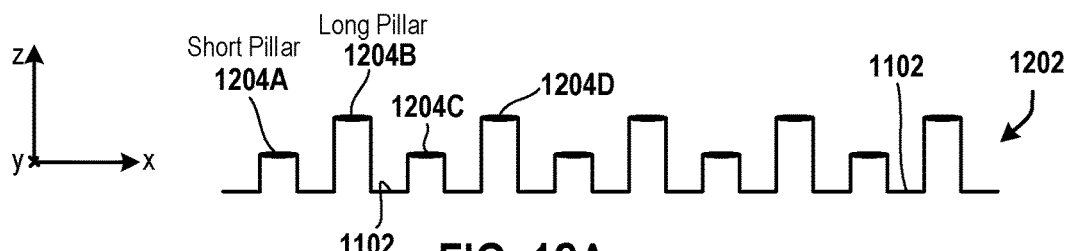
FIG. 12A (Pillar Pattern)
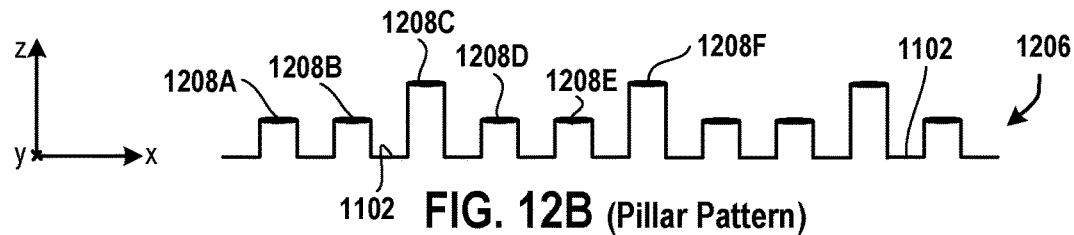
FIG. 12B (Pillar Pattern)
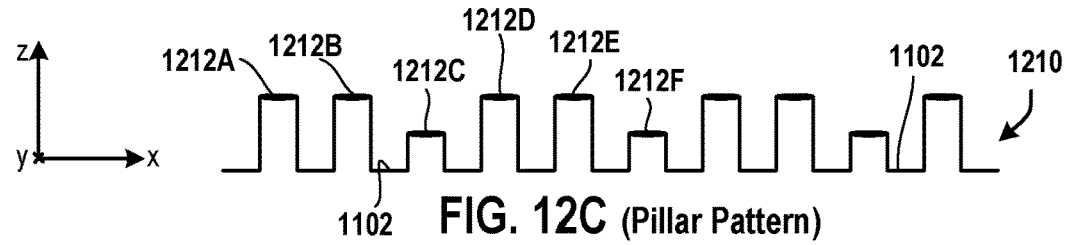
FIG. 12C (Pillar Pattern)
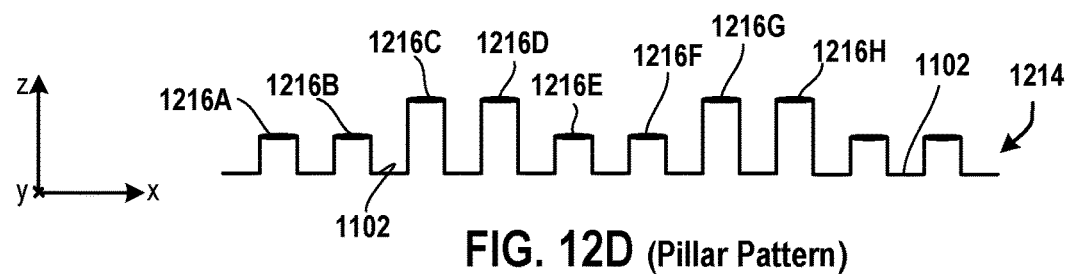
FIG. 12D (Pillar Pattern)

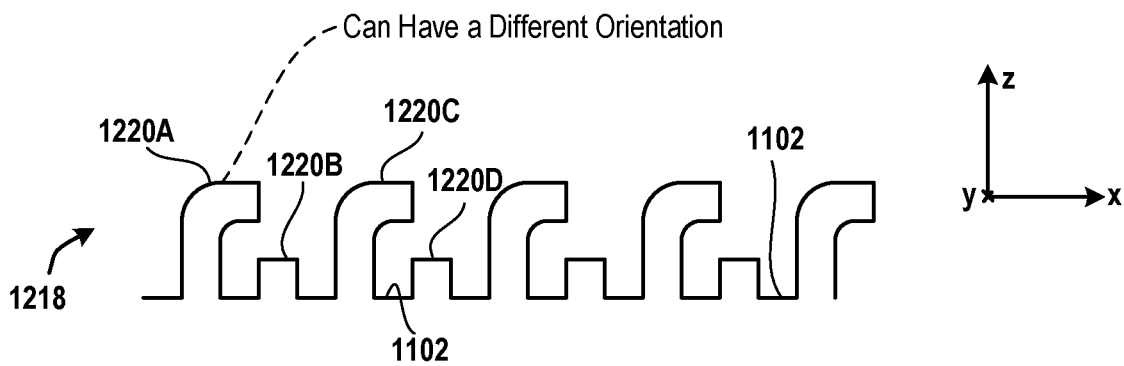
FIG. 12E (Pillar Pattern)
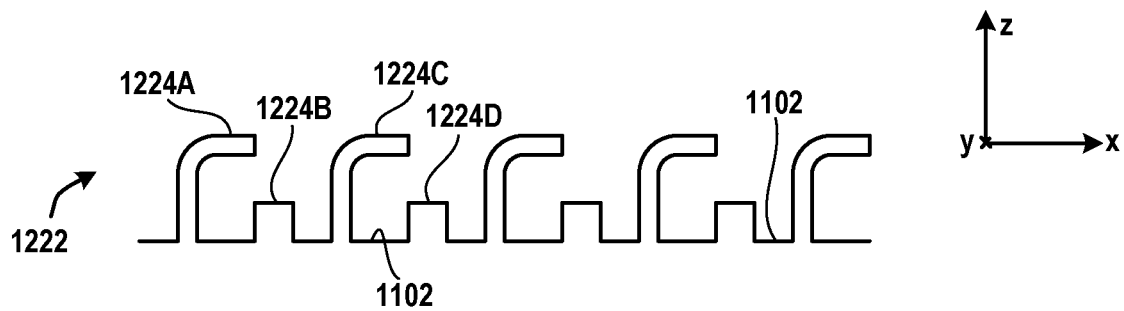
FIG. 12F (Pillar Pattern)
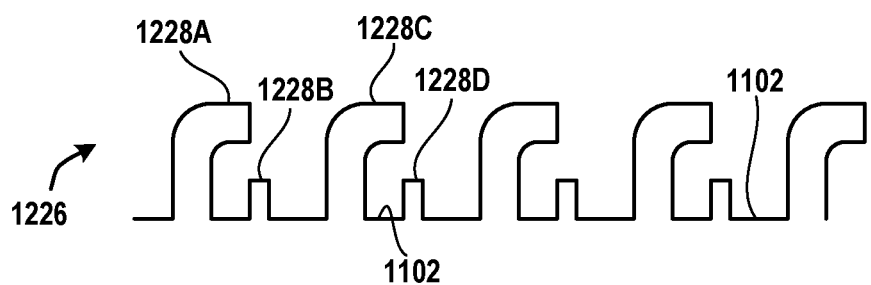
FIG. 12G (Pillar Pattern)

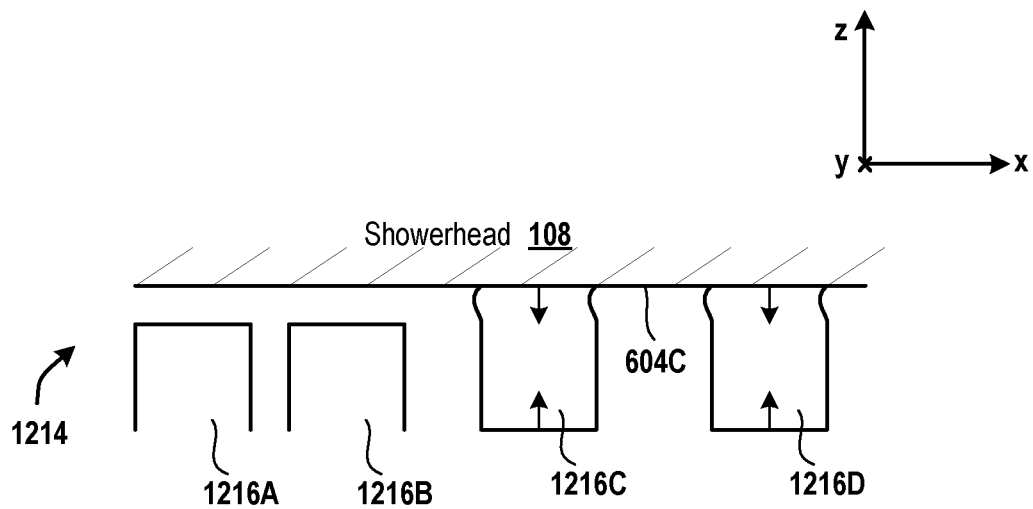
FIG. 12H (Deflection of Pillars)
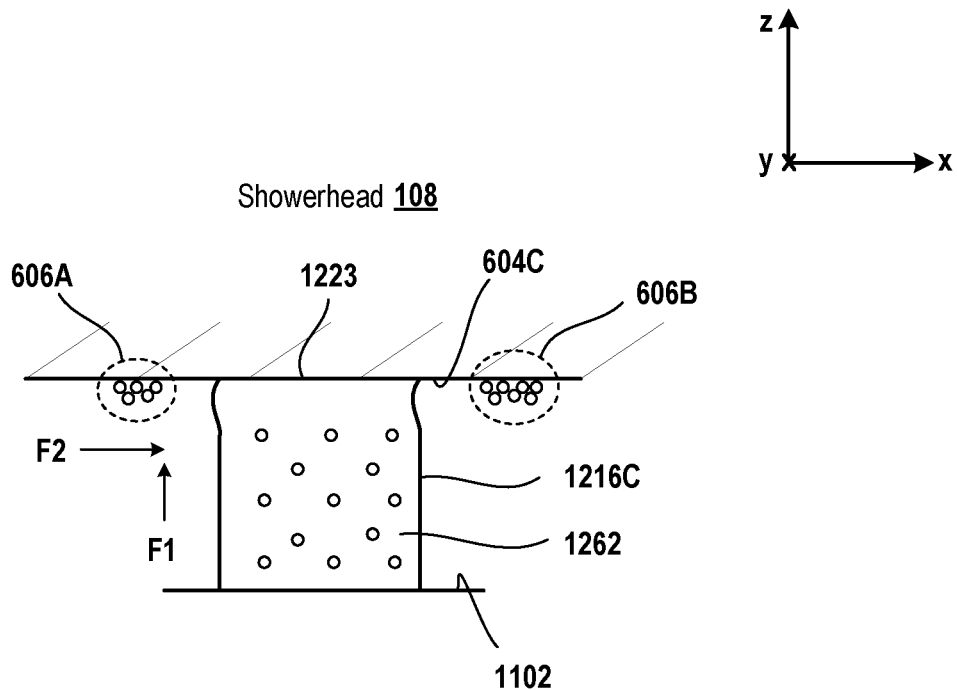
FIG. 12I (Forces Applied by Pillar)

(Sub- Pattern of Pillars - Top View)

(Grid Pattern of Pillars - Top View)

(Pillars and Non-pillar Sections)

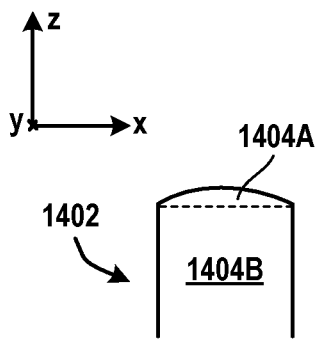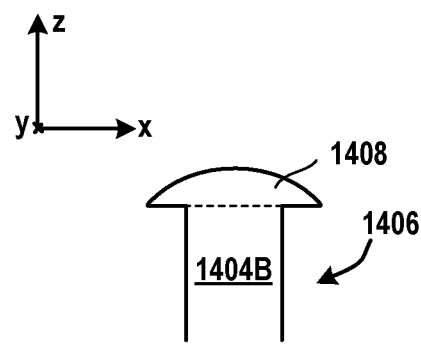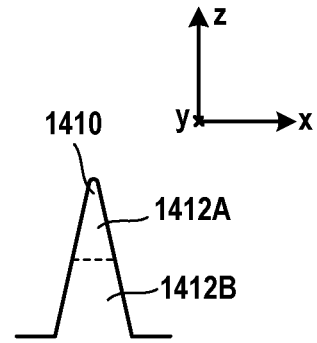
FIG. 14A
(Dome - Top pillar)
FIG. 14B
(Mushroom – shaped pillar)
FIG. 14C
(Cone – shaped pillar)
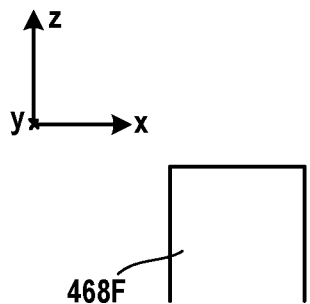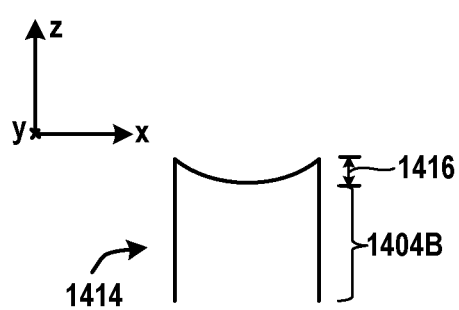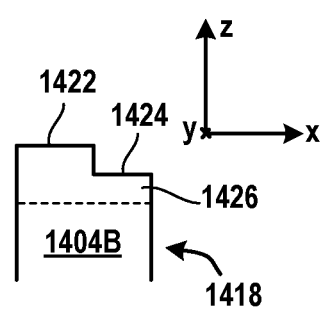
FIG. 14D
(Flat - Top pillar)
FIG. 14E
(Recessive – Top pillar)
FIG. 14F
(Multi-surface – Top pillar)
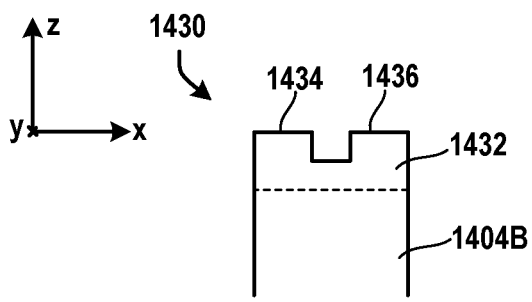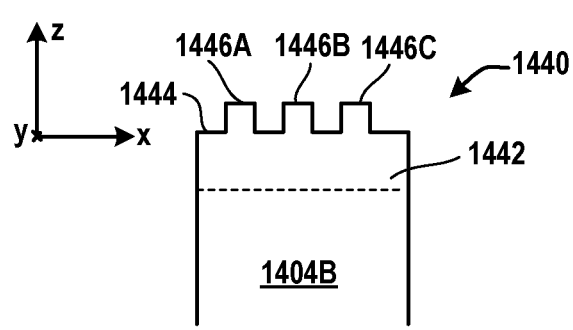
FIG. 14G
(Slotted - Top pillar)
FIG. 14H
(Protrusion- Top pillar)

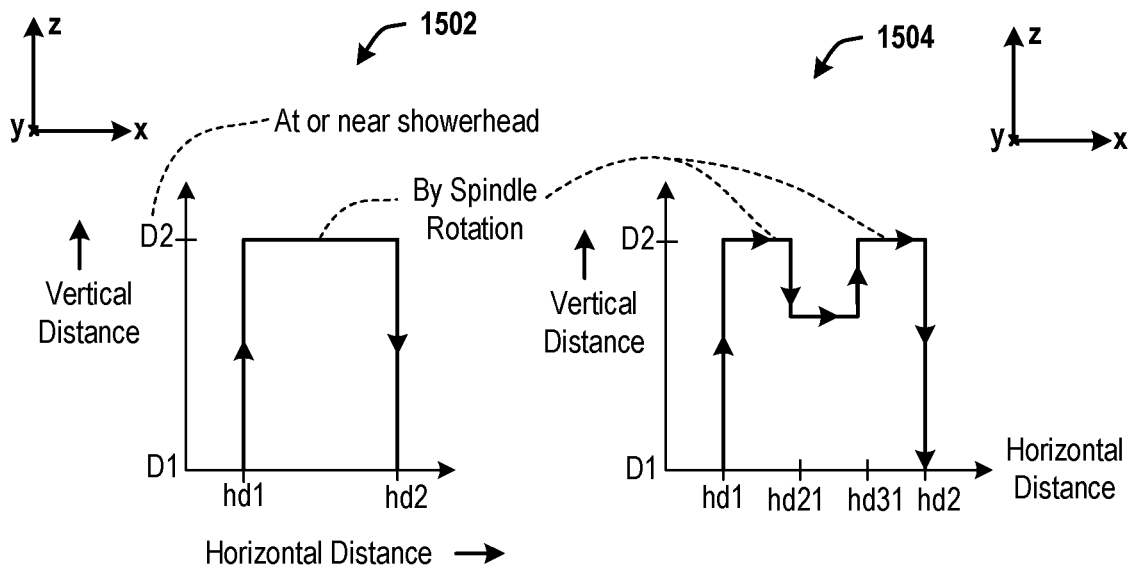
FIG. 15A
(Motion of Cleaning Assembly)
FIG. 15B
(Motion of Cleaning Assembly)
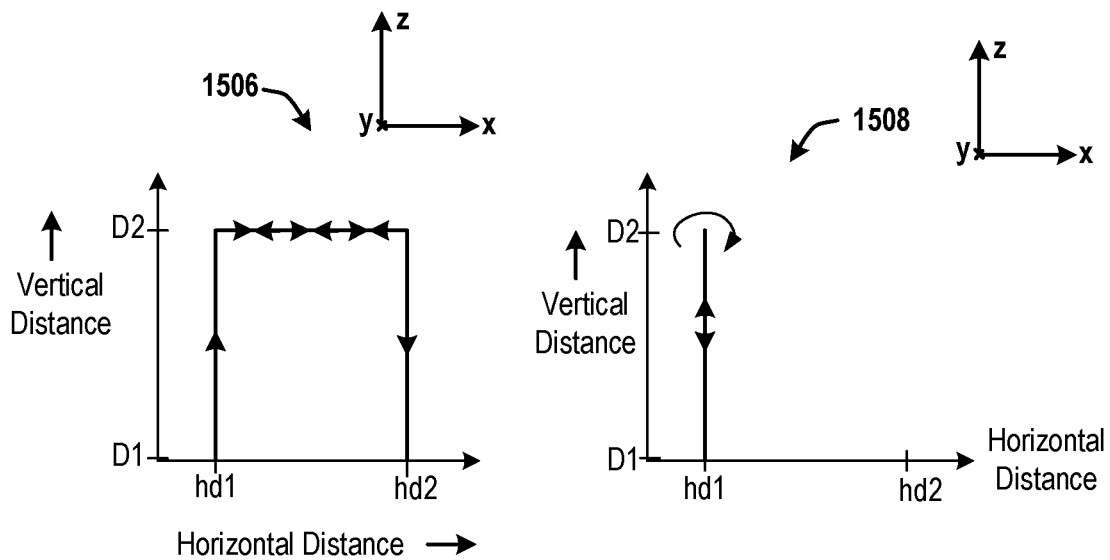
FIG. 15C
(Motion of Cleaning Assembly)
FIG. 15D
(Motion of Cleaning Assembly)

(FOUP Side View)

(FOUP - Top View)

(FOUP - Top View)

(FOUP - Top View)

(Roller System With One Roller - Top View)

(Two or More Roller of a
Roller System – Top View)

(Roller System With
Two or More Rollers – Side View)

(Roller System With Rows of Rollers)

(Roller System With Rows of Rollers)

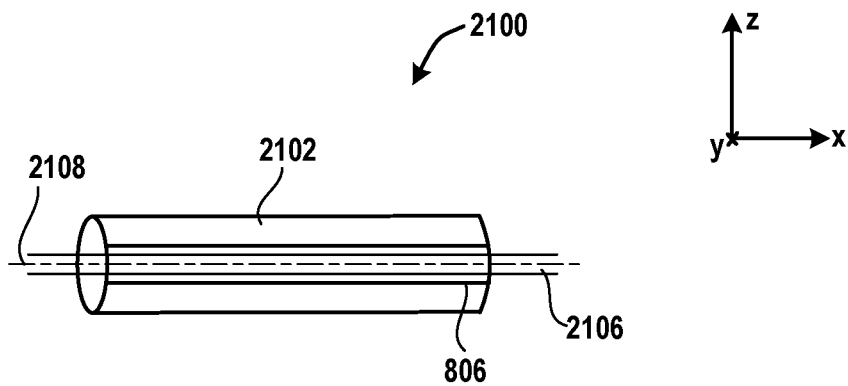
FIG. 21A
(Roller With Cleaning and Rigid Layer)
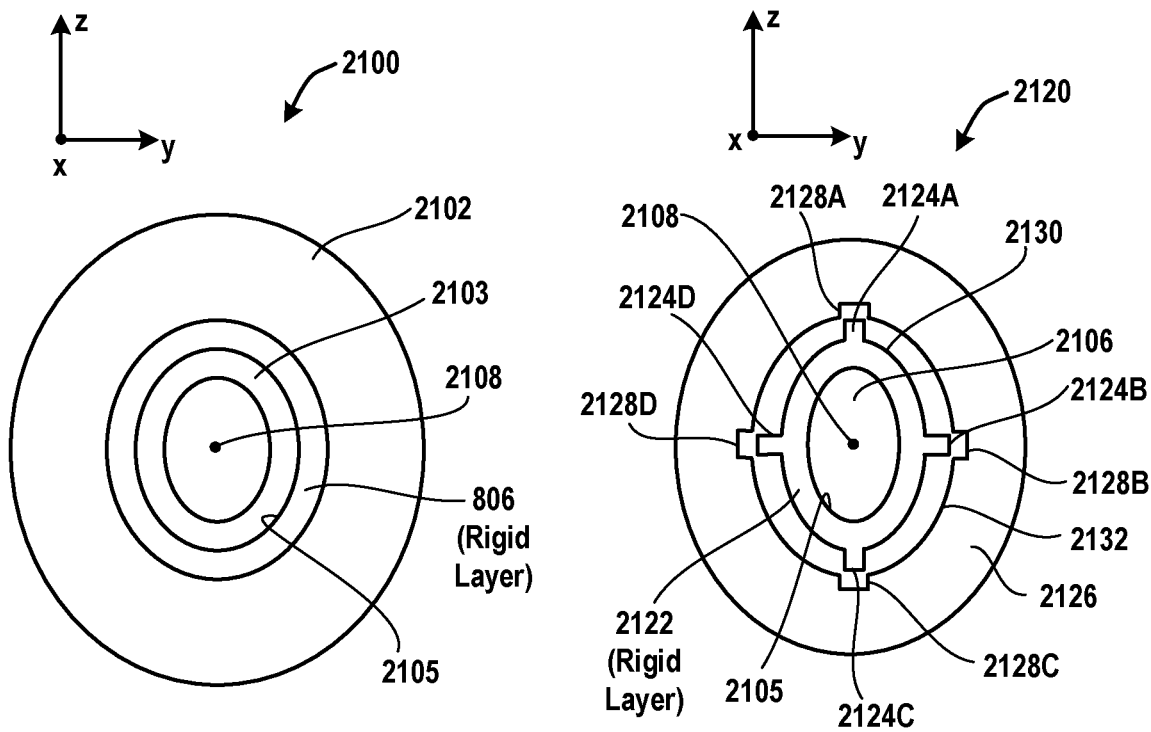
FIG. 21B
FIG. 21C
(Roller With Rigid Layer Having Protruded Sections)

(Cleaning Assembly With Idler Roller)

(Tapered Roller – Top View)

(Tapered Roller - Side View)

(Cleaning Assembly)

(Cleaning Assembly – Side View)

(Cleaning Assembly - Side View)

(Press Plate - Bottom View)

(Pad - Bottom View)

(Support Plate - Bottom View)

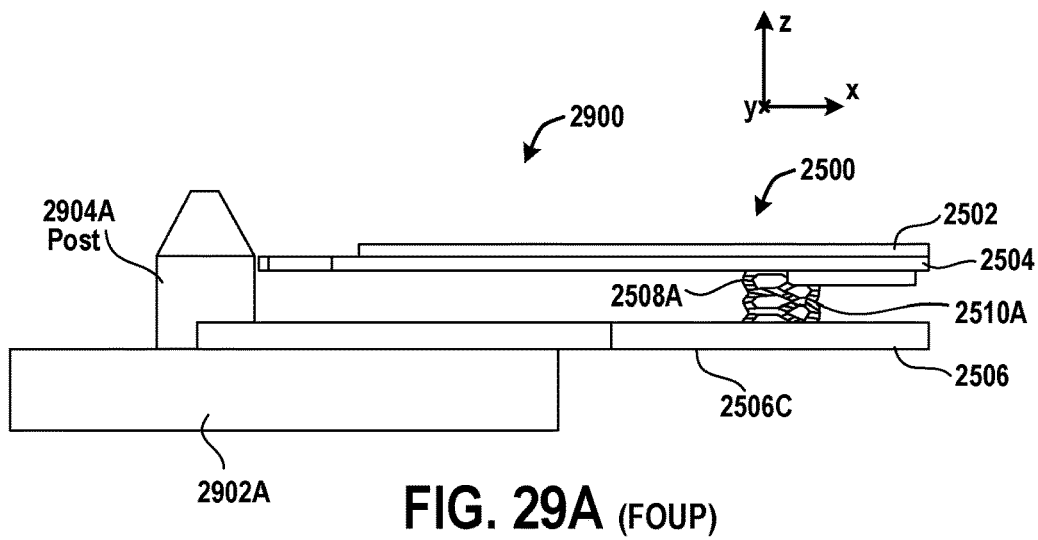
FIG. 29A (FOUP)
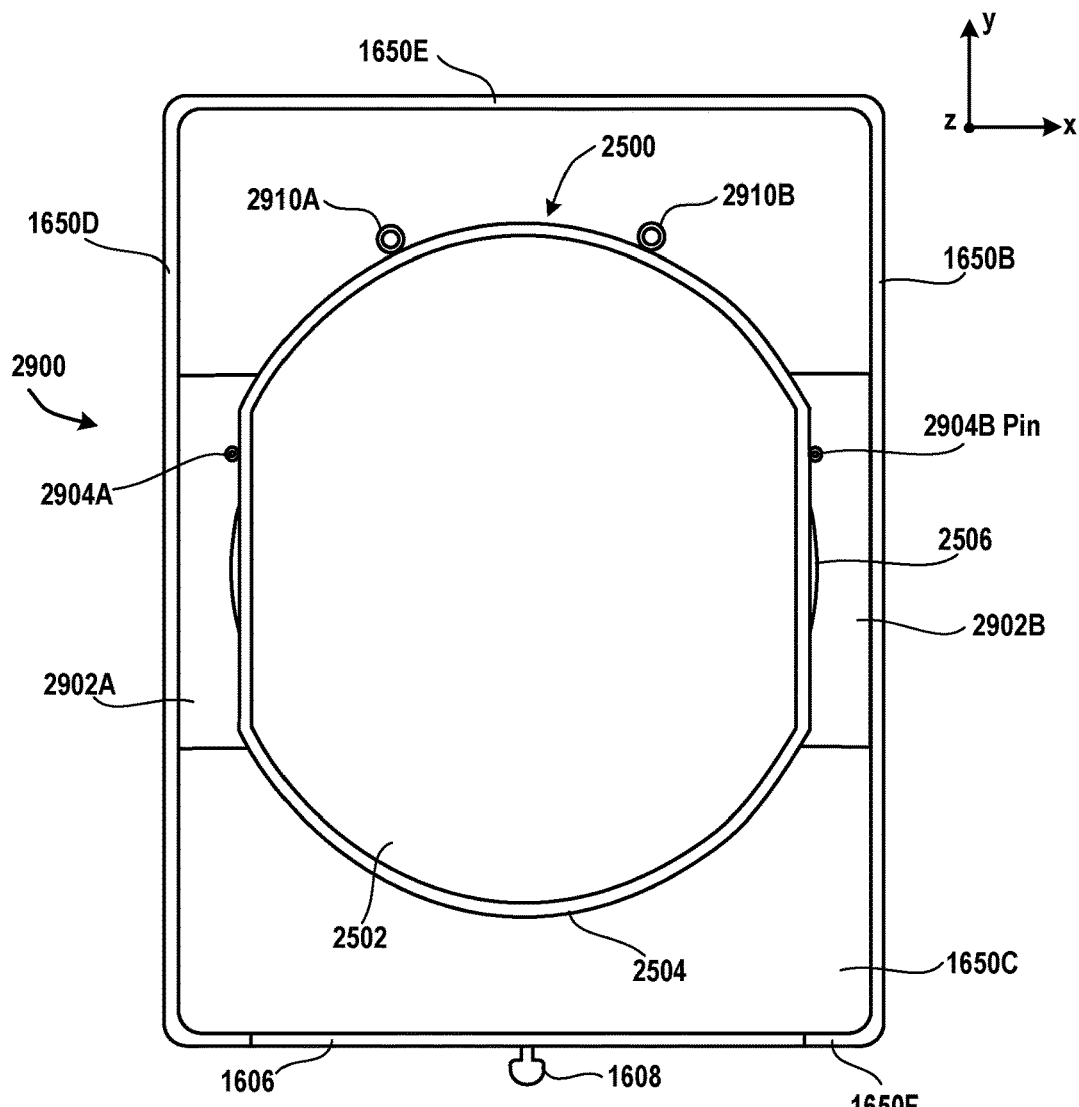
FIG. 29B (FOUP – Top View)

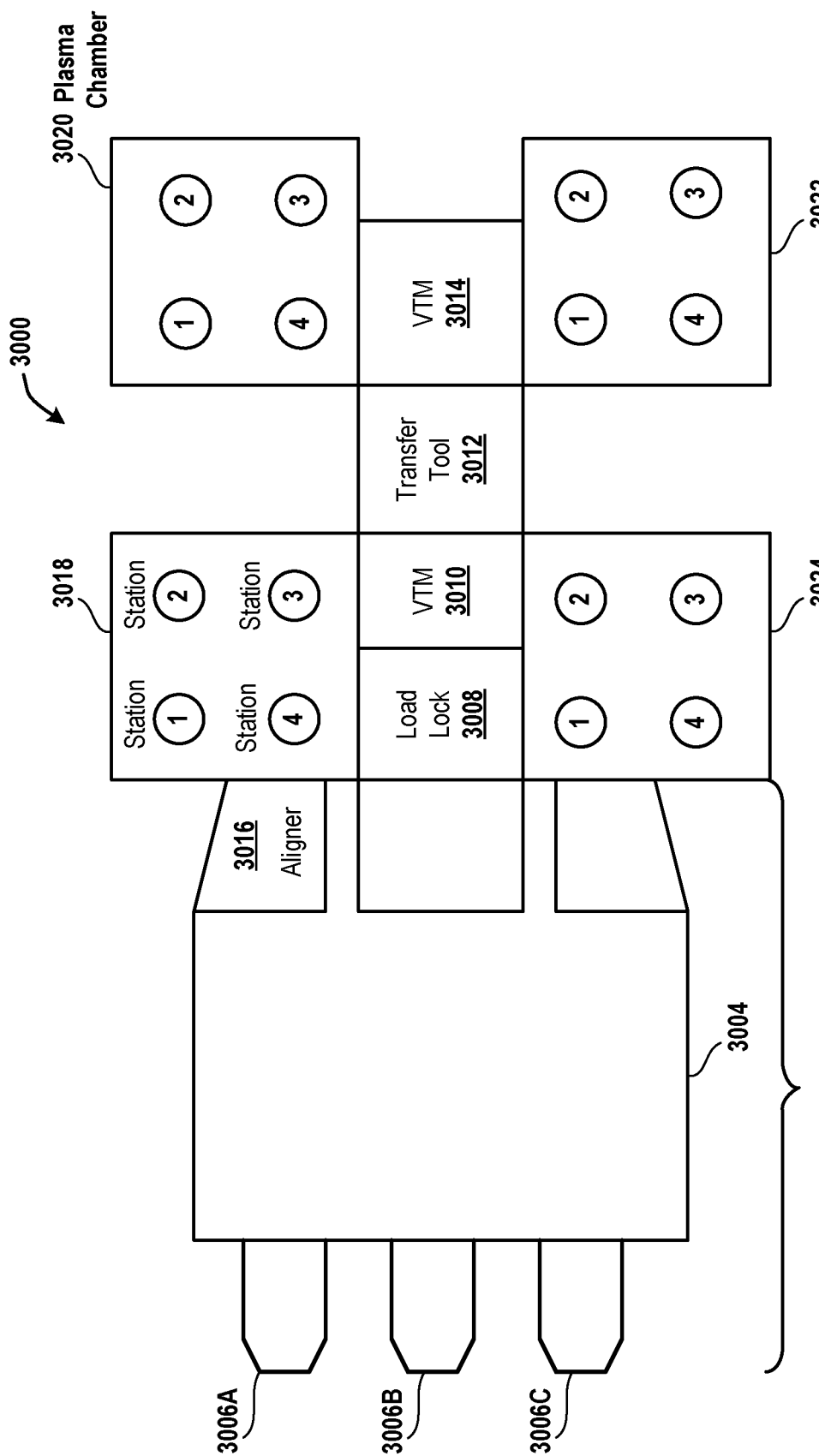
FIG. 30 (System)

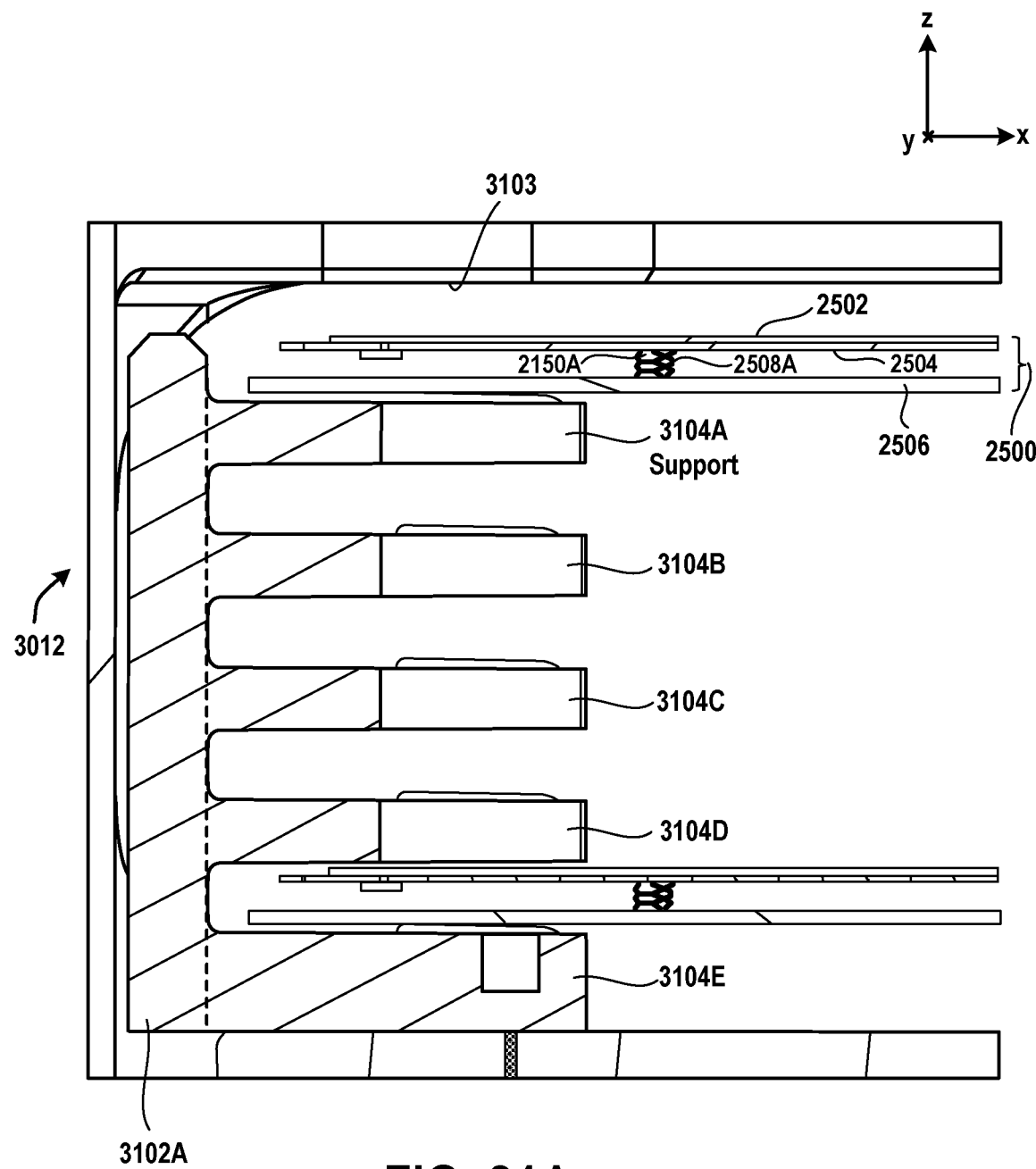
FIG. 31A (Transfer Station)

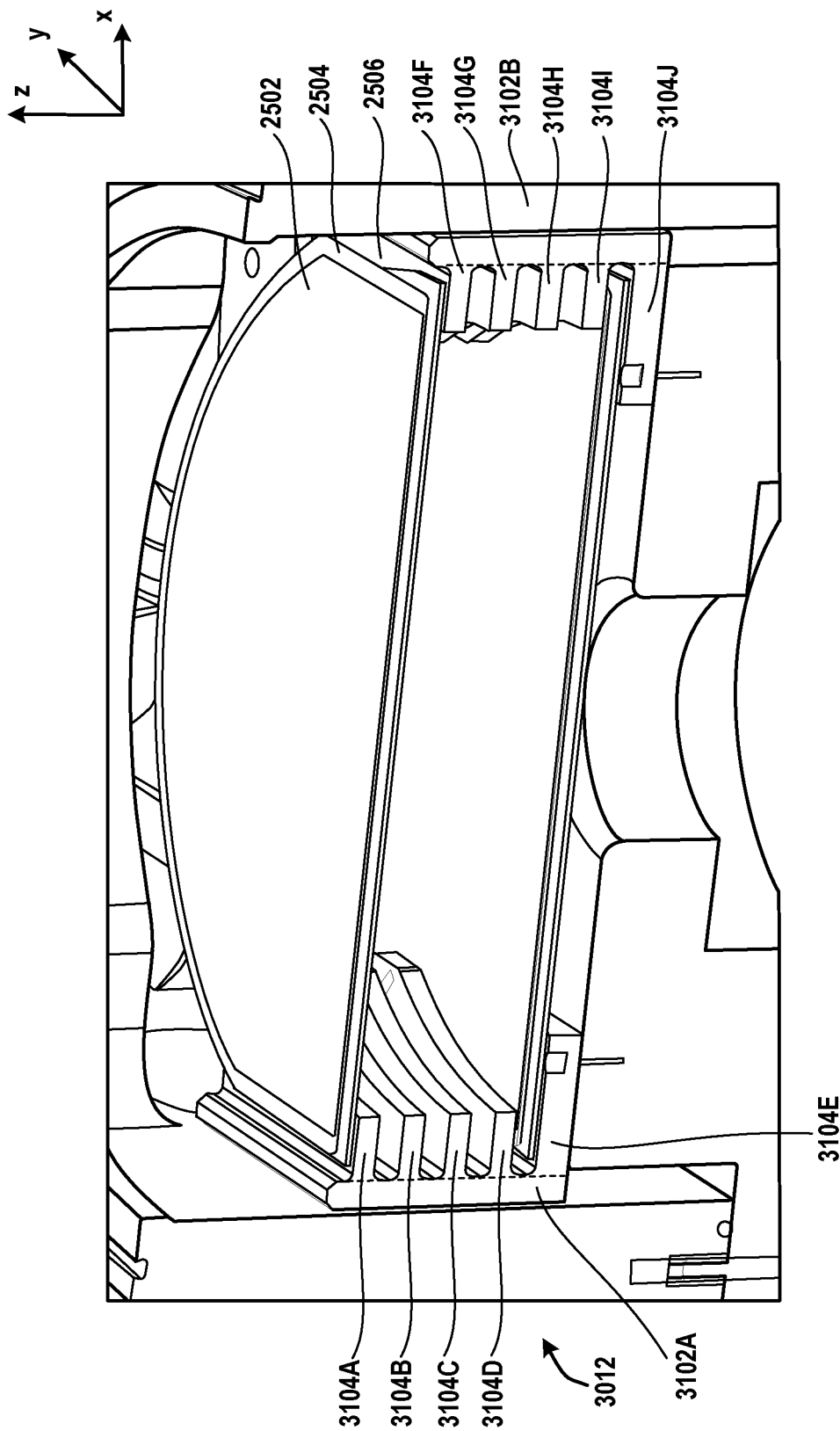
FIG. 31B (Transfer Station)

SYSTEMS AND METHODS FOR CLEANING A SHOWERHEAD

CLAIM OF PRIORITY

This application is a national stage filing of and claims priority, under 35 U.S.C. § 371, to PCT/US20/56534, filed on Oct. 20, 2020, and titled "SYSTEMS AND SYSTEMS AND METHODS FOR CLEANING A SHOWERHEAD", which claims the benefit of and priority, under 35 U.S.C. § 119(e), to U.S. Provisional Patent Application No. 62/929,328, filed on Nov. 1, 2019, and titled "SYSTEMS AND METHODS FOR CLEANING A SHOWERHEAD", both of which are incorporated by reference herein in their entirety.

FIELD

The embodiments described in the present disclosure relate to systems and methods for cleaning a showerhead.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, one or more radio frequency (RF) generators are coupled to an impedance matching network. The impedance matching network is coupled to a plasma chamber. RF signals are supplied from the RF generators to the impedance matching network. The impedance matching network outputs an RF signal to the plasma chamber upon receiving the RF signals. Also, multiple process gases are supplied via a showerhead of the plasma chamber to a gap within the plasma chamber. When the RF signal is supplied from the impedance matching circuit to the plasma chamber and the process gases are supplied, a wafer is processed in the plasma chamber.

After a certain amount of time for which one or more wafers are processed in the plasma chamber, unwanted materials are deposited on a surface of the showerhead. If the showerhead is not cleaned, the unwanted materials build up further on the showerhead and the build-up negatively affects efficiency in processing the wafers. Also, some cleaning processes for removing the build-up take too long or are not effective in removing the unwanted materials.

It is in this context that embodiments described in the present disclosure arise.

SUMMARY

Embodiments of the disclosure provide apparatus, methods and computer programs for cleaning a showerhead. It should be appreciated that the present embodiments can be implemented in numerous ways, e.g., a process, an apparatus, a system, a piece of hardware, or a method on a computer-readable medium. Several embodiments are described below.

Generally, the showerhead is cleaned by wiping, for one or more times, a face plate of the showerhead with isopropyl alcohol or deionized water. The wiping is done manually by technicians after opening a plasma chamber. The wiping is done progressively using one or more pads, such as a polyester cloth pad or a cotton cloth pad, to apply the isopropyl alcohol or deionized water to the face plate. For example, the one or more pads are wetted with isopropyl alcohol or deionized water to clean the showerhead. Also, the wiping applies a low amount of pressure, such as approximately 1 pound-force (lbf) on the face plate. The wiping can be done twice during a run of wafers, and after the run of wafers, the showerhead should be replaced.

However, the manual wiping creates a downtime for the plasma chamber. For example, the plasma chamber cannot be operated for 48 hours. The plasma chamber cannot be used for a long time to let the showerhead cool and vent to be able to manually wipe the showerhead. Also, the polyester cloth pad has a melting point of approximately 295 degrees centigrade and hence cannot be used to clean the showerhead at an intermediate or high temperature. This also increases the chamber downtime. The cotton cloth pad, when used, exposes the showerhead to particulates of the cotton cloth pad. Also, contaminants being cleaned from the showerhead are toxic powders that are harmful if inhaled. Moreover, several labor hours are used for the manual cleaning and the manual cleaning may not be done properly each time. The contaminants adhered to the showerhead, if not properly removed, can affect processing of wafers in the plasma chamber.

In one embodiment, a method for self-maintenance of the plasma chamber is described. In the method, a cleaning assembly having an adhesive-less polymeric pad with bio-mimicry micro-structures is used to capture and remove particles from the showerhead while the plasma chamber is still in vacuum and at or near process temperature. The cleaning assembly has the adhesive-less polymeric pad on top and the pad is pressed against the shower head by a vertical movement mechanism in the plasma chamber. Examples of the vertical movement mechanism include a wafer indexing mechanism, lift pins, and pedestal lifts. Another example of the vertical movement mechanism includes a wafer handling robot that moves upward or downward in a vertical direction to move the cleaning assembly up or down. The cleaning assembly is placed on the wafer handling robot. The wafer handling robot is used for a plasma chamber that is used to process one wafer. An example of the wafer indexing mechanism is a spindle with multiple arms. The contaminants adhere to the micro-structures on the polymeric pads by Van der Waals forces and/or electrostatic forces. The adhesion is residue-free and can be done at high temperatures.

Multiple cleaning assemblies are brought to and removed from a tool via a maintenance Front End Opening Pod (FOUP). The cleaning assembly is delivered to the plasma chamber by wafer handling robots of the tool.

In one embodiment, a cleaning assembly is described. The cleaning assembly includes a support section having a bottom side and an upper side. The bottom side connects to an arm of a plasma processing tool. The arm is used to handle movement of the cleaning assembly inside the plasma processing tool under vacuum. The cleaning assembly further includes a press plate coupled to the upper side of the support section via a compression interface. The cleaning assembly includes a cleaning layer disposed over the press plate. The cleaning layer includes a plurality of pillars. The arm is used to move the cleaning layer onto a surface inside of the plasma processing tool to cause particulates disposed on the surface to migrate away from the surface and onto the cleaning layer.

In an embodiment, a method for cleaning the surface within the plasma processing tool is described. The method includes receiving the cleaning assembly on the arm of the plasma processing tool. The method further includes moving the arm in an upward direction to move the cleaning layer onto the surface inside of the plasma processing tool to cause the cleaning layer to be proximate to the surface.

Some advantages of the herein described systems and methods include reducing or eliminating the chamber downtime. For example, the chamber downtime is reduced to a few hours or less when the cleaning assembly is used. The showerhead does not need to be cooled to clean the showerhead. Rather, the showerhead can be cleaned at the intermediate and high temperatures by using the cleaning assembly or any other cleaning assembly, described herein. Hence, the plasma chamber downtime is reduced or eliminated.

Also, there is no need to open the plasma chamber to clean the plasma chamber. The vertical movement mechanism can be used to clean the showerhead while the plasma chamber is closed and not exposed to outside air. Because the showerhead can be cleaned when the plasma chamber is closed, any chance of the technicians breathing in the harmful contaminants is reduced or eliminated. As such, safety of the technicians is improved.

Moreover, because the vertical movement mechanism is used, time taken to clean the showerhead is substantially reduced compared to that taken for the manual cleaning. Cleans that are more frequent compared to the manual cleaning can increase a life of the showerhead.

Also, the cleaning assembly when used for multiple times can provide a proper cleaning of the showerhead each time compared to the manual cleaning. The use of the cleaning assembly increases the life of the showerhead by properly removing the contaminants that adhere to the showerhead.

The use of the cleaning assembly also reduces chances of a substrate being improperly processed. The cleaning assembly properly removes the contaminants so that the materials do not interfere with processing the substrate.

The cleaning assembly can be used in vacuum. Also, if a micro-structure sheet from which the micro-structures extend is made from a heat resistant material, there is no need to reduce temperature in the plasma chamber to clean the showerhead. For example, if the micro-structure sheet is a fluoropolymer or polyimide, the showerhead can be cleaned without reducing temperature in the plasma chamber.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 3 is a diagram of an embodiment of a system to illustrate a rotation mechanism that includes a spindle and multiple arms.

FIG. 4A is a diagram of an embodiment of a system to illustrate a cleaning assembly placed on a section of an arm.

FIG. 4B is a diagram of an embodiment of a top view of a rotational section and an elongated section of the arm of FIG. 4A.

FIG. 4C is a diagram of an embodiment of a cleaning assembly.

FIG. 4D is a top view of a top surface of a support section of the cleaning assembly of FIG. 4C to illustrate locations of multiple spring mechanisms on the support section.

FIG. 6A is a diagram of an embodiment of a system to illustrate a lowered position of a cleaning assembly illustrated in FIG. 2.

FIG. 6B is a diagram of another embodiment of the system of FIG. 6A to illustrate a raised position of the cleaning assembly illustrated in FIG. 2.

FIG. 7 is a diagram of an embodiment of a system to illustrate transportation of the cleaning assembly illustrated in FIG. 2 to and from the in-bound load lock.

FIG. 10A is a diagram of an embodiment of a system to illustrate movement of a showerhead towards the cleaning assembly of FIG. 8 to clean the showerhead.

FIG. 11B is a side view of an embodiment of the cleaning assembly of FIG. 11A.

FIG. 12A is a side view of an embodiment of a set of pillars of a cleaning layer of a cleaning assembly.

FIG. 12B is a side view of another embodiment of a set of pillars of a cleaning layer of a cleaning assembly.

FIG. 12C is a side view of yet another embodiment of a set of pillars of a cleaning layer of a cleaning assembly.

FIG. 12D is a side view of another embodiment of a set of pillars of a cleaning layer of a cleaning assembly.

FIG. 12E is a side view of yet another embodiment of a set of pillars of a cleaning layer of a cleaning assembly.

FIG. 12F is a side view of still another embodiment of a set of pillars of a cleaning layer of a cleaning assembly.

FIG. 12G is a side view of another embodiment of a set of pillars of a cleaning layer of a cleaning assembly.

FIG. 12H is a side view of an embodiment of a cleaning layer to illustrate deflection of pillars of the cleaning layer.

FIG. 12I is a detailed side view of the one of the pillars of FIG. 12H that is in contact with a bottom surface of the showerhead.

FIG. 14A is a side view of an embodiment of a dome-top pillar.

FIG. 14B is a side view of an embodiment of a mushroom-shaped pillar.

FIG. 14C is a side view of an embodiment of a cone-shaped pillar.

FIG. 14D is a side view of an embodiment of a flat-top pillar.

FIG. 14E is a side view of an embodiment of a recessive-top pillar.

FIG. 14F is a side view of an embodiment of a multi-surface top pillar.

FIG. 14G is a side view of an embodiment of a slotted-top pillar.

FIG. 14H is a side view of an embodiment of a protrusion-top pillar.

FIG. 15A is a graph of an embodiment of a motion of the cleaning assembly of FIG. 2.

FIG. 15B is a graph of another embodiment of a motion of the cleaning assembly of FIG. 2.

FIG. 15C is a graph of yet another embodiment of a motion of the cleaning assembly of FIG. 2.

FIG. 15D is a graph of another embodiment of a motion of the cleaning assembly of FIG. 2.

FIG. 21A is a side view of an embodiment of a roller having a cleaning layer and a press plate for supporting the cleaning layer.

FIG. 21B is another side view of an embodiment of the roller of FIG. 21A.

FIG. 21C is a side view of an embodiment of a roller to illustrate a press plate having multiple protruded sections.

FIG. 29A is a front side view of an embodiment of a portion of a FOUP to illustrate placement of the cleaning assembly of FIG. 25A in the FOUP.

FIG. 29B is a top view of an embodiment of the FOUP of FIG. 29A.

FIG. 30 is a diagram of an embodiment of a plasma system.

FIG. 31A is a front side view of an embodiment of a transfer station of the plasma system of FIG. 30.

FIG. 31B is an isometric view of an embodiment of the transfer station.

DETAILED DESCRIPTION

The following embodiments describe systems and methods for cleaning a showerhead. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafers in a defined position or positions (with or without motion within that position, e.g. rotation, vibration, or other agitation). A wafer undergoing deposition may be transferred from one station to another within a reactor during a process. Of course, the film deposition may occur entirely at a single station or any fraction of the film may be deposited at any number of stations.

While in process, each wafer is held in place by a pedestal, e.g., a wafer chuck, etc., and/or other wafer holding apparatus. For certain operations, the apparatus may include a heater such as a heating plate to heat the wafer, a set of thermocouples to measure temperature during processing the wafer, and a motor to rotate the pedestal during the processing of the wafer.

Figure 1:
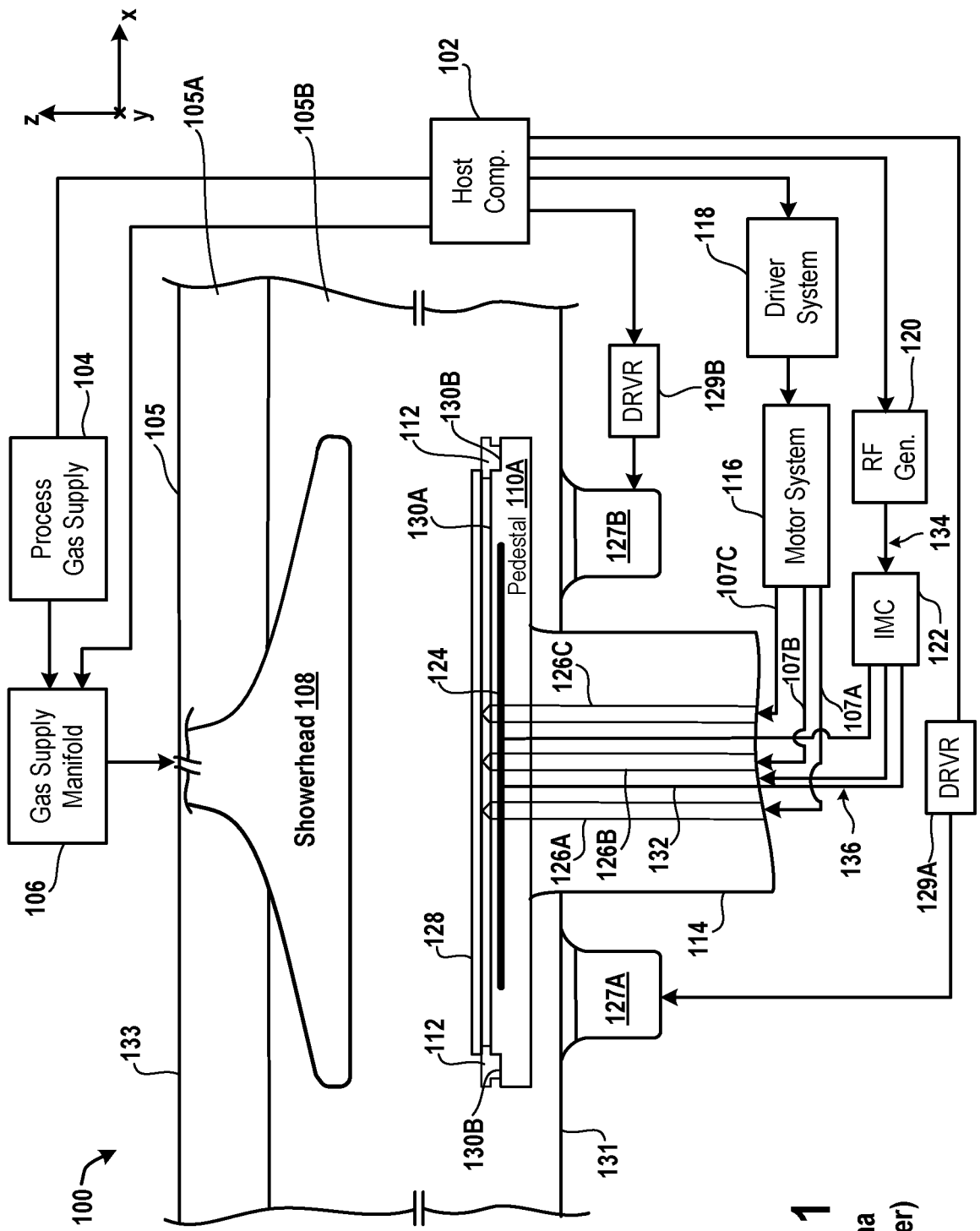
FIG. 1 is a diagram of an embodiment of a plasma tool.

FIG. 1 is a diagram of an embodiment of a plasma system 100, such as the PECVD system. The plasma system 100 includes a host computer 102, a process gas supply 104, a gas supply manifold 106, a plasma chamber 105, a motor system 116, a center column 114, a driver system 118, an RF generator 120, an impedance matching circuit (IMC) 122, and multiple vacuum pumps 127A and 127B. The plasma chamber 105 is sometimes referred to herein as a plasma processing tool. The vacuum pumps 127A and 127B are attached to a bottom wall 131 of the plasma chamber 105.

The plasma chamber 105 has a top wall 133, a side wall or side walls, and the bottom wall 131 to form a housing.

The side wall or side walls are substantially perpendicular or perpendicular to the bottom wall 131 and connected to or integral to the bottom wall 131. Similarly, the side wall or side walls are substantially perpendicular or perpendicular to the top wall 133 and connected to or integral to the top wall 133.

The plasma chamber 105 includes a top section 105A and a bottom section 105B. The top section 105A has the top wall 133 and a portion of the side wall or side walls of the plasma chamber 105. Also, the bottom section 105B has the bottom wall 131 and the remaining portion of the side wall or side walls of the plasma chamber 105.

The top section 105A includes a showerhead 108 and the bottom section 105B includes a pedestal 110A, the center column 114, and a carrier ring 112. Examples of the pedestal 110A include a chuck, such as an electrostatic chuck (ESC). The pedestal 110A includes a lower electrode 124. Within the center column 114, multiple lift pins 126A, 126B, and 126C are located. The lift pins 126A-126C are kinematic pins that form vertices of a triangle formed by the lift pins 126A-126C. The triangle is formed on the top surface of the pedestal 110A.

Examples of the host computer 110 include a desktop computer, a laptop computer, a controller, a tablet, and a smartphone. To illustrate, the host computer 110 includes a processor and a memory device, and the processor is coupled to the memory device. Examples of the processor include a microprocessor, an application specific integrated circuit (ASIC), a programmable logic device (PLD), and a central processing unit (CPU). Examples of the memory device include a read-only memory (ROM), a random access memory (RAM), a flash memory, a storage disk array, a hard disk, etc. The carrier ring 112 is sometimes referred to herein as a focus ring.

Examples of the process gas supply 104 include one or more gas containers that store one or more process gases for processing a substrate 128, such as a semiconductor wafer, placed on the carrier ring 112. Examples of the one or more process gases include an oxygen containing gas and a fluorine containing gas. The gas supply manifold 106 includes one or more valves for controlling, such as allowing or disallowing, a flow of the one or more process gases received from the process gas supply 104 via the gas supply manifold 106 to the showerhead 108 to achieve a pre-set mixture of process gases.

The showerhead 108 includes a gas distribution plate for distributing the one or more process gases to a gap between the showerhead 108 and the pedestal 110A for processing the substrate 128. The carrier ring 112 is placed on an edge of the pedestal 110A to support the substrate 128. For example, the pedestal 110A includes a top surface that has a central portion 130A and an edge portion 130B. The edge portion 130B is a step down from the central portion 130A and surrounds the central portion 130A. The carrier ring 112 is placed on top of the edge portion 130B.

The central column 114 includes a hollow space through which the lift pins 126A-126C and an RF transmission line 132 pass. The RF transmission line 132 is coupled to the lower electrode 124 embedded within the pedestal 110A. The lift pins 126A-126C are operated or movable to pass from a lower surface of the pedestal 110A via a body of the pedestal 110A to the central portion 130A of the pedestal 110A.

A motor system, as used herein, includes one or more electric motors and a driver system, as used herein, includes one or more drivers. Examples of an electric motor include an alternating current (AC) motor and a direct current (DC) motor. To illustrate, the electric motor includes a stator and a rotor, and the rotor rotates with respect to the stator. The electric motor is an electrical machine that converts electrical energy into mechanical energy, and operates through the interaction between the electric motor's magnetic field and an electric current in a wire winding of the stator to generate force in the form of rotation of a shaft that is attached to the rotor. Examples of a driver, as used herein, includes one or more transistors that are coupled to each other for outputting a current signal when a voltage is applied at an input of the one or more transistors.

An RF generator, as described herein, is a 400 kilohertz (kHz), or a 2 megahertz (MHz), or a 27 MHz, or a 60 MHz, RF generator. For example, each RF generator includes an RF power supply, such as an RF oscillator, that oscillates to generate an RF signal having a frequency, such as 2 MHz or 27 MHz. The RF oscillator operates at an operational frequency (RF), such as 2 MHz or 27 MHz, to generate the RF signal.

Examples of an impedance matching circuit, described herein, include a network of one or more series circuits and one or more shunt circuits, which are coupled to each other to facilitate a transfer of an RF signal received from an RF generator coupled to the impedance matching circuit to output a modified RF signal. Examples of a series circuit include a capacitor, an inductor, and a resistor. Similarly, examples of a shunt circuit include a capacitor, an inductor, and a resistor. Examples of a capacitor include a fixed capacitor having a fixed capacitance and a variable capacitor having a variable capacitance. Moreover, examples of an inductor include a fixed inductor having a fixed inductance and a variable inductor having a variable inductance. Examples of a resistor include a fixed resistor having a fixed resistance and a variable resistor having a variable resistance. It should be noted that a capacitance, or an inductance, or a resistance, or a combination of two or more thereof is sometimes referred to herein as a parameter.

The host computer 102 is coupled to the process gas supply 104, the driver system 118, and the RF generator 120. The process gas supply 104 is coupled to the gas supply manifold 106, which is coupled to the showerhead 108. The driver system 118 is coupled to the motor system 116. Each motor of the motor system 116 is coupled to a respective lift pin 126A, 126B, or 126C via a respective connection mechanism 107A, 107B, or 107C. For example, a first motor of the motor system 116 is coupled to the lift pin 126A via the connection mechanism 107A, a second motor of the motor system 116 is coupled to the lift pin 126B via the connection mechanism 107B, and a third motor of the motor system 116 is coupled to the lift pin 126C via the connection mechanism 107C. An example of a connection mechanism, as used herein, includes one or more shafts. Another example of a connection mechanism includes multiple shafts that are coupled to each other via one or more gears.

The host computer 102 is coupled to a driver 129A, which is further coupled to the vacuum pump 127A. Also, the host computer 102 is coupled to a driver 129B, which is further coupled to the vacuum pump 127B.

The host computer 102 sends a lift pin control signal to the driver system 118. The lift pin control signal includes a height to which the lift pins 126A-126C are to be raised or lowered. Upon receiving the lift pin control signal, the driver system 118 generates one or more current signals that are sent to the motor system 116. The one or more motors of the motor system 116 rotate to move respective one or more of the connection mechanisms 107A-107C to raise or lower respective one or more of the lift pins 126A-126C. The lift pins 126A-126C are raised to raise the wafer 128 or lowered to lower the wafer 128 in a vertical direction, e.g., in a direction of a y-axis, to a predetermined height from the carrier ring 112. The y-axis is perpendicular to an x-axis, which is perpendicular to a z-axis. Also, the z-axis is perpendicular to the y-axis.

Moreover, the host computer 102 sends a control signal to the RF generator 120. In response to receiving the control signal, the RF generator 120 generates an RF signal 134 and supplies the RF signal 134 to the impedance matching circuit 122. The impedance matching circuit 122 modifies the RF signal 134, such as changes an impedance of the RF signal 134, to output a modified RF signal 136. For example, the parameter of the impedance matching circuit 122 modifies the impedance of the RF signal 134 to output the modified RF signal 136. The modified RF signal 136 is supplied from the impedance matching circuit 122 via the RF transmission line 132 to the lower electrode 124.

The host computer 102 also sends a control signal to the process gas supply 104 to supply the one or more process gases and sends a control signal to the gas supply manifold 106 to control amounts of the one or more process gases to the showerhead 108. When the one or more process gases are supplied via the gas distribution plate of the showerhead 108 to the gap between the showerhead 108 and the pedestal 110A and the modified RF signal 134 is supplied to the lower electrode 124, plasma is stricken or contained within the gap to process the substrate 128.

Before, during, and/or after processing of the substrate 128, vacuum is maintained within the plasma chamber 105. For example, the host computer 102 sends a control signal to the driver 129A. Upon receiving the control signal, the driver 129A generates a current signal, which is provided to the vacuum pump 127A. The vacuum pump 127A operates to extract gas molecules from a housing, which is a sealed enclosure, of the plasma chamber 105 to leave behind the vacuum. Similarly, as another example, the host computer 102 sends a control signal to the driver 129B. Upon receiving the control signal, the driver 129B generates a current signal, which is provided to the vacuum pump 127B. The vacuum pump 127B operates to extract gas molecules from the housing of the plasma chamber 105 to leave behind the vacuum.

In one embodiment, the substrate 128 is placed on a top surface of the pedestal 110A instead of being placed on the carrier ring 112.

In an embodiment, the showerhead 108 includes a top electrode that receives a modified RF signal from an impedance matching circuit coupled to the top electrode. The impedance matching circuit coupled to the top electrode receives one or more RF signals from respective one or more RF generators to output the modified RF signal.

In an embodiment, the showerhead 108 includes multiple heating elements, such as resistors, to change a temperature of the showerhead 108.

In one embodiment, instead of the RF generator 120, multiple RF generators are coupled via an impedance matching circuit and the RF transmission line 132 to the lower electrode 124.

It should be noted that in one embodiment any control signal described herein as being sent by the host computer 102 is generated and sent by the processor of the host computer 102.

In an embodiment, instead of two vacuum pumps 127A and 127B, any other number of vacuum pumps are attached to the bottom wall 131 of the plasma chamber 105.

Figure 2:
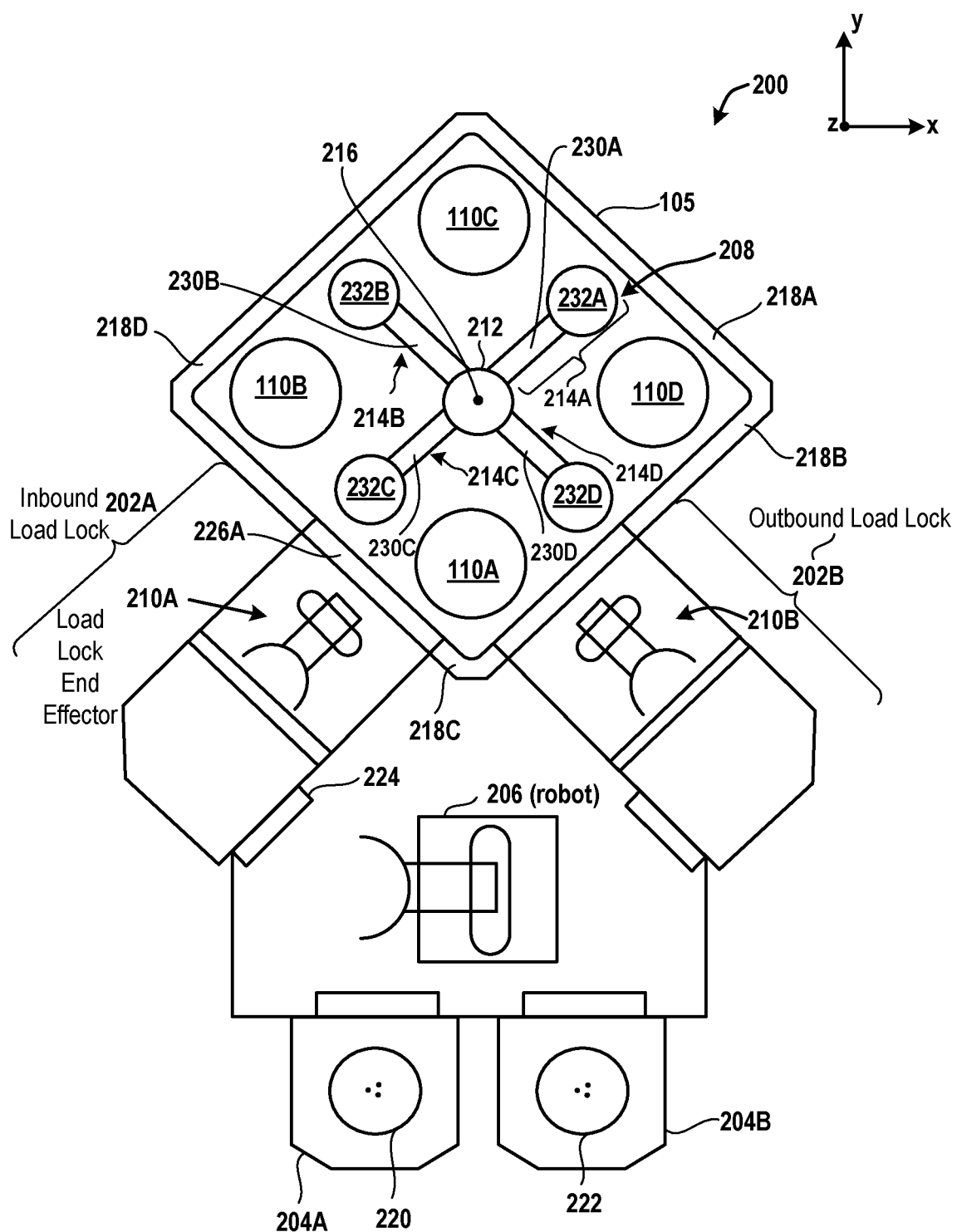
FIG. 2 is a diagram of an embodiment of a system to illustrate multiple load locks including an in-bound load lock and an outbound load lock.

FIG. 2 is a diagram of an embodiment of a system 200 to illustrate multiple load locks, which include an inbound load lock 202A and an outbound load lock 202B, for transporting cleaning assemblies 220 and 222. As an example, each cleaning assembly 220 and 222 is a replaceable or reusable part.

A replaceable part is sometimes referred to herein as a consumable part. For example, each cleaning assembly 220 and 222 is used to clean the showerhead 108 for one or multiple times and is discarded after a pre-determined number of times. As an example, a number of times for which each cleaning assembly 220 and 222 is used is counted as a number of times for which the cleaning assembly enters into the plasma chamber 105 from the in-bound load lock 202A and the number of times for which the cleaning assembly exits from the plasma chamber 105 to the outbound load lock 202B.

The system 200 is sometimes referred to herein as an Equipment Front End Module (EFEM). The system 200 includes the plasma chamber 105, the inbound load lock 202A, the outbound load lock 202B, a robot 206, and pods 204A and 204B. Examples of a pod, as described herein, include a Front End Opening Pod (FOUP). The pods 204A and 204B are placed on load ports of the EFEM. The plasma chamber 105 includes multiple showerheads and multiple pedestals 110A, 110B, 110C, and 110D. The plasma chamber 105 is an enclosure that is enclosed by walls 218A, 218B, 218C, and 218D. Each of the showerheads is placed with respect to a respective one of the pedestals 110A-110D in the manner illustrated with respect to FIG. 1 in which the showerhead 108 is placed facing and above the pedestal 110A to form the gap.

The plasma chamber 105 has four stations, such as the four pedestals 110A-110D and four showerheads, each of which has the same structure and function as that of the showerhead 108. Also, each of the pedestals 110B-110C have the same structure and function as that of the pedestal 110A. During processing, the plasma chamber 105 maintains a low pressure environment so that substrates are transferred using multiple carrier rings among the pedestals 110A-110D without experiencing a vacuum break and/or air exposure.

Each load lock 202A and 202B is an enclosed chamber. Examples of the robot 206 include an end effector that is controlled with one or more motors. Each load lock 202A and 202B includes an end effector. For example, the load lock 202A has an end effector 210A and the load lock 202B as another end effector 210B.

The plasma chamber 105 includes a rotation mechanism 208. The rotation mechanism 208 includes a spindle 212 and multiple arms 214A, 214B, 214C, and 214D. The spindle 212 is sometimes referred to herein as a spindle assembly. As viewed along the z-axis, the spindle 212 is located between four stations, described below, to rotate between the four stations. The spindle 212 rotates with respect to an axis 216, parallel to the z-axis, to rotate the arms 214A-214D simultaneously. The axis 216 passes through a centroid of the spindle 212 and is along a length of the spindle 212. Each arm 214A-214D is attached to the spindle 212 and extends in a horizontal plane from the axis 216 of the spindle 212 towards the walls 218A-218D of the plasma chamber 105. The horizontal plane is perpendicular or substantially perpendicular to the z-axis. For example, the horizontal plane forms an angle of 90 degrees or an angle that is within a pre-determined range, e.g., ±5 degrees, from the 90 degree angle with respect to the z-axis.

In an embodiment, one component of the plasma chamber 105 is attached to another component of the plasma chamber 105 via an attachment mechanism. For example, the arms 214A-214D are bonded to, screwed to, or integral with, or inserted into, a slot formed within the spindle 212. To illustrate, the arms 214A-214D are fabricated within a molding machine to be one integrated component having the spindle 212 and the arms 214A-214D. As another illustration, multiple screws and nuts are used to screw the arms 214A-214D to the spindle 212.

Each arm has an elongated section and a rotational section. For example, the arm 214A has an elongated section 230A and a rotational section 232A. Also, the arm 214B has an elongated section 230B and a rotational section 232B, the arm 214C has an elongated section 230C and a rotational section 232C, and the arm 214D has an elongated section 230D and a rotational section 232D.

Each elongated section is attached to a corresponding rotational section. For example, the elongated section 230A is attached to the rotational section 232A, the elongated section 230B is attached to the rotational section 232B, the elongated section 230C is attached to the rotational section 232C, and the elongated section 230D is attached to the rotational section 232D.

The pod 204A is transported to a station of the plasma system 200 via an overhead transfer vehicle of a clean room and placed on one of the load ports of the plasma system 200. The robot 206, at atmospheric pressure, extends along the y-axis, to obtain or retrieve the cleaning assembly 220 from the pod 204A placed on the load port, retracts along the y-axis, and rotates with respect to the z-axis to transport the clean assembly 220 via an atmospheric port 224 to the in-bound load lock 202A. For example, the robot 206 extends in a direction of that is parallel to or substantially parallel to the y-axis to extend along the y-axis. To illustrate, the direction that is substantially parallel to the y-axis forms an angle that is within a pre-determined range, e.g., ±5 degrees, from the y-axis. After rotating with respect to the z-axis, the robot 206 again extends to place the cleaning assembly 220 in the in-bound load lock 202A.

The inbound load lock 202A is coupled to a vacuum source so that when the atmospheric port 224 is closed, the inbound load lock 202A is pumped down. The inbound load lock 202A also includes a chamber transport port 226A interfaced with the processing chamber system 206. Thus, when the chamber transport port 226A is open, the end-effector 210A extends to obtain the cleaning assembly 220 placed within the in-bound load lock 202A, retracts, and rotates with respect to the z-axis to transfer the cleaning assembly 220 from the in-bound load lock 202A into the plasma chamber 105. For example, the end-effector 210A delivers the cleaning assembly 220 to place the cleaning assembly 220 on the lift pins 126A-126C (FIG. 1) protruding upward from the top surface 130A (FIG. 1) of the pedestal 110A. and then the end-effector 210A retracts out of the plasma chamber 105.

Once the cleaning assembly 220 is placed on the lift pins 126A-126C, the spindle 212 rotates, in a clockwise direction or counterclockwise direction, to move the rotational section 232C of the arm 114C to be under the cleaning assembly 220 to lift the cleaning assembly 220 from the lift pins 126A-126C on the pedestal 110A. The cleaning assembly 220 is lifted in the vertical direction to clean the showerhead 108. The cleaning assembly 220 is lifted by moving the spindle 212 up in a z-direction, which is along the z-axis, to move the rotational section 232C in the z-direction.

Similarly, multiple cleaning assemblies are transferred from the pod 204A by the robot 206 and the end-effector 210A into the plasma chamber 105 before the showerheads of the plasma chamber 105 are cleaned. For example, the arm 214C having the cleaning assembly 240 is rotated to remove the rotational section 232C from being over the pedestal 110A until the rotational section 232D is over the pedestal 110A. Another cleaning assembly retrieved from the pod 204A, in the same manner in which the cleaning assembly 220 is retrieved, is transferred from the end-effector 210A to the lift pins 126A-126C extending above the pedestal 110A and further from the lift pins 126A-126C to the rotational section 232D. In a similar manner, two more cleaning assemblies are placed on top of the rotational sections 232A and 232B. Once the cleaning assemblies are placed on top of the rotational sections 232A-232D, the arms 214A-214D are lifted in the z-direction to clean the four showerheads of the plasma chamber 105 simultaneously. For example, the cleaning assemblies are lifted by moving the spindle 212 in the z-direction to simultaneously move the arms 214A-214D in the z-direction to clean the showerhead 108.

After one or more of the four showerheads are cleaned, the cleaning assembly 220 is removed from the plasma chamber 105 by the end effector 210B. For example, the cleaning assembly 220 is removed by the end-effector 210B from the lift pins 126A-126C of the pedestal 110A. To illustrate, after one or more of the four showerheads are cleaned, the spindle 212 moves vertically downward, along the z-axis, to place the cleaning assembly 220 on the lift pins 126A-126C of the pedestal 110A and the end-effector 210B extends into the plasma chamber 105 to remove the cleaning assembly 220 from the lift pins 126A-126C.

The end effector 210B on which the cleaning assembly 220 is placed rotates around the z-axis to face the robot 206 and extends towards the robot 206. The robot 206 also extends towards the end effector 210B to obtain the cleaning assembly 220 and rotates around the z-axis to face the pod 204B. The robot 206 extends towards the pod 204B to place the cleaning assembly 220, which is now in a used condition, into the pod 204B.

It should be noted that in one embodiment, the showerhead 108 is cleaned when the plasma chamber 105 is under vacuum at all times, including a time period during which the cleaning assembly 220 is provided by the end-effector 210A to the plasma chamber 105 and is removed by the end-effector 210B from the plasma chamber 105. For example, the vacuum pumps 127A and 127B (FIG. 1) are operated to maintain the plasma chamber 105 under vacuum. The vacuum pumps 127A and 127B attached to the bottom wall 131 of the bottom section 105B (FIG. 1) are controlled by the host computer 102 to operate. When operated, the vacuum pumps 127A and 127B extract air, plasma remnants, and other materials from the plasma chamber 105 to create the vacuum in the plasma chamber 105. Also, the in-bound load lock 202A is brought under vacuum before the cleaning assembly 220 is transferred into the plasma chamber 105 via the chamber transport port 226A. The chamber transport port 226A is then opened and the cleaning assembly 220 is transferred from the in-bound load lock 202A to the plasma chamber 105. The chamber transfer port 226A is then closed for cleaning the showerhead 108 using the cleaning assembly 220 and the in-bound load lock 202A is vented to obtain another cleaning assembly or another FOUP.

In an embodiment, the showerhead 108 is cleaned at atmospheric temperature without opening the plasma chamber 105. For example, there is no need to lift the top section 105A (FIG. 1) of the plasma chamber 105 from the bottom section 105B (FIG. 1) of the plasma chamber 105 to expose the plasma chamber 105 to outside temperature for cleaning the showerhead 108. After processing one or more substrates, the showerhead 108 returns to the atmospheric temperature over time. The showerhead has a temperature of less than 100 degree centigrade at the atmospheric temperature. Also, the plasma chamber 105 is vented and not under vacuum at the atmospheric temperature.

In one embodiment, the showerhead 108 is cleaned at an intermediate temperature without opening the plasma chamber 105. An example of the intermediate temperature of the showerhead 108 is a temperature of 200 degrees centigrade or approximately 300 degrees centigrade, such as within ±10% of 200 degrees centigrade. When the showerhead is at the intermediate temperature, the pedestal 110A is also at an intermediate temperature, such as 300 degrees centigrade or approximately 300 degrees centigrade. To illustrate, the pedestal 110A has the temperature of approximately 300 degrees centigrade when the temperature is within ±10% of 300 degrees centigrade. When the plasma chamber 105 is closed so that there is no gap between the sections 105A and 105B of the plasma chamber 105, there is vacuum present in the plasma chamber 105 and no outside air is present in the plasma chamber 105. Also, the plasma chamber 105 is under vacuum at the intermediate temperature.

In an embodiment, the showerhead 108 is cleaned at a high temperature without opening the plasma chamber 105. An example of the high temperature of the showerhead 108 is a temperature of 350 degrees centigrade or approximately 350 degrees centigrade, such as within ±10% of 350 degrees centigrade. When the showerhead 108 is at the high temperature, the pedestal 110A is also at a high temperature, such as 550 degrees centigrade or approximately 550 degrees centigrade. To illustrate, the pedestal 110A has the temperature of approximately 550 degrees centigrade when the temperature is within ±10% of 550 degrees centigrade. The showerhead 108 is at the high temperature immediately after processing the substrate 128 (FIG. 1). Also, the plasma chamber 105 is under vacuum at the high temperature.

In an embodiment, each of the rotational sections 232A-232D does not rotate with respect to a respective one of the elongated sections 230A-230D. For example, the rotational section 232A is fixed with respect to the elongated section 230A and the rotational section 232B is fixed with respect to the elongated section 230B.

In an embodiment, each arm 214A-214D excludes the rotational sections 232A-232D. Rather, the arms 214A-214D have the elongated sections 230A-230D and features, such as recessions, described herein, as being formed on the rotational sections 232A-232D are instead formed in the elongated sections 230A-230D.

In an embodiment, instead of the robot 206 obtaining the cleaning assembly 220 from the pod 204A and transferring the cleaning assembly 220 to the in-bound load lock 202A, an overhead transfer vehicle delivers the pod 204A to the in-bound load lock 202A.

In one embodiment, the pod 204A is placed on one of the load ports of the plasma system 200 manually by an operator.

In an embodiment, instead of using multiple cleaning assemblies to clean the four showerheads, one cleaning assembly is used to clean all the four showerheads.

In an embodiment, the cleaning assembly 220 is removed by the end-effector 210B from one of the arms 214A-214D instead of being removed from the lift pins 126A-126C.

FIG. 3 is a diagram of an embodiment of a system 300 to illustrate the rotation mechanism 208. The system 300 includes the host computer 102, multiple drivers 302A, 302B, 302C, and 302D, a driver system 306, and multiple motors 304A, 304B, 304C, 304D, and a motor system 308. The system 300 further includes the pedestals 110A-110D. A driver system includes one or more drivers and a motor system includes one or more motors.

The host computer 102 is coupled to the drivers 302A-302D and the driver system 306. Moreover, the driver 302A is coupled to the motor 304A, the driver 302B is coupled to the motor 304B, the driver 302C is coupled to the motor 304C, and the driver 302D is coupled to the motor 304D. Also, the driver system 306 is coupled to the motor system 308.

The motor 304A is coupled via a connection mechanism 310A to the rotational section 232A. Similarly, the motor 304B is coupled via a connection mechanism 310B to the rotational section 232B, motor 304C is coupled via a connection mechanism 310C to the rotational section 232C, and motor 304D is coupled via a connection mechanism 310D to the rotational section 232D. Also, the motor system 308 is coupled via a connection mechanism system 312 to the spindle 212. The connection mechanism system 312 includes one or more connection mechanisms.

The host computer 102 generates and sends a vertical movement control signal to the driver system 306. The vertical movement control signal includes a vertical direction, such as up or down, in which the spindle 212 is to move along the z-axis or the axis 216 and a pre-set location to be reached after the movement. Upon receiving the vertical movement control signal, the driver system 306 generates a vertical movement current signal, which is sent to the motor system 308. The motor system 308 receives the vertical movement current signal and rotates to move a connection mechanism of the connection mechanism system 312 to further move the spindle 212, up or down, in the vertical direction until the pre-set location is reached. The movement of the spindle 212 moves the arms 214A-214D in the vertical direction simultaneously until the pre-set location is reached.

In addition to or instead of the vertical movement control signal, the host computer 102 generates and sends a spindle rotate control signal to the driver system 306. The spindle rotate control signal includes an angular direction θ, such as clockwise or counterclockwise, in which the spindle 212 is to rotate and a pre-determined orientation to be reached after the rotation. In response to receiving the spindle rotate control signal, the driver system 306 generates and sends a spindle rotate current signal to the motor system 308. The motor system 308, in response to the spindle rotate current signal, rotates to move a connection mechanism of the connection mechanism system 312 to rotate the spindle 212 with respect to the axis 216 until the pre-determined orientation is reached. The rotation of the spindle 212 rotates the arms 214A-214D with respect to the axis 216 simultaneously until the pre-determined orientation of the spindle 212 is reached.

Instead of or in addition to sending the spindle rotate control signal, one or more of the rotational sections 232A-232D are controlled by the host computer 102 to rotate the one or more of the rotational sections 232A-232D. For example, the host computer 102 generates and sends a rotational section control signal to the driver 302A. The rotational section control signal includes an angular direction θA, such as clockwise or counterclockwise, in which the rotational section 232A is to rotate with respect to the elongated section 230A of the arm 214A and a pre-determined orientation to be reached after the rotation. In response to receiving the rotational section control signal, the driver 302A generates and sends a rotational section current signal to the motor 304A. The motor system 304A, in response to the rotational section current signal, rotates to move the connection mechanism 310A to rotate the rotational section 232A around an axis 234A with respect to the arm 214A until the pre-determined orientation is reached. The rotation of the rotational section 232A rotates a cleaning assembly placed on top of the rotational section 232A with respect to the axis 234A until the pre-determined orientation of the rotational section 232A is reached. The axis 234A passes through a centroid of the rotational section 232A and is along the length of the spindle 212.

As another example, the host computer 102 generates and sends a rotational section control signal to the driver 302B. The rotational section control signal includes an angular direction θB, such as clockwise or counterclockwise, in which the rotational section 232B is to rotate with respect to the elongated section 230B of the arm 214B and a pre-determined orientation to be reached after the rotation. In response to receiving the rotational section control signal, the driver 302B generates and sends a rotational section current signal to the motor 304B. The motor 304B, in response to the rotational section current signal, rotates to move the connection mechanism 310B to rotate the rotational section 232B around an axis 234B with respect to the arm 214B until the pre-determined orientation is reached. The rotation of the rotational section 232B rotates a cleaning assembly placed on top of the rotational section 232B with respect to the axis 234B until the pre-determined orientation of the rotational section 232B is reached. The axis 234B passes through a centroid of the rotational section 232B and is along the length of the spindle 212.

As yet another example, the host computer 102 generates and sends a rotational section control signal to the driver 302C. The rotational section control signal includes an angular direction θC, such as clockwise or counterclockwise, in which the rotational section 232C is to rotate with respect to the elongated section 230C of the arm 214C and a pre-determined orientation to be reached after the rotation. In response to receiving the rotational section control signal, the driver 302C generates and sends a rotational section current signal to the motor 304C. The motor 304C, in response to the rotational section current signal, rotates to move the connection mechanism 310C to rotate the rotational section 232C around an axis 234C with respect to the arm 214C until the pre-determined orientation is reached. The rotation of the rotational section 232C rotates a cleaning assembly placed on top of the rotational section 232C with respect to the axis 234C until the pre-determined orientation of the rotational section 232C is reached. The axis 234C passes through a centroid of the rotational section 232C and is along the length of the spindle 212.

As another example, the host computer 102 generates and sends a rotational section control signal to the driver 302D. The rotational section control signal includes an angular direction θD, such as clockwise or counterclockwise, in which the rotational section 232D is to rotate with respect to the elongated section 230D of the arm 214D and a pre-determined orientation to be reached after the rotation. In response to receiving the rotational section control signal, the driver 302D generates and sends a rotational section current signal to the motor 304D. The motor 304D, in response to the rotational section current signal, rotates to move the connection mechanism 310D to rotate the rotational section 232D around an axis 234D with respect to the arm 214D until the pre-determined orientation is reached. The rotation of the rotational section 232D rotates a cleaning assembly placed on top of the rotational section 232D with respect to the axis 234D until the pre-determined orientation of the rotational section 232D is reached. The axis 234D passes through a centroid of the rotational section 232D and is along the length of the spindle 212.

In one embodiment, the system 300 includes three motors including a first motor, a second motor, and a third motor. The first motor operates to move the spindle 212 vertically upwards or downwards, along the z-axis. The second motor operates to rotate the spindle 212 around the axis 413, and the third motor operates to simultaneously rotate the rotational sections 232A-232D of the four arms 214A-214D simultaneously via multiple connection mechanisms. The connection mechanisms couple the third motor to the four arms 214A-214D.

In an embodiment, torque feedback detects a change in torque of the first motor, and the change in the torque is provided to the host computer 102. The host computer 102 determines based on the change in torque whether the cleaning assembly 220 is in contact with or abuts the showerhead 108.

FIG. 4A is a diagram of an embodiment of a system 400 to illustrate a cleaning assembly 220 placed on a portion of an arm 404. The system 400 includes the arm 404 and the cleaning assembly 220. The arm 404 is an example of any of the arms 214A-214D (FIG. 3).

The arm 404 includes an elongated section 406 and a rotational section 408. The elongated section 406 is an example of any of the elongated sections 230A-230D (FIG. 3) and the rotational section 408 is an example of any of the rotational sections 232A-232D (FIG. 3).

The cleaning assembly 220 has a top surface 410A, a side surface portion 410B, a bottom surface 410C, and a side surface portion 410D. As an example, the cleaning assembly 220 has a circular cross-section, as viewed in the z-direction, the cleaning assembly 220 has one circular side surface that has the side surface portions 410B and 410D.

The top surface 410A is perpendicular or substantially perpendicular to the side surface portions 410B and 410D. For example, the top surface 410A forms an angle that is within a pre-determined range, such as ±5-7 degrees, with respect to the side surface portions 410B and 410D. Similarly, the bottom surface 410C is perpendicular or substantially perpendicular to the side surface portions 410B and 410D. Also, the top surface 410A is parallel or substantially parallel to the bottom surface 410C.

The bottom surface 410C includes a plurality of protrusions 412A, 412B, and 412C. As an example, the protrusions 412A-412C are kinematic in that the protrusions 412A-412C are located at vertices of a triangle formed on the bottom surface 410C by the protrusions 412A-412C.

Each protrusion 412A-412C extends outward from a flat portion, such as a planar portion, of the bottom surface 410C to form a convex shape in a downward direction with respect to the flat portion. The flat portion is a horizontal portion or a substantially horizontal portion of the bottom surface 410C. As an example, the flat portion of the bottom surface 410C is the remaining portion of the bottom surface 410C excluding the protrusions 412A-412C. An example of the horizontal portion of the bottom surface 410C is a portion that is parallel to the x-axis. An example of the substantially horizontal portion of the bottom surface 410C is a portion that is substantially parallel to the x-axis. To illustrate, the substantially horizontal portion of the bottom surface 410C forms an angle within a pre-determined range, such as ±5-7 degrees, with respect to the x-axis. The terms protrusions, bumps, projections, projections, humps, outgrowth, and extensions are sometimes used herein interchangeably.

As an example, the protrusions 412A-412C are attached to, such as glued to or screwed to, to the flat portion of the bottom portion 410C. As another example, a support section, described below, of the cleaning assembly 220 is fabricated in a molding machine to create the protrusions 412A-412C under a bottom layer of the support section. As yet another example, a press plate, described below, of the cleaning assembly 220 is fabricated in a molding machine to create the protrusions 412A-412C under a bottom layer of the press plate. The press plate is sometimes referred to herein as a rigid layer.

The cleaning assembly 220 is illustrated as being supported by the lift pins 126A-126C. The rotational section 408 rotates in an angular direction θ400 with respect to the elongated section 406 to rotate the cleaning assembly 220 with respect to the elongated section 406 to clean the showerhead 108 (FIG. 1).

The rotational section 408 includes multiple recessions 414A, 414B, and 414C on a top surface 416A of the rotational section 408. As an example, the recessions 414A, 414B, and 414C are located at vertices of a triangle formed on the top surface 416A by the recessions 414A, 414B, and 414C.

Each recession 414A, 414B, and 414C extends inward or downward from a flat portion, such as a planar portion, of the top surface 416A to form a concave shape with respect to the flat portion. The flat portion of the top surface 416A is a horizontal portion or a substantially horizontal portion of the top surface 416A. As an example, the flat portion of the top surface 416A is the remaining portion of the top surface 416A excluding the recessions 414A, 414B, and 414C. An example of the horizontal portion of the top surface 416A is a portion that is parallel to the x-axis. An example of the substantially horizontal portion of the top surface 416A is a portion that is substantially parallel to the x-axis. To illustrate, the substantially horizontal portion of the top surface 416A forms an angle within a pre-determined range, such as ±5-7 degrees, with respect to the x-axis. The terms recessions, cavities, dents, indentations, recesses, craters, and sockets are sometimes used herein interchangeably.

As an example, the recessions 414A, 414B, and 414C are fabricated by drilling into the top surface 416A to extend each recession 414A, 414B, and 414C to a pre-determined depth along the side surface portions 410B and 410D but not extend each recession 414A, 414B, and 414C along the entire depth of the side surface portions 410B and 410D. To illustrate, none of the recessions 414A, 414B, and 414C extend from a horizontal level of the flat portion of the top surface 416A to a horizontal level of the bottom surface 416C of the rotational section 408. As an example, the depths of the side surface portions 410B and 410D are measured along the z-axis.

The rotational section 408 has the top surface 416A, a side surface 416B, a bottom surface 416C, and a side surface 416D. As an example, the rotational section 408 has a triangular cross-section, as viewed in the z-direction, and the side surface 416D forms a vertex of the triangular cross-section.

The top surface 416A is perpendicular or substantially perpendicular to the side surfaces 416B and 416D. For example, the top surface 416A forms an angle that is within a pre-determined range, such as ±5-7 degrees, with respect to the side surfaces 416B and 416D. Similarly, the bottom surface 416C is perpendicular or substantially perpendicular to the side surfaces 416B and 416D. Also, the top surface 416A is parallel or substantially parallel to the bottom surface 416C.

When the cleaning assembly 220 is placed on the top surface 416A of the rotational section 408 of the arm 414, the protrusion 412A is fits to, such as located within or extends within or extends into or mates with or connects mechanically to or connects mechanically with, the recession 414A. Similarly, the protrusion 412B is fits to the recession 414B and the protrusion 412C fits to the recession 414C. When the protrusion 412A fits to the recession 414A, the protrusion 412B fits to the recession 414B, and the protrusion 412C fits to the recession 414C, the cleaning assembly 220 is stably placed on top of the rotational section 408 to avoid movement of substantially movement of the cleaning assembly 220 with respect to the rotational section 408. For example, there is none or minimal angular movement of the cleaning assembly 220 that is stably placed on top of the rotational section 408. An example of the minimal angular movement is one in which there is a few degrees of rotation, such as 1-2 degrees of angular rotation with respect to the rotational section 408.

When the cleaning assembly 220 is in contact with the showerhead 108 or is proximate to the showerhead 108, the spindle 212 rotates around the axis 216 (FIG. 3) or the rotational section 408 rotates around an axis 413 that passes through a centroid of the rotational section 408 or both the spindle 212 and the rotational section 408 rotate around their respective axes 216 and 413. When the spindle 212 or the rotational section 408 or both rotate, the cleaning assembly 410A cleans a bottom surface of the showerhead 108.

In one embodiment, instead of the cleaning assembly 220, another cleaning assembly that has a polygonal cross-section, or a rectangular cross-section or a square cross-section or a triangular cross-section or an oval cross-section, as viewed in the z-direction, is used.

In an embodiment, any number of protrusions, such as four or five or seven, other than that illustrated in FIG. 4A are formed under the bottom surface 410C of the cleaning assembly 220. For example, the number of protrusions formed under the bottom surface 410C is an odd number.

In an embodiment, instead of the lift pins 126A-126C, another type of minimum contact area (MCA) supports, such as stones, are used to support the cleaning assembly 220.

In one embodiment, there is no need for the lift pins 126A-126C to support the cleaning assembly 220. For example, the lift pins 126A-126C are controlled by the host computer 102 (FIG. 1) to be lowered to not touch the bottom surface 410C of the cleaning assembly 220. The cleaning assembly 220 is supported by the top surface 416A of the rotational section 408.

FIG. 4B is a diagram of an embodiment of a top view of the rotational section 408 and the elongated section 406 of the arm 404 (FIG. 4A). The recessions 414A-414C are at vertices of a triangle 430 formed by the recessions 414A-41C. The triangle 430 has a lower area than an area of another triangle 432 formed by the lift pins 126A-126C. For example, the recessions 414A-414C are formed on a disc, illustrated by a circular area 434, and the disc is attached to a portion of the rotational section 408 to be a part of the top surface 416A (FIG. 4A) of the rotational section 408. As another example, a distance between any two adjacent ones of the lift pins 126A-126C is greater than a distance between any two adjacent ones of the recessions 414A-414C. To illustrate, a distance between the lift pins 126A and 126B is greater than a distance between the recessions 414A and 414B.

FIG. 4C is a diagram of an embodiment of a cleaning assembly 450. The cleaning assembly 450 is an example of the cleaning assembly 220 (FIG. 4B) or the cleaning assembly 222. The cleaning assembly 450 includes a support section 452, a press plate 454, and a cleaning layer 456. As an example, a press plate, described herein, has multiple slots that allow for thermal expansion of the press plate when exposed to the intermediate or high temperatures of the plasma chamber 105.

The press plate 454 is more rigid compared to the cleaning layer 456. For example, the press plate 454 is less bendable and is less flexible than the cleaning layer 456.

The cleaning assembly 450 further includes multiple spring mechanisms 458A, 458B, 458C, 458D, and 458E. The spring mechanisms 458A-458E of the cleaning assembly 450 or spring mechanisms of any other cleaning assembly, described herein, are sometimes referred to herein as a compression interface. The spring mechanisms 458-458E compress when the cleaning assembly 450 is moved upward in the vertical direction and the pillars of the cleaning layer 456 of the cleaning assembly 450 are in contact with the showerhead 108. On the other hand, the spring mechanisms 458-458E decompress when the cleaning assembly 450 is moved downward in the vertical direction and pillars of the cleaning layer 456 are not in contact with the showerhead 108.

An example of a spring mechanism includes one or more metal springs and metal plates that are coupled to ends of each of the one or more metal springs. For example, a first end of a spring is fitted to or attached to a first plate and a second end of the spring is attached to a second plate. To illustrate, the first plate has a metal slot having an opening into which the first end of the spring extends to fit the spring to the first plate and the second plate has a metal slot having an opening in which the second end of the spring extends to fit the spring to the second plate. An example of a metal spring includes a stainless wave spring.

The metal springs provide a cushion to the bottom surface of the showerhead 108 when the arm 404 (FIG. 4A) vertically lifts a cleaning layer of a cleaning assembly, described herein, to be contact with the bottom surface of the showerhead 108. For example, the metal springs soften an impact, such as a force, that is applied on the bottom surface of the showerhead 108 when the cleaning assembly is moved vertically upward to be in contact with the bottom surface. Similarly, when the showerhead 108 is moved vertically downward to be in contact with the cleaning assembly, the metal springs soften an impact of the showerhead 108 on the cleaning assembly. Each metal spring has a respective spring constant k that softens the impact. Also, each metal spring allows a cleaning layer of the cleaning assembly to be coplanar with the bottom surface of the showerhead 108.

The support section 452 is fabricated from a ceramic or a metal. An example of the ceramic is alumina. Moreover, the press plate 454 is fabricated from a material, such as nylon or synthetic fiber or ceramic or alumina. The cleaning layer 456 is fabricated from a cleaning material, such as polydimethylsiloxane (PDMS), or polymethyl methacrylate (PMMA), polyimide, Perfluoroelastomers (FFKM), or a combination thereof. For example, the cleaning layer 456 or any other cleaning layer, described herein, with pillars is fabricated by etching a polyimide sheet with multiple pillars for an adhesive-less tack. Polyimide is a polymer of imide monomers. An illustration of polyimide is Kapton™. As another example, the cleaning layer 456 or any other cleaning layer, described herein, with pillars is fabricated using nanoimprint lithography. Nanoimprint lithography is a method for fabricating the pillars of a nanometer scale. In nanoimprint lithography, the cleaning material is cured by heat or ultraviolet (UV) light during the imprinting. Adhesion between the cleaning material and a template is controlled to allow proper release. As another example, there is no adhesive on a top surface of the cleaning layer 456 or any other cleaning layer, described herein, to provide an adhesive-less clean of the showerhead 108. The adhesive-less cleaning layer reduces chances of adhesive contaminants being left behind on the showerhead 108.

The support section 452 can be solid, without a hollow portion inside an enclosure, or can be an enclosure encasing the hollow portion. The support section 452 has a top surface 462A, a side surface portion 462B, a bottom surface 462C, and a side surface portion 462D. As an example, when the support section 452 has a circular cross-section, as viewed in the z-direction, the support section 452 has one circular side surface that has the side surface portions 462B and 462D. Sometimes, a top surface is referred to herein as a top side or an upper side. Also, sometimes, a bottom surface is referred to herein as a bottom side or a lower side. The bottom surface 462C is an example of the bottom surface 410C (FIG. 4A) of the cleaning assembly 220 (FIG. 4A).

The top surface 462A is perpendicular or substantially perpendicular to the side surface portions 462B and 462D. For example, the top surface 462A forms an angle that is within a pre-determined range, such as ±5-7 degrees, with respect to the side surface portions 462B and 462D. Similarly, the bottom surface 462C is perpendicular or substantially perpendicular to the side surface portions 462B and 462D. Also, the top surface 462A is parallel or substantially parallel to the bottom surface 462C.

The bottom surface 462C includes the protrusions 412A, 412B, and 412C. As another example, the protrusions 412A-412C are formed using a molding machine that is used to fabricate the support section 452. As another example, the protrusions are attached to, such as screwed to or chemically bonded to, a flat portion of the bottom surface 462C. The flat portion of the bottom surface 462C is parallel to the x-axis.

Multiple slots 460A, 460B, 460C, 460D, and 460E are formed on the top surface 462A. For example, the slots 460A, 460B, 460C, 460D, and 460E are drilled within the top surface 462A to extend each slot 460A, 460B, 460C, 460D, and 460E to a pre-set depth along the side surface portions 462B and 462D to not extend each slot 458A, 458B, 458C, 458D, and 458E along the entire depth of the side surface portions 462B and 462D. To illustrate, none of the slots 460A, 460B, 460C, 460D, and 460E extend from a horizontal level of a flat portion of the top surface 462A to a horizontal level of the bottom surface 462C of the support section 452.

Each spring mechanism 458A-458E is fitted to a respective one of the slots 460A-460E in such a manner that a portion of the spring mechanism extends in the slot and the remaining portion extends outside the slot. For example, the spring mechanism 458A is fitted to the slot 460A by attaching the first plate of the spring mechanism 458A to the slot 460A. A portion of the spring mechanism 458A extends outside the slot 458A from the top surface 462A. Similarly, the spring mechanism 458B is fitted to the slot 460B, the spring mechanism 458C is fitted to the slot 460C, the spring mechanism 458D is fitted to the slot 460D, and the spring mechanism 458E is fitted to the slot 460E.

The press plate 454 has a top surface 464A, a side surface portion 464B, a bottom surface 464C, and a side surface portion 464D. As an example, when the press plate 454 has a circular cross-section, as viewed in the z-direction, the press plate 454 has one circular side surface that has the side surface portions 464B and 464D.

The top surface 464A is perpendicular or substantially perpendicular to the side surface portions 464B and 464D. For example, the top surface 464A forms an angle that is within a pre-determined range, such as ±5-7 degrees, with respect to the side surface portions 464B and 464D. Similarly, the bottom surface 464C is perpendicular or substantially perpendicular to the side surface portions 464B and 464D. Also, the top surface 464A is parallel or substantially parallel to the bottom surface 464C.

The press plate 454 has multiple extension portions 465A and 465B. As an example, when the press plate 454 has the circular cross-section, as viewed in the z-direction, the press plate 454 has one extension that has the extension portions 465A and 465B, and the extension has a circular cross-section, as viewed in the z-direction. The extension portion 465A extends, along the z-axis, from the side surface portion 464A and the extension portion 465B extends, along the z-axis, from the side surface portion 464B. As an example, the extension portion 465A extends from the bottom surface 464C to a portion of a height of the side surface portion 462D of the support section 452 and the extension portion 465B extends from the bottom surface 464C to a portion of a height of the side surface portion 462B of the support section 452.

The bottom surface 464C of the press plate 454 faces and is located over the top surface 462A of the support section 452. Also, each spring mechanism 458A-458E is fitted to the bottom surface 464C. For example, the spring mechanism 458A is fitted to the bottom surface 464C by attaching the second plate of the spring mechanism 458A to the bottom surface 464C. Similarly, the spring mechanisms 458B-458D are fitted to bottom surface 464C of the press plate 454.

The cleaning layer 456 is located over or above the press plate 454. For example, the cleaning layer 456 is attached to the top surface 464A of the press plate 454. To illustrate, the press plate 454 includes multiple holes and the cleaning layer 456 has multiple connection features, such as protrusions or knobs, which extend into the holes for attaching the press plate 454 to the cleaning layer 456. Each connection feature has a diameter larger than a width of a corresponding hole. As the connection feature passes through the corresponding hole, it compresses to reduce its diameter to be lower than the width of the hole. Each of the diameter of the connection feature and the width of the hole are measured along the x-axis. After passing through the hole, the connection feature expands to its original diameter. In this illustration, the connection features are molded using a molding machine into the cleaning layer 456 and each connection feature passes through the corresponding hole of the press plate 454. There is no adhesive between the press plate 454 and the cleaning layer 456 to attach the cleaning layer 456 to the press plate 454. As another example, an adhesive is used to attach the cleaning layer 456 to the press plate 454.

The cleaning layer 456 has a top surface 466A, a side surface portion 466B, a bottom surface 466C, and a side surface portion 466D. As an example, when the cleaning layer 456 has a circular cross-section, as viewed in the z-direction, the cleaning layer 456 has one circular side surface that has the side surface portions 466B and 466D.

The top surface 466A is perpendicular or substantially perpendicular to the side surface portions 466B and 466D. For example, the top surface 466A forms an angle that is within a pre-determined range, such as ±5-7 degrees, with respect to the side surface portions 466B and 466D. Similarly, the bottom surface 466C is perpendicular or substantially perpendicular to the side surface portions 466B and 466D. Also, the top surface 466A is parallel or substantially parallel to the bottom surface 466C. The top surface 466A is patterned to fabricate multiple pillars, such as a pillar 468F and a pillar 468G, of the top surface 466A. The pillars reduce a surface area of contact between the cleaning layer 456 and the showerhead 108 compared to a surface area of contact of a cleaning layer that does not have the pillars and is flat without indentations. This reduced surface area reduces force for separating the cleaning layer 456 from the showerhead 108 after cleaning the showerhead 108 or during the cleaning of the showerhead 108. A distance between two adjacent pillars creates an indentation or a flat layer 1102 on the top surface 466A. The flat layer 1102 is sometimes referred to herein as a lower non-contact surface that does not come in contact with the bottom surface of the showerhead 108. The pillars have upper surfaces, such as an upper surface 527F (FIG. 5A) of the pillar 468F and another upper surface 527G (FIG. 5A) of the pillar 468G, which come in contact with the bottom surface of the showerhead 108 to clean the bottom surface. The upper surfaces of the pillars are located at a higher horizontal level, along the x-axis, compared to a horizontal level of the flat layer 1102.

When the pillars are formed, the top surface 466A is divided into two levels, 470A and 470B, each of which lies in a horizontal plane or a substantially horizontal plane. An example of the substantially horizontal plane is a plane that forms a pre-determined angle, such as ±5 degrees, with response to the horizontal plane. The level 470A is a level at which top surfaces of the pillars are located or a top surface of a tallest pillar among all pillars of the top surface 466A is located. The level 470B is a level of the top surface 466A from which the pillars of the top surface 466A emanate or originate. The level 470B is a level of the flat layer 1102.

A distance between the bottom surface 462C of the support section 452 and the level 470A is d, which ranges from 6 millimeters (mm) to 14 mm. For example, the distance d ranges from 6 mm to 12 mm. As another example, the distance d ranges from 6 mm to 8 mm. As yet another example, the distance d is 8 mm.

In one embodiment, the cleaning assembly 450 includes any other number, such as three, or four, or six, or seven, of spring mechanisms. For example, the cleaning assembly 450 includes an odd number of spring mechanisms. To illustrate, three spring mechanisms are used and each spring mechanism is located at a vertex of a triangle formed by the spring mechanisms. The triangle is formed on the top surface 462A.

In an embodiment, instead of pillars, micropillars are used in a cleaning assembly.

FIG. 4D is a top view of the top surface 462A of the support section 452 to illustrate locations of the spring mechanisms 458A-458E. The spring mechanisms 458A-458E are located at vertices of a pentagon that is formed by the spring mechanisms 458A-458E. Similarly, the slots 460A-460E that accommodate the spring mechanisms 458A-458E are located at vertices of a pentagon that is formed by the slots 460A-460E.

Figure 5A:
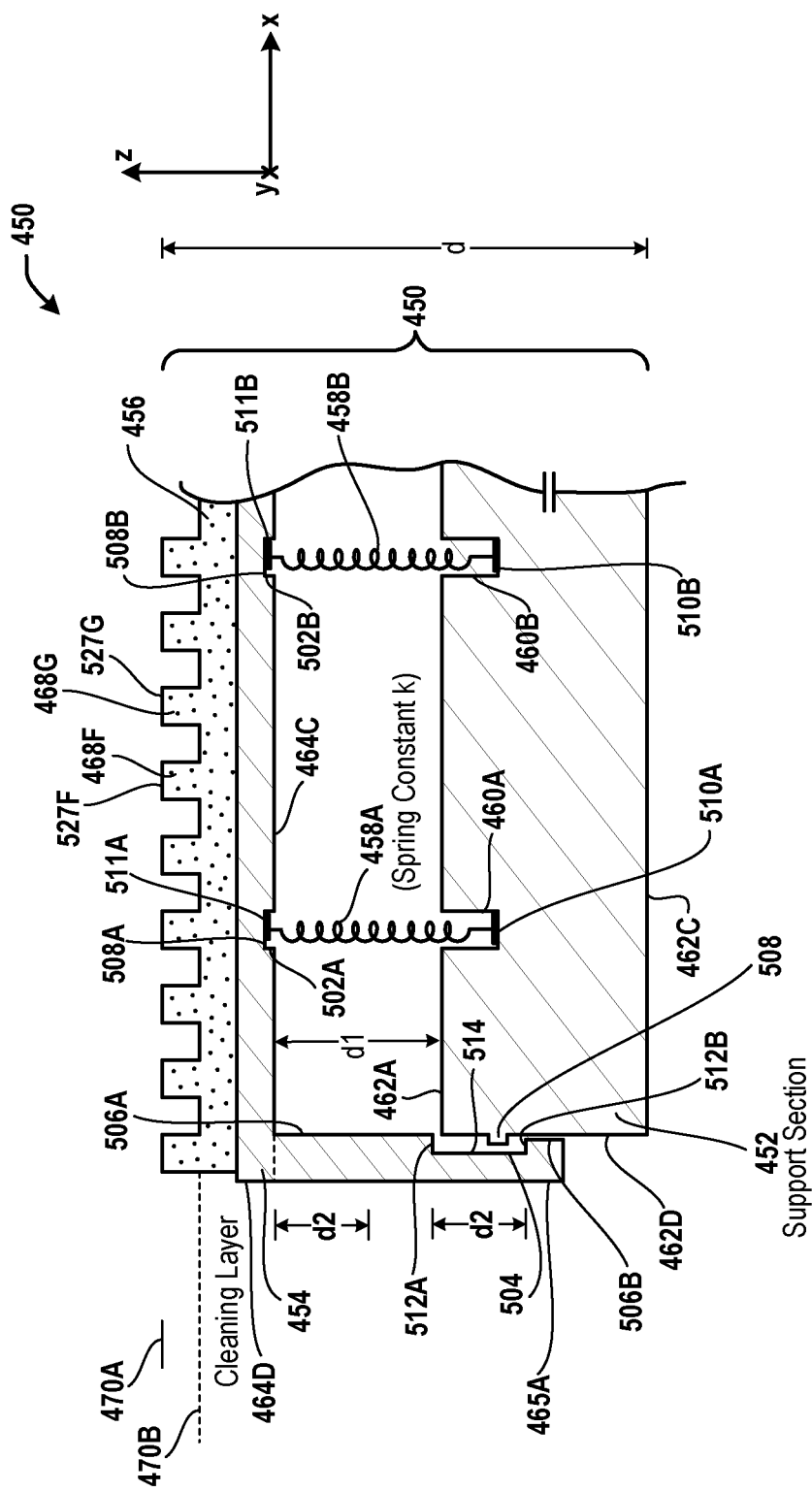
FIG. 5A is a detail view of an embodiment of the cleaning assembly of FIG. 4C.

FIG. 5A is a detail view of an embodiment of the cleaning assembly 450. A distance between the bottom surface 464C of the press plate 454 and the top surface 462A of the support section 452 is d1. The extension portion 465A of the press plate 454 has an inner surface 506A and an outer surface 506B. A part of the inner surface 506A of the extension portion 465A faces the side surface portion 462D of the support section 462.

A slot 504 is formed in the inner surface 506A but does not extend through an entire width of the inner surface 506A. As an example, the slot 504 has a rectangular cross-section in an x-direction, which is a direction along the x-axis. As another example, the slot 504 is drilled into the inner surface 506A. A depth of the slot 504 is less than a width of the extension portion 465A of the press plate 454. As an example, the width of the extension portion 465A and the depth of the slot 504 are measured along the x-axis. A length of the slot 504 is d2. For example, a distance between a top surface 512A and a bottom surface 512B of the slot 504 is d2. The length of the slot 504 is along the z-axis.

The slot 504 has the top surface 512A, a middle surface 514, and the bottom surface 512B. The top surface 512A faces the bottom surface 512B, and the top and bottom surfaces 512A and 512B are parallel or substantially parallel to the x-axis. For example, each of top and bottom surfaces 512A and 512B form a pre-determined angle, e.g., ±5 degrees, from the x-axis. The middle surface 514 extends from the top surface 512A to the bottom surface 512B.

A protrusion 508 is fabricated to extend from a flat portion of the side surface portion 462D of the support section 452. As an example, the protrusion 508 is formed using a molding machine that is used to fabricate the support section 452. As another example, the protrusion 508 is attached to, such as screwed to or chemically bonded to, a flat portion of the side surface portion 462D. The flat portion of the side surface portion 462D is parallel or substantially parallel to the z-axis. For example, the flat portion of the side surface portion 462D forms a pre-determined angle, e.g., ±5 degrees, from the z-axis.

Also, multiple slots, such as a slot 502A and a slot 502B, are formed within the bottom surface 464C of the press plate 454. As an example, the slots are drilled into the bottom surface 464C. The slots 502A and 502B within the bottom surface 464C extend along a height of the side surface portion 464D of the press plate 454 but do not extend along the entire height of the side surface portion 464D. The remaining three slots formed within the bottom surface 464C to accommodate the spring mechanisms 458C-458E are not shown in FIG. 5A.

The spring mechanism 458A extends into the slot 502A to be attached to a top surface 508A of the slot 502A and into the slot 460A to be connected to a bottom surface 510A of the slot 460A. Similarly, the spring mechanism 458B extends into the slot 502B to be attached to a top surface 508B of the slot 502B and into the slot 460B to be connected to a bottom surface 510B of the slot 460B.

A portion of the spring mechanism 458A is within the slot 502A, another portion of the spring mechanism 458A is outside the slots 502A and 460A and between the bottom surface 464C of the press plate 454 and the top surface 462A of the support section 452, and the remaining portion of the spring mechanism 458A extends within the slot 460A. Similarly, a portion of the spring mechanism 458B is within the slot 502B, another portion of the spring mechanism 458B is outside the slots 502B and 460B and between the bottom surface 464C and the top surface 462A, and the remaining portion of the spring mechanism 458B extends within the slot 460B. The slots 460A-460E reduce chances of breakage of the spring mechanisms 458A-458E and similarly the slots, such as the slots 502A and 502B, formed within the bottom surface 464C, reduce chances of the breakage.

The distance d2 is less than the distance d1 to reduce chances of the top surface 462A of the support section 452 from contacting the bottom surface 464C of the rigid member 454 to extend life of the spring mechanisms 458A-458E. For example, when the cleaning assembly 450 is lifted to be proximate to or in contact with the showerhead 108 (FIG. 1) to clean the showerhead 108, the springs of the spring mechanisms 458A-458E compress and the protrusion 508 moves up, in the z-direction until the protrusion 508 contacts the top surface 512A of the slot 504. This avoids maximum compression of the spring mechanisms 458A-458E to extend the life of the spring mechanisms 458A-458E.

In one embodiment, the cleaning assembly 450 excludes the slots 460A-460E formed within the bottom surface 462A of the support section 452 and excludes the slots, such as the slots 502A and 502B, formed within the bottom surface 464C of the press plate 454. Moreover, the cleaning assembly 450 excludes the extension portions 465A and 465B. The spring mechanisms 458A-458E are attached to the top surface 452A of the support section 452 and to the bottom surface 464C of the press plate 454. Also, the support section 452 excludes the protrusion 508.

Figure 5B:
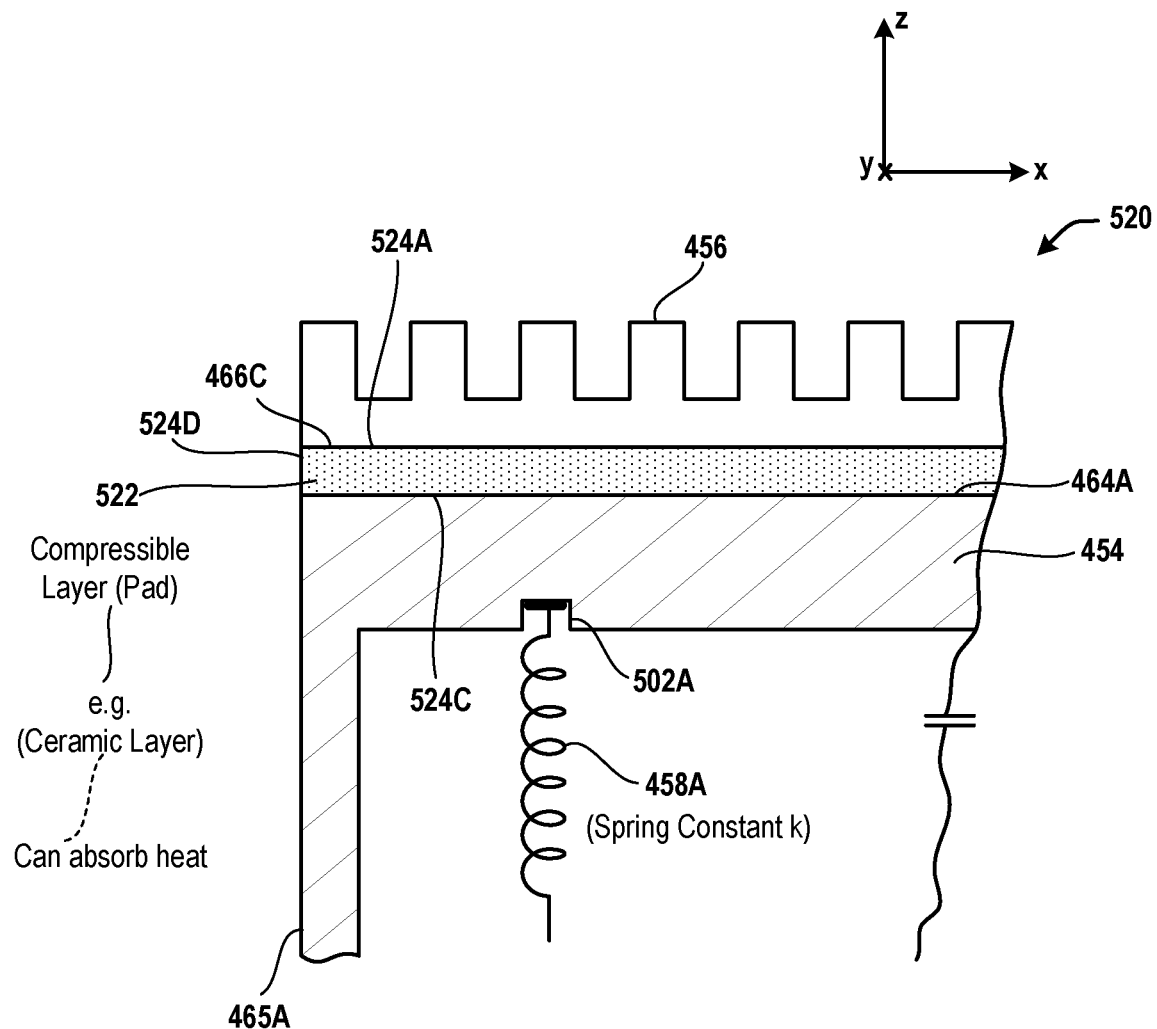
FIG. 5B is a detail view of an embodiment of another cleaning assembly.

FIG. 5B is a detail view of an embodiment of another cleaning assembly 520. The cleaning assembly 520 is the same as the cleaning assembly 450 (FIG. 5A) except that the cleaning assembly 502 includes a compressible layer 522 between the cleaning layer 456 and the press plate 454. Examples of the compressible layer 522 include a layer fabricated from ceramic or another heat absorbing material to absorb heat produced within the plasma chamber 105 (FIG. 2).

The compressible layer 522 is sometimes referred to herein as a cushioning layer. The compressible layer 522 compresses to provide an additional degree of compression absorption when the cleaning assembly 520 is pressed onto or against the bottom surface of the showerhead 108 so that the cleaning layer 456 is in contact with the bottom surface. The additional degree of compression absorption is in addition to an amount of compression absorption that is provided by compression of the springs of the spring mechanisms 458A-458E (FIG. 4C) when the cleaning layer 456 of the cleaning assembly 520 is in contact with the bottom surface of the showerhead 108.

The compressible layer 522 has a top surface 524A, a side surface portion (not shown), a bottom surface 524C, and another side surface portion 524D. As an example, the compressible layer 522 has a circular cross-section, as viewed in the z-direction, and the compressible layer 522 has one circular side surface that has the side surface portions that include the side surface portion 524D.

The top surface 524A of the compressible layer 522 is attached to, such as glue to or chemically bonded with, the bottom surface 466C of the cleaning layer 456. Also, the bottom surface 524C of the compressible layer 522 is attached to, such as glue to or chemically bonded with, the top surface 464A of the press plate 454.

Figure 5C:
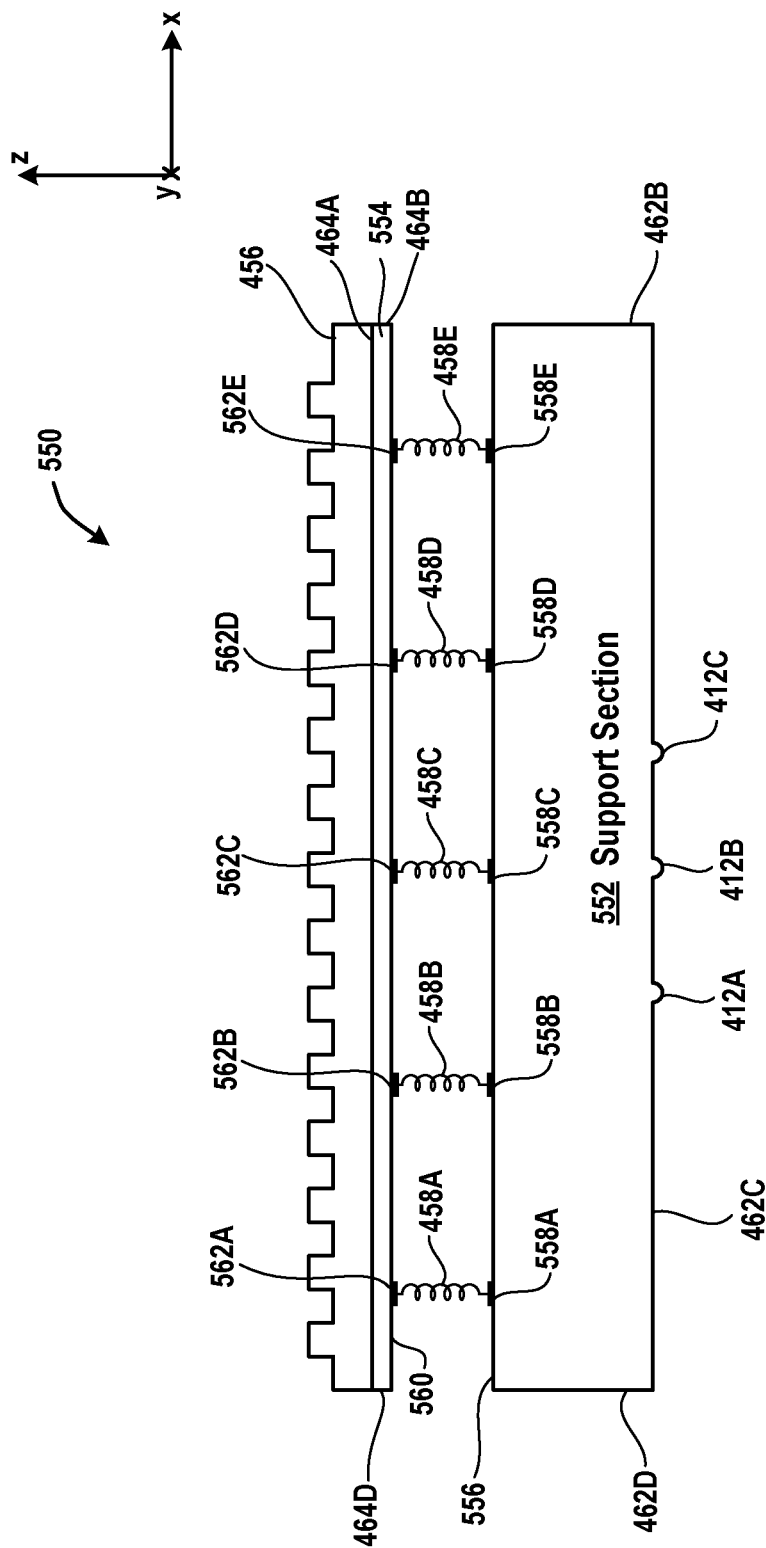
FIG. 5C is a diagram of an embodiment of a cleaning assembly.

FIG. 5C is a diagram of an embodiment of a cleaning assembly 550. The cleaning assembly 550 is the same, in structure, as the cleaning assembly 450 (FIG. 4C) except that the cleaning assembly 550 excludes the extension portions 465A and 465B (FIG. 4C), the slots 460A-460E (FIG. 4C) and the protrusion 508 (FIG. 5A) within the support section 452, and the slots, such as the slots 502A and 502B, within the press plate 454 (FIG. 5A).

The cleaning assembly 550 includes a support section 552 and a press plate 554. The support section 552 has the same structure as the support section 452 (FIG. 4C) except that the support section 552 does not include the slots 460A-460E and the protrusion 508. The support section 452 has a top surface 556 that is flat instead of the top surface 462A of the support section 452.

Multiple plates 558A, 558B, 558C, 558D, and 558E are attached to, such as screwed to, chemically bonded with or glued to, the top surface 556. Each plate, as described herein, is made from a metal, such as aluminum. The springs of the spring mechanisms 458A-458E are attached to the plates 558A-558E. For example, each plate 558A-558E includes a groove in which a respective one of the springs of the spring mechanisms 458A-458E extends into via a clockwise or counterclockwise motion. As another example, a spring of the spring mechanism 458A is attached to the plate 558A, a spring of the spring mechanism 458B is attached to the plate 558B, a spring of the spring mechanism 458C is attached to the plate 558C, a spring of the spring mechanism 458D is attached to the plate 558D, and a spring of the spring mechanism 458E is attached to the plate 558E.

The press plate 554 has the same structure as the press plate 454 (FIG. 4C) except that the press plate 554 does not include the slots, such as the slots 502A-502B (FIG. 5A), formed within the bottom surface 464C (FIG. 4C) of the press plate 454 and does not include the extension portions 465A and 465B. The press plate 554 has a bottom surface 560 instead of the bottom surface 464C of the press plate 454.

Multiple plates 562A, 562B, 562C, 562D, and 562E are attached to, such as screwed to, chemically bonded with or glued to, the bottom surface 560. The springs of the spring mechanisms 458A-458E are attached to the plates 562A-562E. For example, each plate 562A-562E includes a groove in which a respective one of the springs of the spring mechanisms 458A-458E extends into via a clockwise or counterclockwise motion. As another example, a spring of the spring mechanism 458A is attached to the plate 562A, a spring of the spring mechanism 458B is attached to the plate 562B, a spring of the spring mechanism 458C is attached to the plate 562C, a spring of the spring mechanism 458D is attached to the plate 562D, and a spring of the spring mechanism 458E is attached to the plate 562E.

FIG. 6A is a diagram of an embodiment of the system 600 to illustrate a lowered position of the cleaning assembly 220. The lowered position is sometimes referred to herein as a retracted position.

The system 600 includes the pedestal 110A. The pedestal 110A has a top surface 602A, a side surface portion 602B, a bottom surface 602C, and another side surface portion 602D. As an example, the pedestal 110A has a circular cross-section, as viewed in the z-direction, and the pedestal 110A has one circular side surface that has the side surface portions 602B and 602D.

A top surface 602A is perpendicular or substantially perpendicular to the side surface portions 602B and 602D. For example, the top surface 602A forms an angle that is within a pre-determined range, such as ±5-7 degrees, with respect to the side surface portions 602B and 602D. Similarly, the bottom surface 602C is perpendicular or substantially perpendicular to the side surface portions 602B and 602D. Also, the top surface 602A is parallel or substantially parallel to the bottom surface 602C.

Similarly, the showerhead 108 has a top surface 604A, a side surface portion 604B, a bottom surface 604C, and another side surface portion 604D. As an example, the showerhead 108 has a circular cross-section, as viewed in the z-direction, and the showerhead 108 has one circular side surface that has the side surface portions 604B and 604D. As an example, the bottom surface 604C is of a faceplate of the showerhead 108. To illustrate, the faceplate includes numerous holes or perforations for allowing a passage of the one or more process gases into the gap between the showerhead 108 and the pedestal 110A (FIG. 1).

A portion of the top surface 604A of the showerhead 108 is perpendicular or substantially perpendicular to the side surface portions 604B and 604D. For example, the top surface 604A forms an angle that is within a pre-determined range, such as ±5-7 degrees, with respect to the side surface portions 604B and 604D. Similarly, the bottom surface 604C of the showerhead 108 is perpendicular or substantially perpendicular to the side surface portions 604B and 604D of the showerhead 108. Also, the top surface 604A of the showerhead 108 is parallel or substantially parallel to the bottom surface 604C of the showerhead 108.

Due to operation of the showerhead 108, particles, such as particles 606A and 606B, deposit under the bottom surface 604C of the showerhead 108. Examples of the particles deposited under the bottom surface 604C include remnants of plasma or process gas particles or particles of materials that are deposited on the substrate 128 (FIG. 1) or contaminants.

The cleaning assembly 220 is placed on the rotational section 408 by the end effector 210A (FIG. 2) of the in-bound load lock 202A. For example, the cleaning assembly 220 is moved by the end effector 210A to be over the rotational section 408 to align the protrusion 412A with the recession 414A, the protrusion 412B with the recession 414B, and the protrusion 412C with the recession 414C. The alignments are in the vertical direction. The protrusion 412A that is aligned with the recession 414A is then lowered by the end effector 210A so that the protrusion 412A extends into the recession 414A. Simultaneously, the protrusion 412B that is aligned with the recession 414B is then lowered by the end effector 210A so that the protrusion 412B extends into the recession 414B and the protrusion 412C that is aligned with the recession 414C is then lowered by the end effector 210A so that the protrusion 412C extends into the recession 414C.

After the protrusions 412A-412C extend into the recessions 414A-414C to place the cleaning assembly 220 on the rotational section 408, the spindle 208 is controlled by the host computer 102 (FIG. 1) to raise the cleaning assembly 220 from a height H1 to a raised height, such as a height H2, illustrated below in FIG. 6B. When the spindle is at the raised height, the cleaning assembly 220 is in contact with or proximate to the bottom surface 604C of the showerhead 108 to clean, such as remove or reduce, the particles under the bottom surface 604C. The height H1 is a height from the bottom surface 602C of the pedestal 110A to the top surface 410A of the cleaning assembly 220. When the cleaning assembly 220 is at the height H1, the cleaning assembly 220 is not proximate to the showerhead 208. For example, there are no electrostatic forces or Van der Waals forces that are applied by the cleaning assembly 220 to the bottom surface 604C of the showerhead 108. The height H1 is one at which the end effector 210A (FIG. 2) transfers the cleaning assembly 220 from the in-bound load lock 202A (FIG. 2) to be placed on the rotational section 408.

FIG. 6B is a diagram of another embodiment of the system 600 to illustrate the raised height of the cleaning assembly 220. The host computer 102 (FIG. 1) controls the spindle 208 to raise the height H1 (FIG. 6A) of the cleaning assembly 220 to the height H2. The height H2 is greater than the height H1. The height H2 is a height from the bottom surface 602C of the pedestal 110A to the top surface 410A of the cleaning assembly 220. When the cleaning assembly 220 is at the height H2, the top surface 410A of the cleaning assembly 220 is proximate to, such as within a pre-determined distance from, or touching the bottom surface 604C of the showerhead 108 to clean the showerhead 108. For example, the electrostatic or Van der Waals forces are applied by the cleaning assembly 220, such as the cleaning layer 456 (FIG. 4C), to the showerhead 108 to clean the showerhead 108. The showerhead 108 is cleaned when the particles adhered to the bottom surface 604C of the showerhead 108 are attracted by the electrostatic or Van der Waals forces towards the cleaning layer 456.

FIG. 7 is a diagram of an embodiment of a system 700 to illustrate transportation of the cleaning assembly 220 to and from the in-bound load lock 202A. The system 700 includes the in-bound load lock 202A, the end effector 210A, the cleaning assembly 220, and the arm 404. The end effector 210A extends in the x-direction towards the arm 404 from the load lock 202A to align the protrusion 412A with the recession 414A (FIG. 6A) of the rotational section 408, the protrusion 412B with the recession 414B (FIG. 6A) of the rotational section 408, and the protrusion 412C with the recession 414C (FIG. 6A) of the rotational section 408. When the end effector 210A extends in the x-direction, the end effector 210A extends into a space between the bottom surface 410C of the cleaning assembly 202 and the top surface 602A (FIG. 6A) of the pedestal 110A to place the cleaning assembly 220 on the arm 404. The end effector 210A lowers in the downward direction, along the z-axis, to place the cleaning assembly 220 on the rotational section 408 to be supported by the rotational section 408.

In an opposite manner, after the showerhead 108 is cleaned by the cleaning assembly 220, the end effector 210B (FIG. 2) extends in a horizontal direction, along the x-axis, towards the arm 404 to extend into the space between the bottom surface 410C of the cleaning assembly 202 and the top surface 602A of the pedestal 110A and moves slightly upward in the vertical direction to support the cleaning assembly 220. Once the cleaning assembly 220 is supported by the end effector 210B, the end effector 210B retracts to move the cleaning assembly 220 from the plasma chamber 105 (FIG. 1) to the outbound load lock 202B (FIG. 2).

Figure 8:
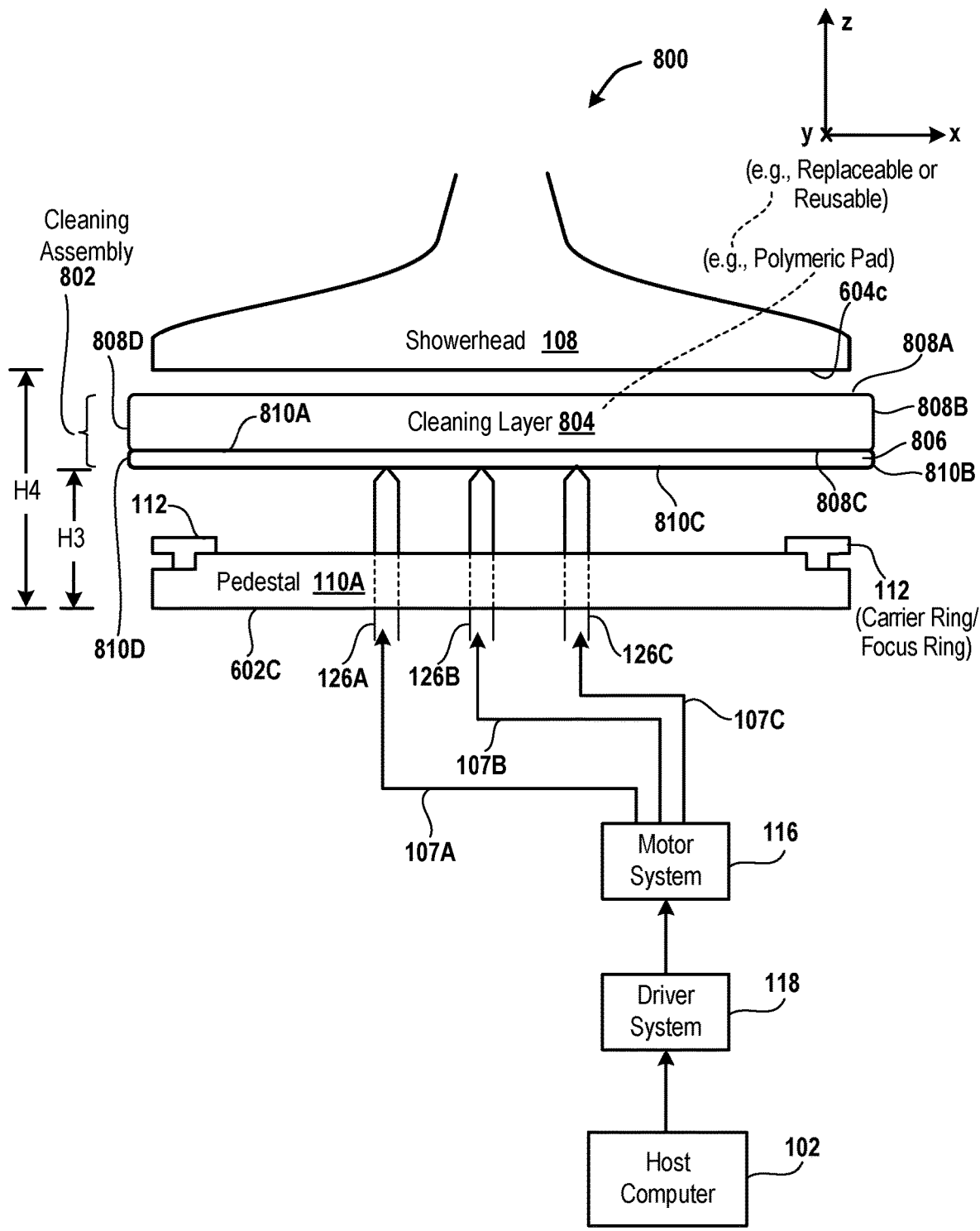
FIG. 8 is a diagram of an embodiment of a system to illustrate use of multiple lift pins to raise or lower a cleaning assembly.

FIG. 8 is a diagram of an embodiment of the system 800 to illustrate use of the lift pins 126A-126C to raise or lower a cleaning assembly 802. The cleaning assembly 802 is an example of the cleaning assembly 220 or 222 (FIG. 2).

The cleaning assembly 802 includes a press plate 806 and a cleaning layer 804. The press plate 806 is made from the same material as that of the press plate 456 (FIG. 4C). The press plate 806 is attached to the cleaning layer 804 in the same manner, described above, in which the press plate 454 is attached to the cleaning layer 456 (FIG. 4C). To illustrate, the press plate 806 includes multiple holes and the cleaning layer 804 has multiple connection features, such as protrusions or knobs, which extend into the holes for attaching the press plate 806 to the cleaning layer 804. In this illustration, the connection features are molded using a molding machine into the cleaning layer 804 and each connection feature passes through a corresponding hole of the press plate 806. There is no adhesive between the press plate 806 and the cleaning layer 804 to attach the cleaning layer 804 to the press plate 806. As another example, an adhesive is used to attach the cleaning layer 804 to the press plate 806.

As another example, the press plate 806 is integral with the cleaning layer 802 to manifest as one layer and there is no chemical bond formed between the two layers. As an example, the press plate 806 is an example of the press plate 454 (FIG. 4C) without the extension portions 465A and 465B (FIG. 4A) and without the slots, such as the slots 502A and 502B (FIG. 5A), of the press plate 454.

An example of the cleaning layer 804 is the cleaning layer 456 (FIG. 4C). As another example, the cleaning layer 804 is a polymeric pad. The press plate 806 is more rigid compared to the cleaning layer 804. For example, the press plate 806 is less bendable and is less flexible than the cleaning layer 804.

The cleaning layer 804 has a top surface 808A, a side surface portion 808B, a bottom surface 808C, and a side surface portion 808D. As an example, the cleaning layer 804 has a circular cross-section, as viewed in the z-direction, and the cleaning layer 804 has one circular side surface that has the side surface portions 808B and 808D.

The top surface 808A is perpendicular or substantially perpendicular to the side surface portions 808B and 808D. For example, the top surface 808A forms an angle that is within a pre-determined range, such as ±5-7 degrees, with respect to the side surface portions 808B and 808D. Similarly, the bottom surface 808C is perpendicular or substantially perpendicular to the side surface portions 808B and 808D. Also, the top surface 808A is parallel or substantially parallel to the bottom surface 808C.

Similarly, the press plate 806 has a top surface 810A, a side surface portion 810B, a bottom surface 810C, and a side surface portion 810D. As an example, the press plate 806 has a circular cross-section, as viewed in the z-direction, and the press plate 806 has one circular side surface that has the side surface portions 810B and 810D.

The top surface 810A is perpendicular or substantially perpendicular to the side surface portions 810B and 810D. For example, the top surface 810A forms an angle that is within a pre-determined range, such as ±5-7 degrees, with respect to the side surface portions 810B and 810D. Similarly, the bottom surface 810C is perpendicular or substantially perpendicular to the side surface portions 810B and 810D. Also, the top surface 810A is parallel or substantially parallel to the bottom surface 810C. The bottom layer 808C of the cleaning layer 804 is attached to the top surface 810A of the press plate 806.

The host computer 102 controls the lift pins 126A-126C to raise the cleaning assembly 802 from a height H3 to a height H4. The height H4 is greater than the height H3 and is a height from the bottom surface 602C of the pedestal 110A to the top surface 808A of the cleaning layer 804. Also, the height H3 is a height from the bottom surface 602C of the pedestal 110A to the top surface 808A of the cleaning layer 804. The height H3 is one at which the end effector 210A (FIG. 2) transfers the cleaning assembly 802 from the in-bound load lock 202A to be placed on the lift pins 126A-126C. As an example, at the height H3, the cleaning assembly 802 is placed on and supported by the carrier ring 112.

When the cleaning assembly 802 is at the height H4, the top surface 808A of the cleaning assembly 802 is proximate to, such as within a pre-determined distance from, or touching the bottom surface 604C of the showerhead 108 to clean the showerhead 108. For example, the electrostatic or Van der Waals forces are applied by the cleaning assembly 802, such as the cleaning layer 804, to the showerhead 108 to clean the showerhead 108. The showerhead 108 is cleaned when the particles adhered to the bottom surface 604C of the showerhead 108 are attracted by the electrostatic or Van der Waals forces towards the cleaning layer 804. After cleaning the showerhead 108, the lift pins 126A-126B are controlled by the host computer 102 to be lowered in the vertical direction to lower the cleaning assembly 802 to the height H3.

The host computer 102 sends a lift pin control signal to the driver system 118. The lift pin control signal includes a height to which the lift pins 126A-126C are to be raised or lowered in the vertical direction. An example of the height to which the lift pins 126A-126C are to be raised is the height H4 and the height to which the lift pins 126A-126C are to be lowered is the height H3.

Upon receiving the lift pin control signal, the driver system 118 generates one or more current signals that are sent to the motor system 116. The one or more motors of the motor system 116 rotate to move one or more of the connection mechanisms 107A-107C to raise or lower the respective one or more of the lift pins 126A-126C. The lift pins 126A-126C are raised to raise the cleaning assembly 802 to the height H4 or lowered to lower the cleaning assembly 802 in the vertical direction to the height H3.

Figure 9A:
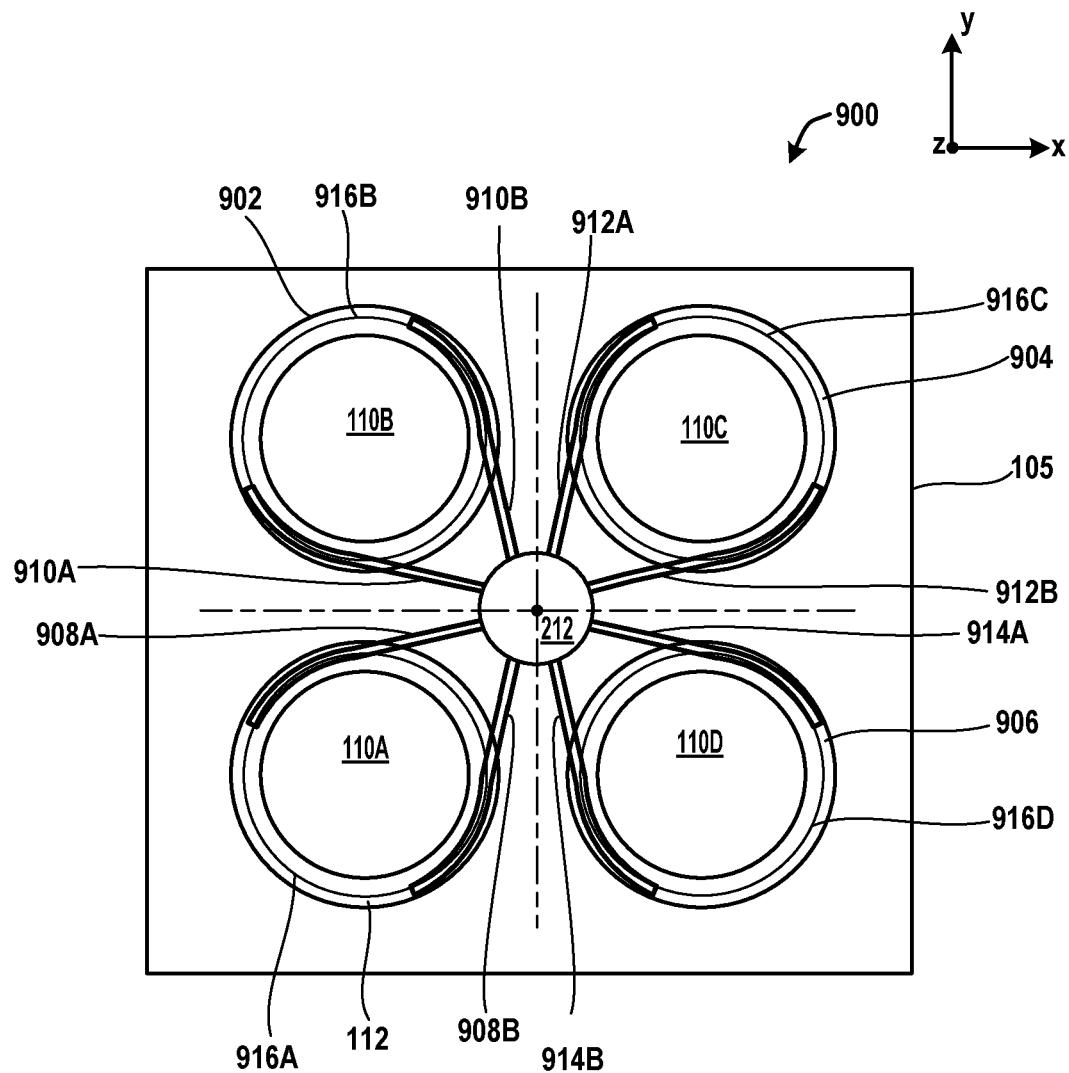
FIG. 9A is a diagram of an embodiment of a system to illustrate multiple spider forks used for raising or lowering a cleaning assembly.

FIG. 9A is a diagram of an embodiment of a system 900 to illustrate use of spider forks 908A, 908B, 910A, 910B, 912A, 912B, 914A, and 914B. The system 900 includes the plasma chamber 105. The spider forks 908A, 908B, 910A, 910B, 912A, 912B, 914A, and 914B extend from the spindle 212 along an xy-plane formed between the x-axis and the y-axis. For example, the spider forks 908A, 908B, 910A, 910B, 912A, 912B, 914A, and 914B are coupled to, such as screwed to, etc., a body of the spindle 212. As another example, the spider forks 908A, 908B, 910A, 910B, 912A, 912B, 914A, and 914B are integrated with the spindle 212 and are integral parts of the spindle 212. As an illustration, each spider fork 908A, 908B, 910A, 910B, 912A, 912B, 914A, and 914B is fabricated from a ceramic material to withstand high levels of heat during processing.

The plasma chamber 105 has multiple carrier rings 112, 902, 904, and 906. The carrier ring 112 is placed on an edge of the pedestal 110A, the carrier ring 902 is placed on an edge of the pedestal 110B, the carrier ring 904 is placed on an edge of the pedestal 110C, and the carrier ring 906 is placed on an edge of the pedestal 110D. Moreover, the plasma chamber 105 has multiple cleaning assemblies 916A, 916B, 916C, and 916D. Each cleaning assembly 916A-916D has the same structure and performs the same function as that of the cleaning assembly 802 (FIG. 8).

The cleaning assembly 916A is placed on top of the carrier ring 112, the cleaning assembly 916B is placed on top of the carrier ring 902, the cleaning assembly 916C is placed on top of the carrier ring 906, and the cleaning assembly 916D is placed on top of the carrier ring 906 to clean the corresponding showerheads of the four stations. A first one of the four stations includes the pedestal 110A and the showerhead 108 (FIG. 1). The showerhead 108 is sometimes referred to herein as a first one of the showerheads. A second one of the four stations includes the pedestal 110B and a second one of the showerheads, a third one of the four stations includes the pedestal 110C and a third one of the showerheads, and a fourth one of the four stations includes the pedestal 110D and a fourth one of the showerheads. Each of the first, second, and third showerheads has the same structure and perform the same function as the first showerhead. The second showerhead is located over the pedestal 110B, the third showerhead is located over the pedestal 110C, and the fourth showerhead is located over the pedestal 110D.

When the spindle 212 moves in the vertical direction, as described above, the movement of the spindle 212 moves the spider forks 908A, 908B, 910A, 910B, 912A, 912B, 914A, and 914B in the vertical direction simultaneously to lift the carrier rings 112, 902, 904, and 906 and the cleaning assemblies 916A, 916B, 916C, and 916D in the vertical direction. For example, the spider forks 908A and 908B contact a bottom surface of the carrier ring 112, which contacts a bottom surface of the cleaning assembly 916A to lift the cleaning assembly 916A. Similarly, the spider forks 910A and 910B contact a bottom surface of the carrier ring 902, which contacts a bottom surface of the cleaning assembly 916B to lift the cleaning assembly 916B. Also, the spider forks 912A and 912B contact a bottom surface of the carrier ring 904, which contacts a bottom surface of the cleaning assembly 916C to lift the cleaning assembly 916C. The spider forks 914A and 914B contact a bottom surface of the carrier ring 906, which contacts a bottom surface of the cleaning assembly 916D to lift the cleaning assembly 916D.

Figure 9B:
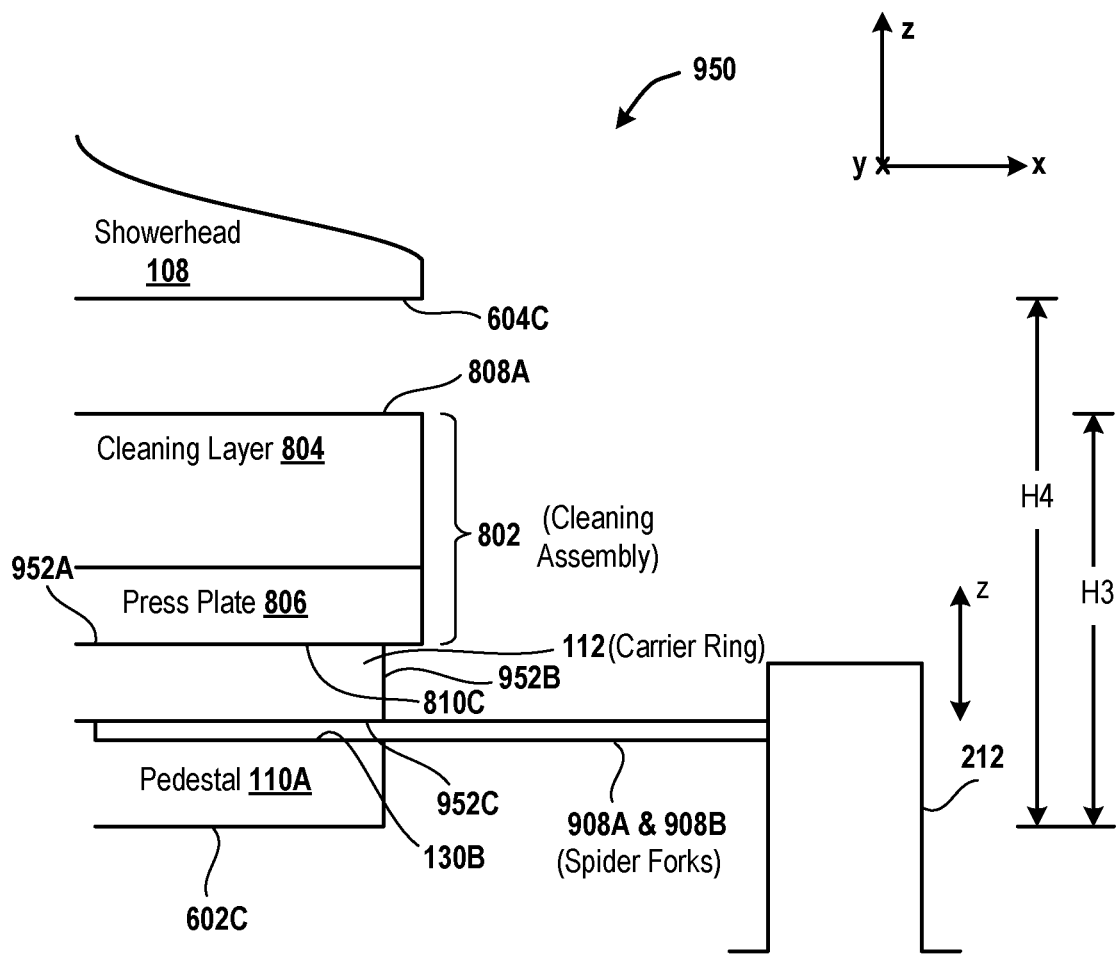
FIG. 9B is a diagram of an embodiment of a system to illustrate vertical movement of the spider forks with movement of a spindle.

FIG. 9B is a diagram of an embodiment of a system 950 to illustrate vertical movement of the spider forms 908A and 908B with movement of the spindle 212. The system 950 includes the showerhead 108, the cleaning apparatus 802, the carrier ring 112, the pedestal 110A, the spindle 212, and the spider forks 908A and 908B.

The carrier ring 112 has a top surface 952A, a side surface portion 952B, a bottom surface 952C, and another side surface portion, which is not shown in FIG. 9B. As an example, the carrier ring 112 has a circular cross-section, as viewed in the z-direction, and the carrier ring 112 has one circular side surface that has the side surface portions including the side surface portion 952B.

The top surface 952A is perpendicular or substantially perpendicular to the side surface portions of the carrier ring 112. For example, the top surface 952A forms an angle that is within a pre-determined range, such as ±5-7 degrees, with respect to the side surface portions of the carrier ring 112. Similarly, the bottom surface 952C is perpendicular or substantially perpendicular to the side surface portions of the carrier ring 112. Also, the top surface 952A is parallel or substantially parallel to the bottom surface 952C.

The spider forks 908A and 908B extend to reach an edge of the pedestal 110A and are located between an edge of the carrier ring 112 and the edge of the pedestal 110A. For example, the spider forks 908A and 908B extend into a space between the edge portion 130B of the pedestal 110 and the bottom surface 952C of the carrier ring 112 to lift the carrier ring 112. On top of the carrier ring 112, the cleaning apparatus 802 is located. The bottom surface 810C of the press plate 806 abuts and rests on the top surface 952A of the carrier ring 112 to be supported by the carrier ring 112.

The host computer 102 controls the spindle 212 to raise the spider forks 908A and 908B in the vertical direction. When the spider forks 908A and 908B are raised, the carrier ring 112 is raised in the vertical direction. The carrier ring 112, when raised, raises the cleaning assembly 802 from the height H3 to the height H4. After cleaning the showerhead 108, the spindle 212 is controlled by the host computer 102 to be lowered in the vertical direction to lower the spider forks 908A and 908B in the vertical direction. When the spider forks 908A and 908B are lowered, the carrier ring 112 is lowered in the downward direction, along the z-axis, and with the lowering of the carrier ring 112, the cleaning assembly 802 is lowered to the height H3 from the height H4.

FIG. 10A is a diagram of an embodiment of a system 1000 to illustrate movement of the showerhead 108 towards the cleaning assembly 802 to clean the showerhead 108. The system 1000 includes the host computer 102, the showerhead 108, a driver 1002, a motor 1004, the cleaning assembly 802, and the pedestal 110A.

The host computer 102 is coupled to the driver 1002, which is coupled to the motor 1004. The motor 1004 is coupled via a connection mechanism 1006 to the showerhead 108. The host computer 102 generates and sends a vertical movement control signal to the driver 1002. The vertical movement control signal includes a direction, such as up or down, in which the showerhead 108 is to move along the z-axis and a pre-determined location to be reached by the showerhead 108 after the movement. Upon receiving the vertical movement control signal, the driver 1002 generates a vertical movement current signal, which is sent to the motor 1004. The motor 1004 receives the vertical movement current signal and rotates to move the connection mechanism 1006 to further move the showerhead 108, up or down, in the vertical direction until the pre-determined location is reached.

The host computer 102 controls the showerhead 108 to lower the showerhead 108 from a height H6 to a height H5. The height H6 is greater than the height H5 and is a height from the bottom surface 604C of the showerhead 108 to the bottom surface 602C of the pedestal 110A. As an example, the height H6 is the same as the height H4 (FIG. 9B). Also, the height H5 is a height from the bottom surface 604C of the showerhead 108 to the bottom surface 602C of the pedestal 110A. As an example, at the height H5, the cleaning assembly 802 is placed on and supported by the carrier ring 112. As another example, the height H5 is the same as the height H3 (FIG. 9B).

When the showerhead 108 is at the height H5, the top surface 808A of the cleaning assembly 802 is proximate to, such as within a pre-determined distance from, or touching the bottom surface 604C of the showerhead 108 to clean the showerhead 108. For example, the electrostatic or Van der Waals forces are applied by the cleaning assembly 802, such as the cleaning layer 804, to the bottom surface 604C of the showerhead 108 to clean the showerhead 108. After cleaning the showerhead 108, the showerhead 108 is controlled by the host computer 102 to be raised in the vertical direction to the height H6 from the height H5.

In one embodiment, instead of the cleaning assembly 802, the cleaning assembly 220 (FIG. 6A) is used. The cleaning assembly 220 rests on the arm 404 (FIG. 6A) and the showerhead 108 is lowered from the height H6 to until a final height. At the final height, the showerhead 108 is a pre-set distance from the height H1 to clean the showerhead 108. An example of the pre-set distance is a distance, in the vertical direction, that is within 0.01-5% of the height HE When the showerhead 802 is at the pre-set distance from the height H1, the top surface 410A (FIG. 6A) of the cleaning assembly 220 is proximate to, such as within a pre-determined distance from, or touching the bottom surface 604C of the showerhead 108 to clean the showerhead 108. For example, the electrostatic or Van der Waals forces are applied by the cleaning layer 456 (FIG. 5B) to the showerhead 108 to clean the showerhead 108. After cleaning the showerhead 108, the showerhead 108 is controlled by the host computer 102 to be raised in the vertical direction to the height H6 from the pre-set distance from the height H1.

Figure 10B:
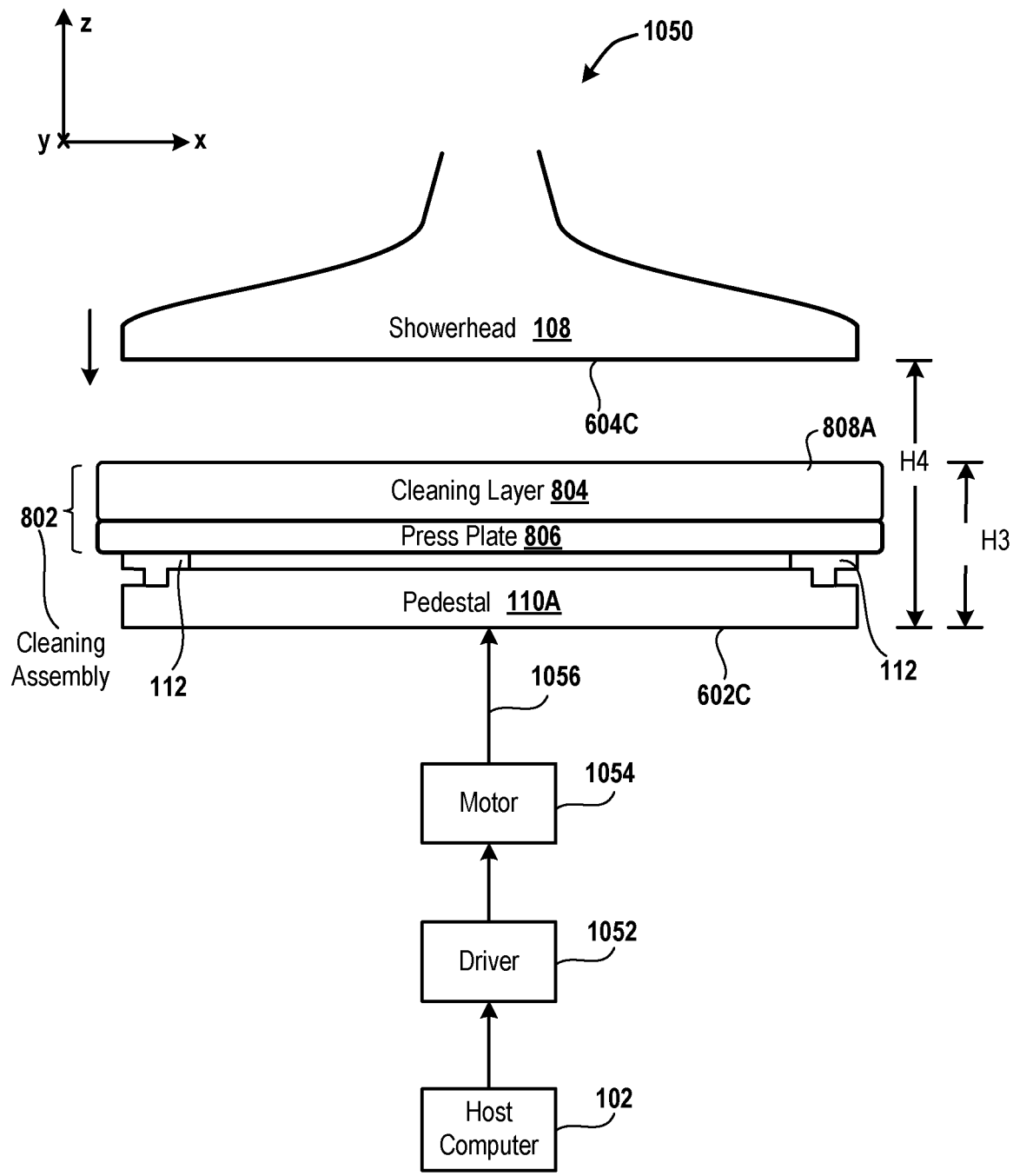
FIG. 10B is a diagram of an embodiment of a system to illustrate movement of a pedestal towards the showerhead to clean the showerhead.

FIG. 10B is a diagram of an embodiment of a system 1050 to illustrate movement of the pedestal 110A towards the showerhead 108 to clean the showerhead 108. The system 1050 includes the host computer 102, the showerhead 108, a driver 1052, a motor 1054, the cleaning assembly 802, and the pedestal 110A.

The host computer 102 is coupled to the driver 1052, which is coupled to the motor 1054. The motor 1054 is coupled via a connection mechanism 1056 to the pedestal 110A. The host computer 102 generates and sends a vertical movement control signal to the driver 1052. The vertical movement control signal includes a direction, such as up or down, in which the pedestal 110A is to move along the z-axis and a pre-determined location to be reached by the pedestal 110A after the movement. Upon receiving the vertical movement control signal, the driver 1052 generates a vertical movement current signal, which is sent to the motor 1054. The motor 1054 receives the vertical movement current signal and rotates to move the connection mechanism 1056 to further move the pedestal 110A, up or down, in the vertical direction until the pre-determined location is reached. The cleaning assembly 802 that is resting on the carrier ring 112 lifts with an upward movement of the pedestal 110A to come on contact with or be proximate to the bottom surface 604C of the showerhead 108.

The host computer 102 controls the pedestal 110A to lift the pedestal 110A to raise the cleaning assembly 802 is lifted from the height H3 to the height H4. When the cleaning assembly 802 is at the height H4, the top surface 808A of the cleaning assembly 802 is proximate to, such as within a pre-determined distance from, or touching the bottom surface 604C of the showerhead 108 to clean the showerhead 108. For example, the electrostatic or Van der Waals forces are applied by the cleaning assembly 802, such as the cleaning layer 804, to the showerhead 108 to clean the showerhead 108. After cleaning the showerhead 108, the pedestal 110A is controlled by the host computer 102 to lower the cleaning assembly 802 downward, along the z-axis, to the height H3 from the height H4.

Figure 11A:
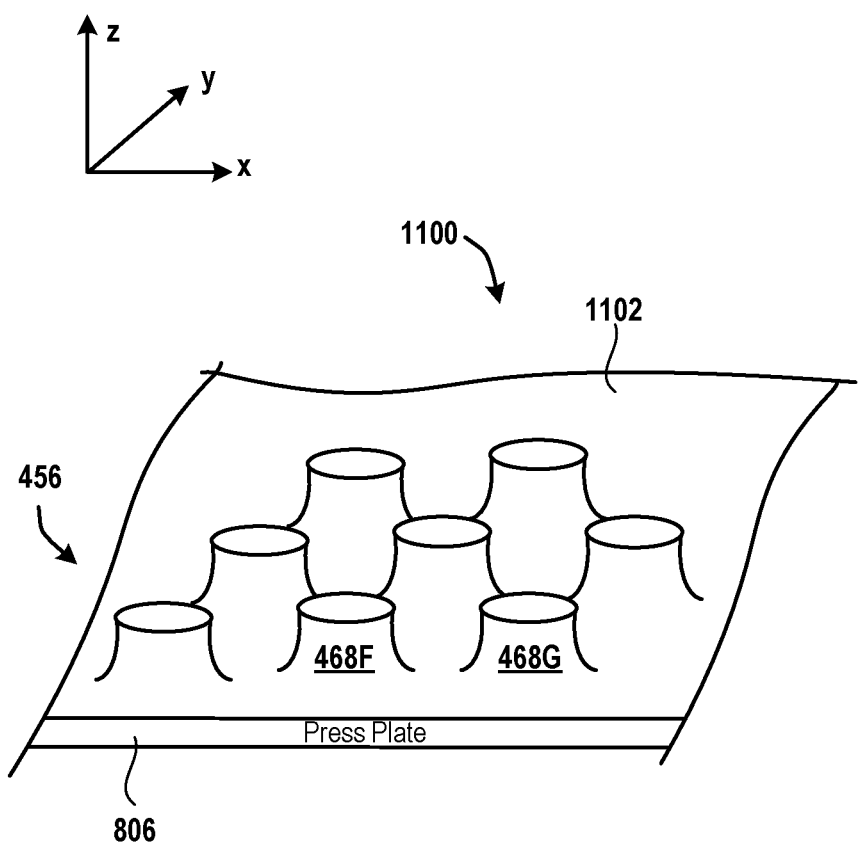
FIG. 11A is an isometric view of an embodiment of a cleaning assembly.

FIG. 11A is an isometric view of an embodiment of a cleaning assembly 1100. The cleaning assembly 1110 includes the cleaning layer 456 and the press plate 806. The cleaning layer 456 is attached to, such as chemically bonded to or glued to, the press plate 806. The cleaning layer 456 has multiple pillars, including the pillars 468F and 468G, and is on top of the press plate 806. Pillars are sometimes referred to herein as micro-structures. The pillars of the cleaning layer 456 extend from the flat layer 1102 of the cleaning layer 456 in the z-direction. An example of the flat layer 1102 is a polymeric pad, such as a pad made from fluoropolymer or polyimide or a combination thereof. The pillars of the cleaning layer 456 are made from the same material as that of the flat layer 1102. The flat layer 1102 has a flat surface that lies in the xy-plane. The cleaning layer 456 includes the flat layer 1102 and the pillars.

FIG. 11B is a side view of an embodiment of the cleaning assembly 1100. A diameter D of each of the pillars of the cleaning layer 456 is n times, such as 5-9 times, a diameter of each particle to be cleaned from the showerhead 108 (FIG. 1). The pillars of the cleaning layer 456 move in a direction along the x-axis when proximate to or in contact with the showerhead 108 to clean the showerhead 108. The flat layer 1102 has a thickness T, in the z-direction, which is measured from the press plate 806.

Each of the pillars of the cleaning layer 456 has a length, measured along the z-axis. As an example, the length of each of the pillars of the cleaning layer 456 is greater than the thickness T of the flat layer 1102. As another example, the length of each of the pillars of the cleaning layer 456 is less than the thickness T of the flat layer 1102.

In one embodiment, a diameter of one or more pillars of the cleaning layer 456 is different from a diameter of one or more of remaining pillars of the cleaning layer 456.

In an embodiment, a length of one or more pillars of the cleaning layer 456 is different from a length of one or more of remaining pillars of the cleaning layer 456.

FIG. 12A is a side view of an embodiment of a set of pillars of a cleaning layer 1202. The cleaning layer 1202 is used instead of the cleaning layer 456 (FIG. 11A). For example, the cleaning layer 1202 is attached to the press plate 806 (FIG. 11B). The cleaning layer 1202 includes the pillars that are of alternating heights. For example, a pillar 1204A of the cleaning layer 1202 is shorter than another pillar 1204B of the cleaning layer 1202. The pillar 1204B is adjacent to the pillar 1204A and there is no other pillar between the two pillars 1204A and 1204B. As another example, a pillar 1204C of the cleaning layer 1202 is shorter than another pillar 1204D of the cleaning layer 1202. The pillar 1204C is adjacent to the pillar 1204B and there is no other pillar between the two pillars 1204B and 1204C. Similarly, pillar 1204D is adjacent to the pillar 1204C and there is no other pillar between the two pillars 1204C and 1204D. The set of pillars of the cleaning layer 1202 extend from the flat layer 1102 of the cleaning layer 1202.

The alternating-height pattern illustrated in FIG. 12A repeats in a y-direction along the y-axis. For example, multiple sets of pillars having the same pattern as that of the set of pillars illustrated in FIG. 12A extend along the y-axis from the flat layer 1102 of the cleaning layer 1202.

Also, between any two adjacent pillars of the cleaning layer 1202, there is a portion of the flat layer 1102. In one embodiment, a density of the pillars of the cleaning layer 1202 on the flat layer 1102 is different from that illustrated in FIG. 12A. For example, the distance between any two adjacent pillars of the cleaning layer 1202 is greater or less than that illustrated in FIG. 12A.

FIG. 12B is a side view of an embodiment of a set of pillars of a cleaning layer 1206. The cleaning layer 1206 is used instead of the cleaning layer 456 (FIG. 11A). For example, the cleaning layer 1206 is attached to the press plate 806 (FIG. 11B). The cleaning layer 1206 includes the pillars that are of alternating heights and two shorter pillars are followed by one tall pillar. For example, pillars 1208A and 1208B of the cleaning layer 1206 are shorter than another pillar 1208C of the cleaning layer 1206. The pillar 1208B is adjacent to the pillar 1208A and there is no other pillar between the two pillars 1208A and 1208B. Also, the pillar 1208C is adjacent to the pillar 1208B and there is no other pillar between the two pillars 1208B and 1208C. As another example, pillars 1208D and 1208E of the cleaning layer 1206 are shorter than another pillar 1208F of the cleaning layer 1206. The pillar 1208D is adjacent to the pillar 1208C and there is no other pillar between the two pillars 1208C and 1208D. Similarly, the pillar 1208E is adjacent to the pillar 1208D and there is no other pillar between the two pillars 1208D and 1208E, the pillar 1208F is adjacent to the pillar 1208E and there is no other pillar between the two pillars 1208E and 1208F. The set of pillars of the cleaning layer 1206 extend from the flat layer 1102 of the cleaning layer 1202.

The alternating-height pattern illustrated in FIG. 12B repeats in the y-direction. For example, multiple sets of pillars having the same pattern as that of the set of pillars illustrated in FIG. 12B extend along the y-axis from the flat layer 1102 of the cleaning layer 1202.

Also, between any two adjacent pillars of the cleaning layer 1206, there is a portion of the flat layer 1102. In one embodiment, a density of the pillars of the cleaning layer 1206 on the flat layer 1102 is different from that illustrated in FIG. 12B. For example, the distance between any two adjacent pillars of the cleaning layer 1206 is greater or less than that illustrated in FIG. 12B.

FIG. 12C is a side view of an embodiment of a set of pillars of a cleaning layer 1210. The cleaning layer 1210 is used instead of the cleaning layer 456 (FIG. 11A). For example, the cleaning layer 1210 is attached to the press plate 806 (FIG. 11B). The cleaning layer 1210 includes the pillars that are of alternating heights and two taller pillars are followed by one short pillar. For example, pillars 1212A and 1212B of the cleaning layer 1210 are longer than another pillar 1212C of the cleaning layer 1210. The pillar 1212B is adjacent to the pillar 1212A and there is no other pillar between the two pillars 1212A and 1212B. Also, the pillar 1212C is adjacent to the pillar 1212B and there is no other pillar between the two pillars 1212B and 1212C. As another example, pillars 1212D and 1212E of the cleaning layer 1210 are taller than another pillar 1212F of the cleaning layer 1210. The pillar 1212D is adjacent to the pillar 1212C and there is no other pillar between the two pillars 1212C and 1212D. Similarly, the pillar 1212E is adjacent to the pillar 1212D and there is no other pillar between the two pillars 1212D and 1212E, the pillar 1212F is adjacent to the pillar 1212E and there is no other pillar between the two pillars 1212E and 1212F. The set of pillars of the cleaning layer 1210 extend from the flat layer 1102 of the cleaning layer 1210.

The alternating-height pattern illustrated in FIG. 12C repeats in the y-direction. For example, multiple sets of pillars having the same pattern as that of the set of pillars illustrated in FIG. 12C extend along the y-axis from the flat layer 1102 of the cleaning layer 1210.

Also, between any two adjacent pillars of the cleaning layer 1210, there is a portion of the flat layer 1102. In one embodiment, a density of the pillars of the cleaning layer 1210 on the flat layer 1102 is different from that illustrated in FIG. 12C. For example, the distance between any two adjacent pillars of the cleaning layer 1210 is greater or less than that illustrated in FIG. 12C.

FIG. 12D is a side view of an embodiment of a set of pillars of a cleaning layer 1214. The cleaning layer 1214 is used instead of the cleaning layer 456 (FIG. 11A). For example, the cleaning layer 1214 is attached to the press plate 806 (FIG. 11B). The cleaning layer 1214 includes the pillars that are of alternating heights and two longer or taller pillars are followed by two short pillars. For example, pillars 1216A and 1216B of the cleaning layer 1214 are shorter than pillars 1216C and 1216D of the cleaning layer 1214. The pillar 1216B is adjacent to the pillar 1216A and there is no other pillar between the two pillars 1216A and 1216B. Also, the pillar 1216C is adjacent to the pillar 1216B and there is no other pillar between the two pillars 1216B and 1216C and the pillar 1216D is adjacent to the pillar 1216C and there is no other pillar between the two pillars 1216C and 1216D. As another example, pillars 1212E and 1212F of the cleaning layer 1210 are shorter than pillars 1216G and 1216H of the cleaning layer 1214. The pillar 1216E is adjacent to the pillar 1216D and there is no other pillar between the two pillars 1216D and 1216E. Similarly, the pillar 1216F is adjacent to the pillar 1216E, the pillar 1216G is adjacent to the pillar 1212F, and the pillar 1216H is adjacent to the pillar 1216G. The set of pillars of the cleaning layer 1214 extend from the flat layer 1102 of the cleaning layer 1214.

The alternating-height pattern illustrated in FIG. 12D repeats in the y-direction. For example, multiple sets of pillars having the same pattern as that of the set of pillars illustrated in FIG. 12D extend along the y-axis from the flat layer 1102 of the cleaning layer 1214.

Also, between any two adjacent pillars of the cleaning layer 1214, there is a portion of the flat layer 1102. In one embodiment, a density of the pillars of the cleaning layer 1214 on the flat layer 1102 is different from that illustrated in FIG. 12D. For example, the distance between any two adjacent pillars of the cleaning layer 1214 is greater or less than that illustrated in FIG. 12D.

FIG. 12E is a side view of an embodiment of a set of pillars of a cleaning layer 1218. The cleaning layer 1218 is used instead of the cleaning layer 456 (FIG. 11A). For example, the cleaning layer 1218 is attached to the press plate 806 (FIG. 11B). The cleaning layer 1218 includes the pillars that are of alternating heights as that illustrated in FIG. 12A and taller pillars of the cleaning layer 1218 are bent in one orientation. For example, a pillar 1220A of the cleaning layer 1218 is taller than another pillar 1220B of the cleaning layer 1218 and is bent in the x-direction. The pillar 1220B is adjacent to the pillar 1220A and there is no other pillar between the two pillars 1220A and 1220B. As another example, a pillar 1220C of the cleaning layer 1218 is taller than another pillar 1220D of the cleaning layer 1218 and is bent in the x-direction. The pillar 1220C is adjacent to the pillar 1220B and there is no other pillar between the two pillars 1220B and 1220C. Similarly, the pillar 1220D is adjacent to the pillar 1220C and there is no other pillar between the two pillars 1220C and 1220D. The set of pillars of the cleaning layer 1218 extend from the flat layer 1102 of the cleaning layer 1218.

The alternating-height pattern illustrated in FIG. 12E repeats in the y-direction. For example, multiple sets of pillars having the same pattern as that of the set of pillars illustrated in FIG. 12E extend along the y-axis from the flat layer 1102 of the cleaning layer 1218.

Also, between any two adjacent pillars of the cleaning layer 1218, there is a portion of the flat layer 1102. In one embodiment, a density of the pillars of the cleaning layer 1218 on the flat layer 1102 is different from that illustrated in FIG. 12E. For example, the distance between any two adjacent pillars of the cleaning layer 1218 is greater or less than that illustrated in FIG. 12E.

In one embodiment, the taller pillars of the cleaning layer 1218 have a different orientation than that illustrated in FIG. 12E. For example, the pillars 1220A and 1220C have tops, such as top surfaces, that are oriented to face in the y-direction instead of the x-direction. As another example, the pillars 1220A and 1220C have tops that are oriented to face in the x-direction but in a negative x-direction, such as facing left instead of right.

In an embodiment, one or more of the taller pillars of the cleaning layer 1218 have tops that are oriented to face in a different direction than one or more of remaining ones of the taller pillars. For example, the pillar 1220A is bent to have a top that is oriented to face the x-direction and the pillar 1220C is bent to have a top oriented to face the y-direction.

In an embodiment, the shorter pillars of the cleaning layer 1218 are bent in one or more directions, such as the x-direction, the y-direction, and the z-direction.

FIG. 12F is a side view of an embodiment of a set of pillars of a cleaning layer 1222. The cleaning layer 1222 is used instead of the cleaning layer 456 (FIG. 11A). For example, the cleaning layer 1222 is attached to the press plate 806 (FIG. 11B). The cleaning layer 1222 includes the pillars that are of alternating heights as that illustrated in FIG. 12A and taller pillars of the cleaning layer 1222 are bent in one orientation. Also, the taller pillars of the cleaning layer 1222 are thinner than the shorter pillars of the cleaning layer 1222. For example, a pillar 1224A of the cleaning layer 1222 is taller than another pillar 1224B of the cleaning layer 1222, is bent in the x-direction, and is thinner than the pillar 1224B. The pillar 1224B is adjacent to the pillar 1224A and there is no other pillar between the two pillars 1224A and 1224B. As another example, a pillar 1224C of the cleaning layer 1222 is taller than another pillar 1224D of the cleaning layer 1222, is bent in the x-direction, and is thinner than the pillar 1224D. The pillar 1224C is adjacent to the pillar 1224B and there is no other pillar between the two pillars 1224B and 1224C. Similarly, the pillar 1224D is adjacent to the pillar 1224C and there is no other pillar between the two pillars 1224C and 1224D. The set of pillars of the cleaning layer 1222 extend from the flat layer 1102 of the cleaning layer 1222.

The alternating-height pattern illustrated in FIG. 12F repeats in the y-direction. For example, multiple sets of pillars having the same pattern as that of the set of pillars illustrated in FIG. 12F extend along the y-axis from the flat layer 1102 of the cleaning layer 1222.

Also, between any two adjacent pillars of the cleaning layer 1222, there is a portion of the flat layer 1102. In one embodiment, a density of the pillars of the cleaning layer 1222 on the flat layer 1102 is different from that illustrated in FIG. 12F. For example, the distance between any two adjacent pillars of the cleaning layer 1222 is greater or less than that illustrated in FIG. 12F.

In one embodiment, the taller pillars of the cleaning layer 1222 have a different orientation than that illustrated in FIG. 12F. For example, the pillars 1224A and 1224C have tops, such as top surfaces, that are oriented to face in the y-direction instead of the x-direction. As another example, the pillars 1224A and 1224C have tops that are oriented to face in the x-direction but in the negative x-direction.

In an embodiment, one or more of the taller pillars of the cleaning layer 1222 have tops that are oriented to face in a different direction than one or more of remaining ones of the taller pillars. For example, the pillar 1224A is bent to have a top that is oriented to face the x-direction and the pillar 1224C is bent to have a top oriented to face the y-direction.

In an embodiment, the shorter pillars of the cleaning layer 1222 are bent in one or more directions, such as the x-direction, the y-direction, and the z-direction.

FIG. 12G is a side view of an embodiment of a set of pillars of a cleaning layer 1226. The cleaning layer 1226 is used instead of the cleaning layer 456 (FIG. 11A). For example, the cleaning layer 1226 is attached to the press plate 806 (FIG. 11B). The cleaning layer 1226 includes the pillars that are of alternating heights as that illustrated in FIG. 12A and taller pillars of the cleaning layer 1226 are bent in one orientation. Also, the taller pillars of the cleaning layer 1226 are thicker than the shorter pillars of the cleaning layer 1226. For example, a pillar 1228A of the cleaning layer 1226 is taller than another pillar 1228B of the cleaning layer 1226, is bent in the x-direction, and is thicker than the pillar 1228B. The pillar 1228B is adjacent to the pillar 1228A and there is no other pillar between the two pillars 1228A and 1228B. As another example, a pillar 1228C of the cleaning layer 1226 is taller than another pillar 1228D of the cleaning layer 1226, is bent in the x-direction, and is thicker than the pillar 1228D. The pillar 1228C is adjacent to the pillar 1228B and there is no other pillar between the two pillars 1228B and 1228C. Similarly, the pillar 1228D is adjacent to the pillar 1228C and there is no other pillar between the two pillars 1228C and 1228D. The set of pillars of the cleaning layer 1226 extend from the flat layer 1102 of the cleaning layer 1226.

The alternating-height pattern illustrated in FIG. 12G repeats in the y-direction. For example, multiple sets of pillars having the same pattern as that of the set of pillars illustrated in FIG. 12G extend along the y-axis from the flat layer 1102 of the cleaning layer 1226.

Also, between any two adjacent pillars of the cleaning layer 1226, there is a portion of the flat layer 1102. In one embodiment, a density of the pillars of the cleaning layer 1226 on the flat layer 1102 is different from that illustrated in FIG. 12G. For example, the distance between any two adjacent pillars of the cleaning layer 1226 is greater or less than that illustrated in FIG. 12G.

In one embodiment, the taller pillars of the cleaning layer 1226 have a different orientation than that illustrated in FIG. 12G. For example, the pillars 1228A and 1228C have tops, such as top surfaces, that are oriented to face in the y-direction instead of the x-direction. As another example, the pillars 1228A and 1228C have tops that are oriented to face in the x-direction but in the negative x-direction.

In an embodiment, one or more of the taller pillars of the cleaning layer 1226 have tops that are oriented to face in a different direction than one or more of remaining ones of the taller pillars. For example, the pillar 1228A is bent to have a top that is oriented to face the x-direction and the pillar 1228C is bent to have a top oriented to face the y-direction.

In an embodiment, the shorter pillars of the cleaning layer 1226 are bent in one or more directions, such as the x-direction, the y-direction, and the z-direction.

FIG. 12H is a side view of an embodiment of the cleaning layer 1214 to illustrate deflection of pillars of the cleaning layer 1214. When the pillars 1216C and 1216D come in contact with the bottom surface 604C of the showerhead 108, the pillars 1216C and 1216D deflect, such as bend, in the x-direction, to clean the showerhead 108. Moreover, when the pillars 1216C and 1216D contact the bottom surface 604C, the pillars 1216A and 1216B do not contact the showerhead 108 but apply electrostatic forces to attract the particles from the bottom surface 604C.

FIG. 12I is a detailed side view of the pillar 1216C that is in contact with the bottom surface 604C of the showerhead 108. When the pillar 1216C is raised in the vertical direction to contact the bottom surface 604C and is in contact with the showerhead 108, a force F1 is applied by the pillar 1216C in the vertical direction to clean the showerhead 108. Moreover, when the spindle 212 (FIG. 3) rotates around the axis 216 (FIG. 3) or the rotational section 408 rotates (FIG. 4A) around the axis 413 (FIG. 4A) or both the spindle 212 and the rotational section 408 rotate simultaneously around the respective axes 216 and 413, a horizontal force, in the x-direction and the y-direction, is applied by the cleaning layer 1214 to remove the particles that adhere to the bottom surface 604C of the showerhead 108. The particles, such as some of the particles 606A (FIG. 6A), travel down a side surface 1262 of the pillar 1216C to the flat layer 1102 so that a top surface 1223 of the pillar 1216C can continue to apply the electrostatic forces to clean the showerhead 108. The particles travel down towards the flat layer 1102 between any two adjacent pillars. The particles are sometimes referred to herein as contaminants or particulates. An example of the particles includes particles of a powdery substance. Moreover, the terms travel down, migrate, and traverse down are used herein interchangeably.

In a similar manner, the particles travel down side surfaces of the pillars 1216A and 1216B (FIG. 12H) to the flat layer 1102 when the pillars 1216A and 1216B are proximate to but not in contact with the bottom surface 604C of the showerhead 108. The pillars 1216A and 1216B attract the particles by electrostatic or Van der Waals forces.

Figure 13B:
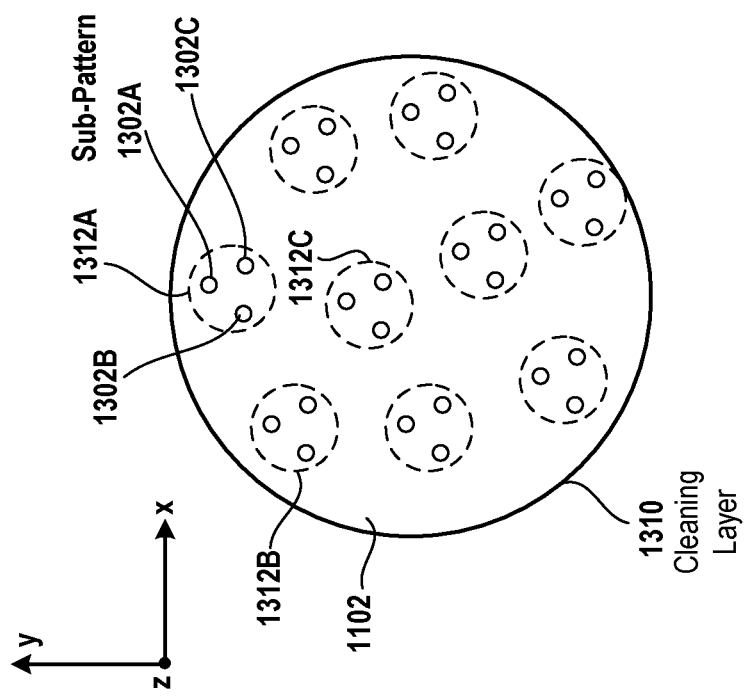
FIG. 13B is a top view of an embodiment of a cleaning layer to illustrate a sub-pattern of pillars of a cleaning assembly.
Figure 13A:
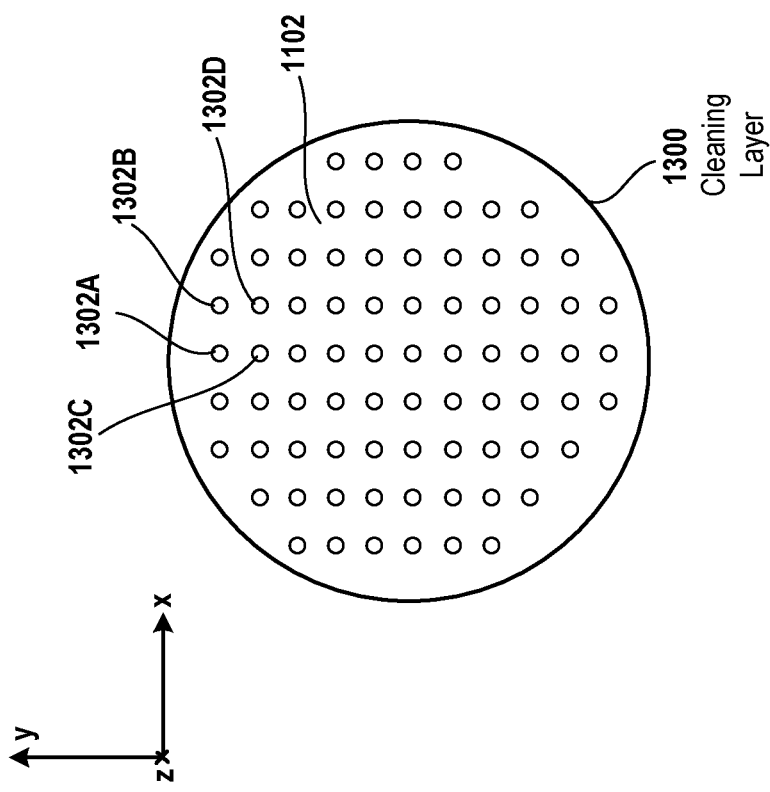
FIG. 13A is a top view of an embodiment of a cleaning layer to illustrate a grid pattern of pillars of a cleaning assembly.

FIG. 13A is a top view of an embodiment of a cleaning layer 1300 to illustrate a grid pattern. The cleaning layer 1300 includes a matrix of pillars, such as pillars 1302A, 1302B, 1302C, and 1302D, which are arranged in a square pattern. For example, the pillars 1302A-1302D are vertices of a square. The cleaning layer 1300 is an example of the cleaning layer 456 (FIG. 4C), and the cleaning layer 804 (FIG. 8).

In one embodiment, the pillars of the cleaning layer 1300 are arranged in a more or less dense manner than that illustrate in FIG. 13A.

FIG. 13B is a top view of an embodiment of a cleaning layer 1310 to illustrate a sub-pattern of pillars. The cleaning layer 1310 has an arrangement of sub-patterns, such as sub-patterns 1312A, 1312B, and 1312C, and each sub-pattern has multiple pillars. For example, the sub-pattern 1312A has pillars the 1302A, 1302B, and 1302C that are arranged in a triangular pattern. To illustrate, the pillars 1302A-1302C are vertices of a triangle formed within the sub-pattern 1312A.

The sub-patterns of the cleaning layer 1310 are arranged in a triangular pattern. For example, the sub-patterns 1312A, 1312B, and 1312C form vertices of a triangle. The cleaning layer 1310 is an example of the cleaning layer 456 (FIG. 4C), and the cleaning layer 804 (FIG. 8).

In one embodiment, instead of the triangular pattern, the sub-patterns of the cleaning layer 1310 are arranged in another pattern, such as a square pattern or a rectangular pattern or a polygonal pattern or an oval pattern or a round pattern.

In an embodiment, multiple types of patterns, such as the square and triangular patterns, are formed by the sub-patterns of the cleaning layer 1310.

In one embodiment, in instead of three pillars, a sub-pattern of the cleaning layer 1310 includes any other number of pillars, such a four or five pillars.

In an embodiment, instead of a triangular pattern formed by pillars of a sub-pattern of the cleaning layer 1310, another type of pattern, such as a square pattern or a round pattern or an oval pattern or a polygonal pattern, is formed.

In one embodiment, the pillars of the cleaning layer 1310 are arranged in a more or less dense manner than that illustrate in FIG. 13B.

Figure 13C:
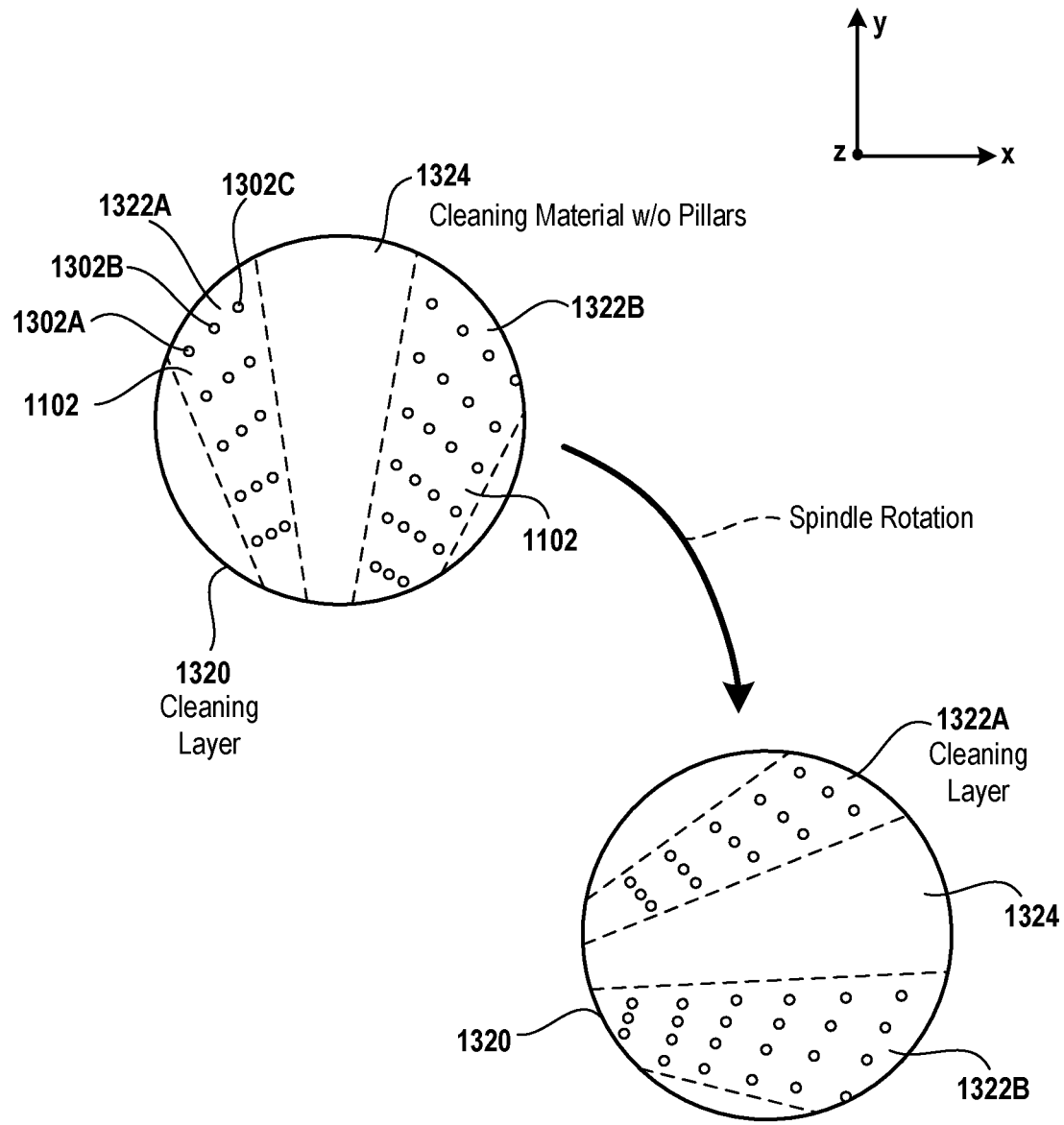
FIG. 13C is a top view of an embodiment of a cleaning layer to illustrate that the cleaning layer is distributed into pillar sections and non-pillar sections.

FIG. 13C is a top view of an embodiment of a cleaning layer 1302 to illustrate that the cleaning layer 1302 is distributed into pillar sections and non-pillar sections. The cleaning layer 1302 includes a pillar section 1322A and another pillar section 1322B. The cleaning layer 1302 further includes a non-pillar section 1324. The non-pillar section 1324 is between the pillar section 1322A and the pillar section 1322B to separate the pillar section 1322A from the pillar section 1322B.

The non-pillar section 1324 is flat and does not include any pillars. For example, the non-pillar section 1324 is a portion of the flat layer 1102 and has no pillars emanating from the portion.

The pillar section 1322A has multiple pillars, such as the pillars 1302A, 1302B, and 1302C. As an example, the pillars 1302A-1302C are arranged in a linear pattern. To illustrate, the pillars 1302A-1302C forms points on a line.

An array of multiple lines of pillars is formed within the pillar sections 1322A and 1322B. For example, a first line is formed by the pillars 1302A-1302C, a second line is formed by another set of pillars of the cleaning layer 1320, and a third line is formed by yet another set of pillars of the cleaning layer 1302. The second line is adjacent to the first line and to the third line and is between the first and third lines. The cleaning layer 1320 is an example of the cleaning layer 456 (FIG. 4C), and the cleaning layer 804 (FIG. 8). Also illustrated in FIG. 13C is a rotation of the cleaning layer 1320 with a rotation of the spindle 212 (FIG. 2) with respect to the axis 216 (FIG. 2).

In one embodiment, the pillars 1302A-1302C are arranged in a curved pattern to form points on a curve.

In an embodiment, any other type of pattern, such as triangular pattern or a polygonal pattern, is formed by the pillars of the cleaning layer 1320.

In one embodiment, instead of two pillar sections, the cleaning layer 1320 includes any other number of pillar sections, such as three or four pillar sections. Each pillar section is separated from an adjacent pillar section by a non-pillar section, such as the non-pillar section 1324.

FIG. 14A is a side view of an embodiment of a dome-top pillar 1402. The dome-top pillar 1402 has a dome-section 1404A and a flat-top section 1404B. The dome-section 1404A forms a dome on top of the flat-top section 1404B. The dome-section 1404A is convex shaped in an upward direction, along the z-axis. A width, along the x-axis, of the dome-section 1404A is the same or substantially the same as a width of the flat-top section 1404B. For example, a diameter of the dome-section 1404A is the same or substantially the same as a diameter of the flat-top section 1404B. To illustrate, the width of the dome-section 1404A is within a pre-set range, such as ±5%, from the width of the flat-top section 1404B.

Each pillar of the cleaning layer 456 (FIG. 4C) can have the dome-section 1404A instead of a flat-top. Similarly, each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300 (FIG. 13A), the cleaning layer 1310 (FIG. 13B), and the cleaning layer 1320 (FIG. 13C) can have the dome-section 1404A.

In one embodiment, the dome-top pillar 1402 has a circular cross-section in the xy-plane.

In an embodiment, the dome-top pillar 1402 has a polygonal cross-section in the xy-plane or an oval cross-section in the xy-plane.

FIG. 14B is a side view of an embodiment of a mushroom-shaped pillar 1406. The mushroom-shaped pillar 1406 has a dome-section 1408 and the flat-top section 1404B. The dome-section 1408 forms a dome on top of the flat-top section 1404B. The dome-section 1408 is convex shaped in the upward direction. A width, along the x-axis, of the dome-section 1408 is substantially greater than a width of the flat-top section 1404B. For example, a diameter of the dome-section 1408 is 110% of the diameter of the flat-top section 1404B. To illustrate, the width of the dome-section 1408 is greater by at least 10% compared to the width of the flat-top section 1404B.

Each pillar of the cleaning layer 456 (FIG. 4C) can have the dome-section 1408 instead of a flat-top. Similarly, each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300 (FIG. 13A), the cleaning layer 1310 (FIG. 13B), and the cleaning layer 1320 (FIG. 13C) can have the dome-section 1408.

In one embodiment, the flat-top section 1404B has a circular cross-section in the xy-plane.

In an embodiment, the flat-top section 1404B has a polygonal cross-section in the xy-plane or an oval cross-section in the xy-plane.

FIG. 14C is a side view of an embodiment of a cone-shaped pillar 1410. The cone-shaped pillar 1410 has a cross-section of a cone as viewed in the y-direction. As an example, a largest diameter of a top portion 1412A of the cone-shaped pillar 1410 is less than a largest diameter of a bottom portion 1412B of the cone-shaped pillar 1410. The top portion 1412A is on top of the bottom portion 1412B.

Each pillar of the cleaning layer 456 (FIG. 4C) can be the cone-shaped pillar 1410. Similarly, each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300 (FIG. 13A), the cleaning layer 1310 (FIG. 13B), and the cleaning layer 1320 (FIG. 13C) can be the cone-shaped pillar 1410.

In one embodiment, the cone-shaped pillar 1410 has a circular cross-section in the xy-plane.

In an embodiment, the cone-shaped pillar 1410 has a polygonal cross-section in the xy-plane or an oval cross-section in the xy-plane.

FIG. 14D is a side view of an embodiment of a flat-top pillar 468F. The flat-top pillar 468F has a substantially uniform width along the x-axis. For example, the width of the flat-top pillar 468F is within a pre-determined range, such as ±5%, from a fixed width.

Each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300 (FIG. 13A), the cleaning layer 1310 (FIG. 13B), and the cleaning layer 1320 (FIG. 13C) can be the flat-top pillar 468F.

In one embodiment, the flat-top pillar 468F has a circular cross-section in the xy-plane.

In an embodiment, the flat-top pillar 468F has a polygonal cross-section in the xy-plane or an oval cross-section in the xy-plane.

FIG. 14E is a side view of an embodiment of a recessive-top pillar 1414. The recessive-top pillar 1414 has a recessive-section 1416 and the flat-top section 1404B. The recessive-top pillar 1414 forms a recession on top of the flat-top section 1404B. The recessive-section 1416 is concave shaped in a downward direction, along the z-axis. A width, along the x-axis, of the recessive-section 1416 is the same or substantially the same as a width of the flat-top section 1404B. For example, a diameter of the recessive-section 1416 is the same or substantially the same as a diameter of the flat-top section 1404B. To illustrate, the width of the recessive-section 1416 is within the pre-set range, such as ±5%, from the width of the flat-top section 1404B.

Each pillar of the cleaning layer 456 (FIG. 4C) can have the recessive-section 1416 instead of a flat-top. For example, each pillar of the cleaning layer 456 has the recessive-section 1416 on top of the flat-top section 1404B. Similarly, each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300

(FIG. 13A), the cleaning layer 1310 (FIG. 13B), and the cleaning layer 1320 (FIG. 13C) can have the recessive-section 1416.

In one embodiment, the recessive-top pillar 1414 has a circular cross-section in the xy-plane.

In an embodiment, the recessive-top pillar 1414 has a polygonal cross-section in the xy-plane or an oval cross-section in the xy-plane.

FIG. 14F is a side view of an embodiment of a multi-surface top pillar 1418. The multi-surface top pillar 1418 has a top section 1426 and the flat-top section 1404B. The top section 1426 is on top of the flat-top section 1404B. The top section 1426 has multiple top surfaces 1422 and 1424. The top surface 1424 is a step down from the top surface 1422. Each top surface 1422 and 1424 has a flat top.

Each pillar of the cleaning layer 456 (FIG. 4C) can be the multi-surface top pillar 1418. Similarly, each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300 (FIG. 13A), the cleaning layer 1310 (FIG. 13B), and the cleaning layer 1320 (FIG. 13C) can have the flat-top section 1404B.

In one embodiment, the multi-surface top pillar 1418 has a circular cross-section in the xy-plane.

In an embodiment, the multi-surface top pillar 1418 has a polygonal cross-section in the xy-plane or an oval cross-section in the xy-plane.

FIG. 14G is a side view of an embodiment of a slotted-top pillar 1430. The slotted-top pillar 1430 has a top section 1432 and the flat-top section 1404B. The top section 1432 is on top of the flat-top section 1404B. The top section 1432 has a slot 1436, such as a recession, formed within a top surface 1434, of the slotted-top pillar 1430.

Each pillar of the cleaning layer 456 (FIG. 4C) can be the slotted-top pillar 1430. Similarly, each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300 (FIG. 13A), the cleaning layer 1310 (FIG. 13B), and the cleaning layer 1320 (FIG. 13C) can have the top section 1432.

In one embodiment, the slotted-top pillar 1430 has a circular cross-section in the xy-plane.

In an embodiment, the slotted-top pillar 1430 has a polygonal cross-section in the xy-plane or an oval cross-section in the xy-plane.

FIG. 14H is a side view of an embodiment of a protrusion-top pillar 1440. The protrusion-top pillar 1440 has a top section 1442 and the flat-top section 1404B. The top section 1442 is on top of the flat-top section 1404B. The top section 1442 has multiple protrusions 1446A, 1446B, and 1446C formed on a top surface 1444, of the protrusion-top pillar 1440. The protrusions 1446A-1446C protrude or extend from the top surface 1444 in the upward direction.

Each pillar of the cleaning layer 456 (FIG. 4C) can be the protrusion-top pillar 1440. Similarly, each pillar of the cleaning layer 1202 (FIG. 12A), the cleaning layer 1206 (FIG. 12B), the cleaning layer 1210 (FIG. 12C), the cleaning layer 1214 (FIG. 12D), the cleaning layer 1218 (FIG. 12E), the cleaning layer 1222 (FIG. 12F), the cleaning layer 1226 (FIG. 12G), the cleaning layer 1300 (FIG. 13A), the cleaning layer 1310 (FIG. 13B), and the cleaning layer 1320 (FIG. 13C) can have the top section 1442.

In one embodiment, the protrusion-top pillar 1440 has a circular cross-section in the xy-plane.

In an embodiment, the protrusion-top pillar 1440 has a polygonal cross-section in the xy-plane or an oval cross-section in the xy-plane.

FIG. 15A is a graph 1502 of an embodiment of a motion of the cleaning assembly 220 (FIG. 2). The graph 1502 plots a vertical distance traveled up or down by the cleaning assembly 220 along the z-axis versus a horizontal curved distance traveled by the cleaning assembly 220. The horizontal curved distance is plotted on a horizontal distance axis and the vertical distance is plotted on a vertical distance axis.

It should be noted that the horizontal curved distance is a curve-shaped distance, in the form of an arc, traversed by the cleaning assembly 220 in the xy-plane. The arc is formed with respect to or from the axis 216 of the spindle 212 (FIG. 2). The spindle 212 rotates with respect to the axis 216 (FIG. 2) of the spindle 212 to move the cleaning assembly 220 along the horizontal distance axis.

The cleaning assembly 220 starts at a location hd1 on the horizontal distance axis and travels upwards in the vertical direction until the cleaning assembly 220 contacts or is proximate to the showerhead 108 (FIG. 1). For example, the cleaning assembly 220 travels from a distance D1, such as the height H1 (FIG. 6A) to a distance D2, such as the height H2 (FIG. 6B). Once the cleaning assembly 220 is in contact with or proximate to the showerhead 108, the cleaning assembly 220 is moved with the rotation of the spindle 212 to clean the showerhead 108. When the cleaning assembly 220 reaches a location hd2 on the horizontal distance axis from the location hd1, the cleaning assembly 220 travels downwards in the vertical direction to remove the contact and the proximity with the showerhead 108. For example, when the cleaning assembly 220 is at the location hd2, the cleaning assembly 220 and travels downwards from the height H2 to the height H1.

In one embodiment, with the movement of the cleaning assembly 220 along the horizontal distance axis with respect to one axis, the cleaning assembly 220 rotates with respect to another axis. For example, the rotational section 408 rotates with respect to the axis 413 (FIG. 4A) to rotate the cleaning assembly 220 simultaneous with the rotation of the spindle 212 with respect to the axis 216.

FIG. 15B is a graph 1504 of an embodiment of a motion of the cleaning assembly 220 (FIG. 2). The graph 1504 plots the vertical distance traveled by the cleaning assembly 220 along the z-axis versus the horizontal curved distance traveled by the cleaning assembly 220.

The cleaning assembly 220 starts at the location hd1 on the horizontal distance axis and travels upwards in the vertical direction until the cleaning assembly 220 contacts or is proximate to the showerhead 108 (FIG. 1). For example, the cleaning assembly 220 travels from the distance D1, such as the height H1 (FIG. 6A) to the distance D2, such as the height H2 (FIG. 6B). Once the cleaning assembly 220 is in contact with or proximate to the showerhead 108, the cleaning assembly 220 is moved with the rotation of the spindle 212 to clean the showerhead 108.

When the cleaning assembly 220 reaches a location hd21 on the horizontal distance axis from the location hd1, the cleaning assembly 220 travels downwards in the vertical direction to remove the contact and the proximity with the showerhead 108. For example, the cleaning assembly 220 reaches location hd21 and travels downwards from the height H2 to an intermediate height between the heights H1 and H2.

When the cleaning assembly 220 is at the intermediate height between the heights H1 and H2 and is at the location hd21, the cleaning assembly 220 travels along the horizontal curved distance with the rotation of the spindle 212 to reach a location hd31 on the horizontal curved axis. At the intermediate height between the heights H1 and H2, the cleaning assembly 220 is not in proximity to the showerhead 108 and not in contact with the showerhead 108. There is no cleaning of the showerhead 108 when the cleaning assembly 220 is at the intermediate height between the heights H1 and H2.

From the location hd31, the cleaning assembly 220 travels upwards in the vertical direction until the cleaning assembly 220 contacts or is proximate to the showerhead 108 (FIG. 1). For example, the cleaning assembly 220 travels from the intermediate height between the heights H1 and H2 to the height H2, the cleaning assembly 220.

When the cleaning assembly 220 is at the height H2 and is at the location hd31, the cleaning assembly 220 travels along the horizontal curved distance with the rotation of the spindle 212 to reach the location hd2 on the horizontal curved axis to clean the showerhead 108. Upon reaching the location hd2, the cleaning assembly 220 travels downwards in the vertical direction to remove the contact and the proximity with the showerhead 108. For example, the cleaning assembly 220 reaches location hd2 and travels downwards from the height H2 to the height H1.

It should be noted that a contact of the cleaning assembly 220 with the bottom surface 604C of the showerhead 108 in a manner illustrated in the graph 1504 is sometimes referred to herein as a periodic contact. For example, between the locations hd1 and hd21, the cleaning assembly 220 is in contact with the bottom surface 604 and slides along the x-axis in a horizontal direction. Between the locations hd21 and hd31, the cleaning assembly 220 is not in contact with the bottom surface 604. Then again, between the locations hd31 and hd2, the cleaning assembly 220 is in contact with the bottom surface 604 and slides along the x-axis. The sliding movement applies a force on the particles to remove the particles from the bottom surface 604 (FIG. 6A) of the showerhead 108. The periodic contact occurs for two time periods. A first one of the time periods occurs when the cleaning assembly 220 is between the locations hd1 and hd21, and a second one of the time periods occurs when the cleaning assembly 220 is between the locations hd31 and hd2. As such, the contact of the cleaning assembly 220 with the bottom surface 604 repeats periodically.

In one embodiment, when the cleaning assembly 220 reaches the location hd21 from the location hd1 on the horizontal distance axis, the cleaning assembly 220 travels downwards in the vertical direction to remove the contact but not the proximity with the showerhead 108.

In an embodiment, the up and down movement, such as at the locations hd1, hd21, hd31, and hd2, is repeated many times to clean the showerhead 108 for more than the two time periods described above.

FIG. 15C is a graph 1506 of an embodiment of a motion of the cleaning assembly 220 (FIG. 2). The graph 1506 plots the vertical distance traveled by the cleaning assembly 220 along the z-axis versus the horizontal curved distance traveled by the cleaning assembly 220. The graph 1506 is the same as the graph 1502 (FIG. 15A) except in the graph 1506, when the cleaning assembly 1506 is at the distance D2, such as the height H2 (FIG. 6B), there is back and forth motion of the cleaning assembly 1056 along the arc.

The back and forth motion of the cleaning assembly 1056 is achieved by the back and forth motion of the spindle 212 (FIG. 2). For example, during a rotation of the spindle 212 with respect to the axis 216, the spindle 212 moves in the clockwise direction for a first time period tp1, moves in the counterclockwise direction for a second time period tp2, and repeats the clockwise and counterclockwise motions. The time period tp2 consecutively follows to the time period tp1. The clockwise and counterclockwise motions continue during a time period at which the cleaning assembly 220 is at the height H2 between the locations hd1 and hd2.

During the back and forth motion, the cleaning assembly 1056 is in contact with the bottom surface 604C (FIG. 6A) of the showerhead 108 or in proximity to the bottom surface 604C. When in contact, the cleaning assembly 1056 slides with respect to the bottom surface 604 along the x-axis to remove and/or attract off the particles from the bottom surface 604C. The particles are attracted off by the electrostatic forces.

FIG. 15D is a graph 1508 of an embodiment of a motion of the cleaning assembly 220 (FIG. 2). The graph 1508 plots the vertical distance traveled by the cleaning assembly 220 along the z-axis versus the horizontal curved distance traveled by the cleaning assembly 220. Once the cleaning assembly 220 (FIG. 2) reaches the distance D2, such as the height H2 (FIG. 6B), at the horizontal distance hd1, the rotational section 408 (FIG. 4A) rotates in the clockwise direction or counterclockwise direction or a combination of the clockwise and counterclockwise directions with respect to the axis 413 (FIG. 4A) and with respect to the elongated section 406 (FIG. 4A). The rotational section 408 rotates to clean the showerhead 408. After cleaning the showerhead 108, the cleaning assembly 220 is moved down in the vertical direction to have the distance D1, such as the height H1 (FIG. 6B), at the location hd1.

Figure 16A:
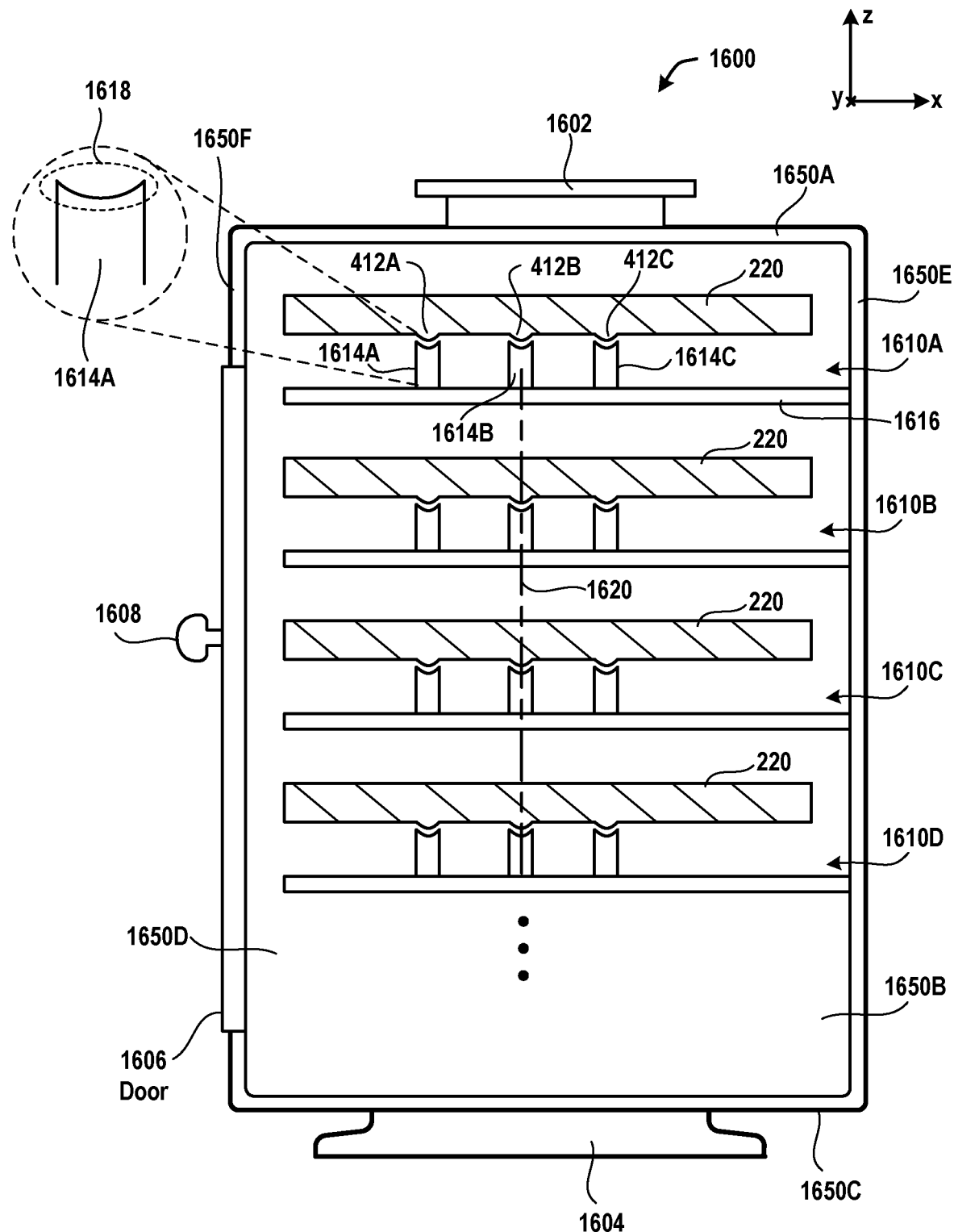
FIG. 16A is a side view of an embodiment of a Front End Opening Pod (FOUP).

FIG. 16A is a side view of an embodiment of a FOUP 1600. The FOUP 1600 includes a housing having a door 1606 and a back wall 1650E. The FOUP 1600 is an example of the pod 204A or the pod 204B (FIG. 2). The FOUP 1600 has a front wall 1650F, a top wall 1650A, and a bottom wall 1650C. The FOUP 1600 also has a right side wall 1650B and a left side wall 1650D. The back wall 1650E faces the door 1606 and the front wall 1650F, and the top wall 1650A faces the bottom wall 1650C. The door 1606 forms a part of the front wall 1650F, and is opened and closed using a door knob 1608.

The top wall 1650A is connected to or integral with the right side wall 1650B, the left side wall 1650D, the front wall 1650F and the back wall 1650E. The back wall 1650E is connected to or integral with the left side wall 1650D and the right side wall 1650B. The bottom wall 1650C is connected to or integrated with the right side wall 1650B, the left side wall 1650D, the front wall 1650F and the back wall 1650E.

A space is formed between the back wall 1650E and the front wall 1650F, between the left side wall 1650D of the FOUP 1600 and the right side wall 1650B, and between the top wall 1650A and the bottom wall 1650C of the FOUP 1600. The FOUP 1600 is a container having the housing and is enclosed when the door 1606 is closed. The FOUP 1600 has a handle 1602 for carrying the FOUP 1600 and has a base 1604 for placement of the FOUP 1600 on the port of the EFEM.

The FOUP 1600 has multiple support extensions 1610A, 1610B, 1610C, and 1610D. Each support extension 1610A-1610D has a base layer, such as a base layer 1616, extending from the back wall 1650E in a direction along the x-axis.

Each support extension 1610A-1610D supports the cleaning assembly 220. For example, the support extension 1610A has multiple columns or posts 1614A, 1614B, and 1614C that extend from the base layer 1616. Each column 1614A-1614C has a recession, such as a slot or a concave surface in the downward direction, at its top for receiving a corresponding one of the protrusions 412A-412C. For example, the column 1614A has a recession, such as a recession 1618, for receiving the protrusion 412A, the column 1614B has a recession for receiving the protrusion 412B, and the column 1614C has a recession for receiving the protrusion 412C to support the cleaning assembly 220. As another example, the protrusion 412A fits with the recession 1618 on a top surface of the column 1614A, the protrusion 412B fits with the recession on a top surface of the column 1614B, and the protrusion 412C fits with the recession on a top surface of the column 1614C. As yet another example, the protrusion 412A moves vertically downward into the recession 1618 and is surrounded by the recession 1618 after the movement. An axis 1620 passes perpendicularly through a center of a triangular plane formed by the support extensions 1610A-1610D.

In one embodiment, the protrusions 412A-412C are pre-aligned with respect to the recessions of the columns 1614A-1614C so that there is no need to align the protrusions 412A-412C when placed on the rotational section 408. For example, an orientation of the rotational section 408 in the xy plane with respect to the x-axis is the same as or substantially the same as an orientation of the columns 1614A-1614C in the xy plane with respect to the x-axis. To illustrate, when an angle of 60 degrees is formed by the column 1614A with respect to the x-axis in the xy-plane, the same angle or an angle within a pre-determined range, such as ±2%, from the angle of 60 degrees is formed by the protrusion 412A with respect to the x-axis in the xy-plane. There is no need to control the rotational section 408 to rotate and align the protrusions 412A-412C immediately before the cleaning assembly 220 is being placed on the rotational section 408. Rather, the rotational section 408 has a default orientation of the alignment that is achieved each time after being controlled and operated by the host computer 102 (FIG. 1).

Figure 16B:
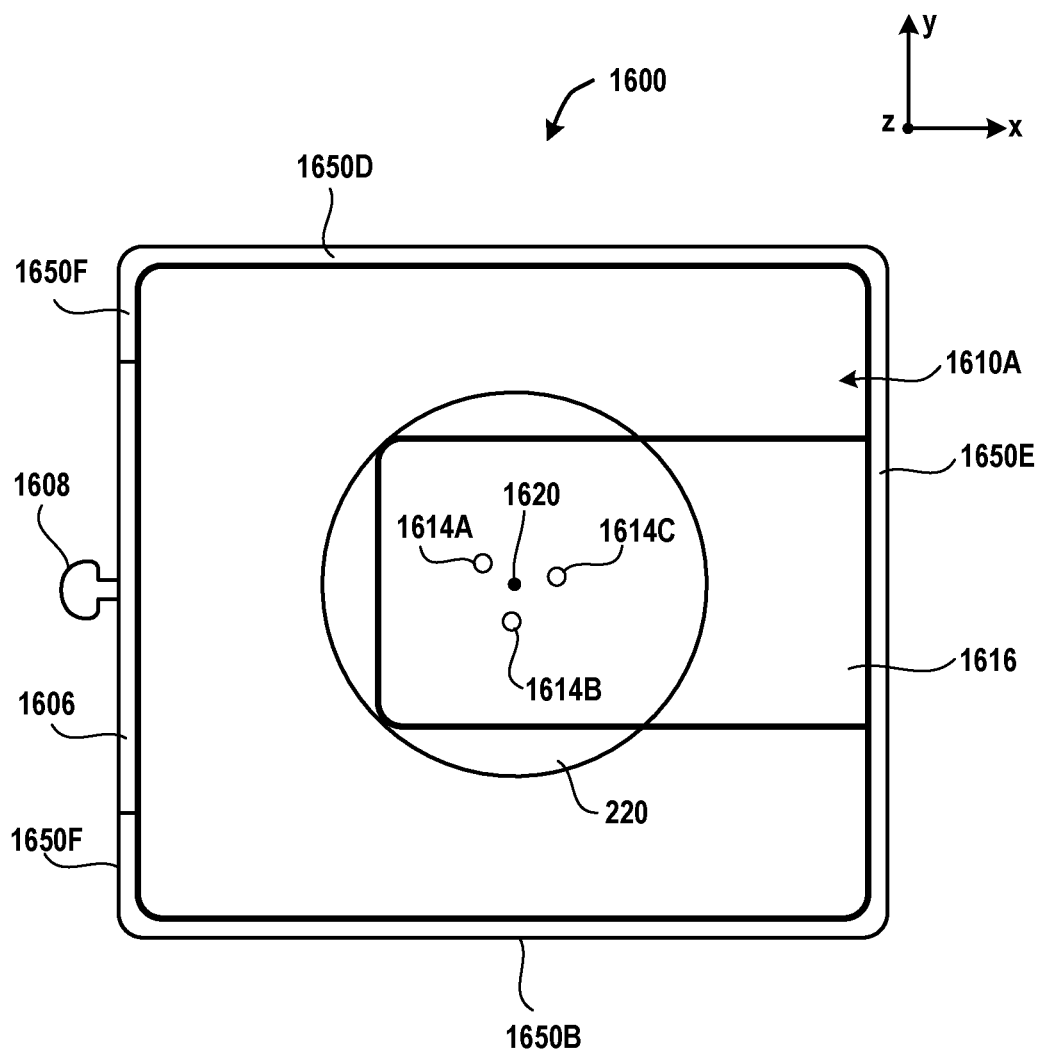
FIG. 16B is a diagram of an embodiment of a top view of the FOUP.

FIG. 16B is a diagram of an embodiment of a top view of the FOUP 1600. The base 1616 extends from the back wall 1650E in the negative x-direction, along the x-axis. The columns 1614A-1614C form a triangular pattern to provide kinematic support to the cleaning assembly 220.

Figure 17A:
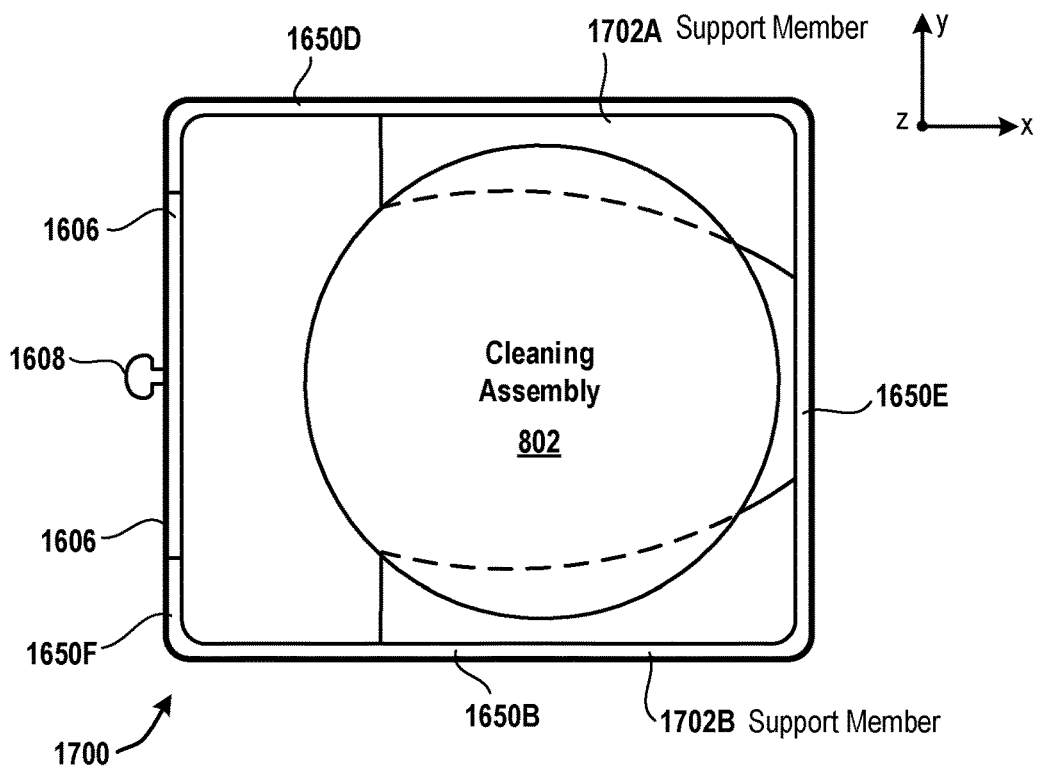
FIG. 17A is a top view of an embodiment of a FOUP for storage of multiple cleaning assemblies.

FIG. 17A is a top view of an embodiment of a FOUP 1700 for storage of multiple cleaning assemblies, such as the cleaning assembly 802. The FOUP 1700 is an example of the pod 204A or the pod 204B (FIG. 2). The FOUP 1700 has the same structure as the FOUP 1600 (FIG. 16A) except that instead of the support extensions, such as the support extensions 1610A-1610D, the FOUP 1700 includes a support member 1702A and a support member 1702B. The support member 1702A is connected to or integral with the back wall 1650E and the left side wall 1650D and extends from the walls 1650D and 1650E into the space within the FOUP 1700 until it can support a left edge of the cleaning assembly 802. Similarly, the support member 1702B is connected to or integral with the back wall 1650E and the right side wall 1650B and extends from the walls 1650B and E into the space within the FOUP 1700 until it can support a right edge of the cleaning assembly 802. The right edge of the cleaning assembly 802 is opposite to the left edge of the cleaning assembly 802. The support member 1702A is aligned in the y-direction with the support member 1702B to support the left and right edges of the cleaning assembly 802.

The FOUP 1700 includes a column of multiple support members, such as the support member 1702A, connected to or integral with the back wall 1650E and the left side wall 1650D. Similarly, the FOUP 1700 includes a column of multiple support members, such as the support member 1702B, connected to or integral with the back wall 1650E and the right side wall 1650B. Each column of support members extends in the z-direction.

In one embodiment, the FOUP 1700 includes the support extensions 1610A-1610D of the FOUP 1600 without the columns, such as the columns 1614A-1614C, of the support extensions, to support the cleaning assembly 802.

Figure 17B:
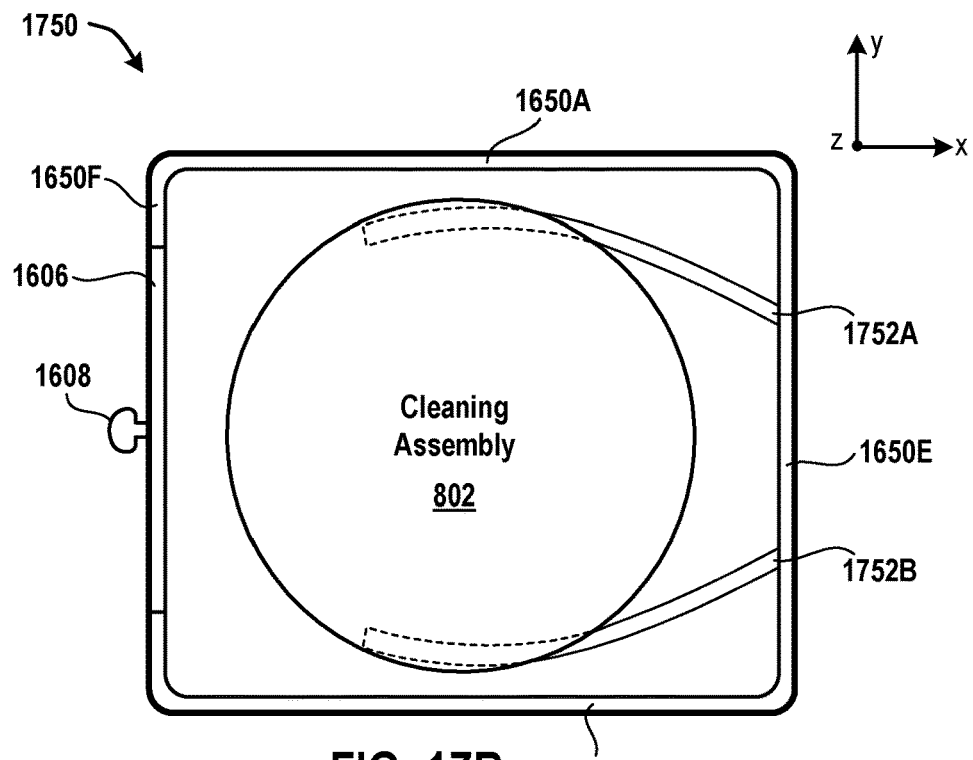
FIG. 17B a top view of another embodiment of a FOUP for storage of multiple cleaning assemblies.

FIG. 17B a top view of an embodiment of a FOUP 1750 for storage of multiple cleaning assemblies, such as the cleaning assembly 802. The FOUP 1750 is an example of the pod 204A or the pod 204B (FIG. 2). The FOUP 1750 has the same structure as the FOUP 1600 (FIG. 16A) except that instead of the support extensions, such as the support extensions 1610A-1610D, the FOUP 1750 includes a tine 1752A and a tine 1752B. Sometimes a tine is referred to herein as a prong. The tine 1752A is connected to or integral with the back wall 1650E and extends from the back wall 1650E into the space within the FOUP 1700 to support the left edge of the cleaning assembly 802. Similarly, the tine 1752B is connected to or integral with the back wall 1650E and extends from the tine 1752B into the space within the FOUP 1750 to support the right edge of the cleaning assembly 802. The tine 1752A is aligned in the y-direction with the tile 1752B to support the left and right edges of the cleaning assembly 802.

The FOUP 1750 includes a column of multiple tines, such as the tine 1752A, connected to or integral with the back wall 1650E. Similarly, the FOUP 1750 includes a column of multiple tines, such as the tine 1752B, connected to or integral with the back wall 1650E. Each column of tines extends in the z-direction.

Figure 18A:
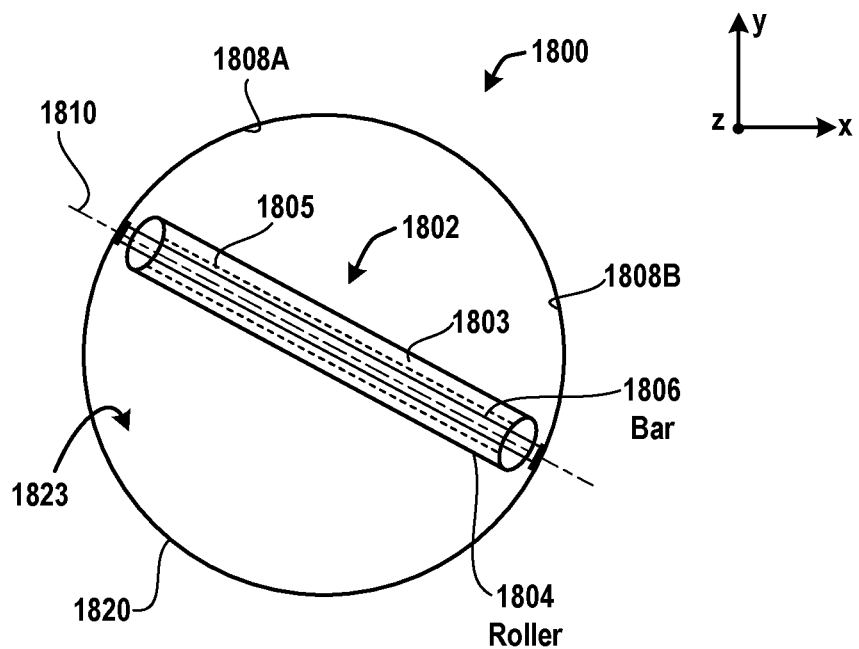
FIG. 18A is a top view of an embodiment of a cleaning assembly to illustrate a roller system within one roller.

FIG. 18A is a bottom view of an embodiment of a cleaning assembly 1800 to illustrate a roller system 1802 having one roller 1804. As an example, the cleaning assembly 1800 has a circular cross-section, as viewed in the z-direction, and the cleaning assembly 1800 has one circular side surface that has inside surface portions 1808A and 1808B. Half of an inside surface of the cleaning assembly 1800 forms the inside surface portion 1808A and the remaining half of the inside surface forms the inside surface portion 1808B.

The cleaning assembly 1800 includes the roller system 1802 and has a housing 1820. The housing 1820 forms an opening 1823. The inside surface portions 1808A and 1808B face the opening 1823. The roller system 1802 has a bar 1806 and a roller 1804. A bar is sometimes referred to herein as a rod. The bar 1806 is fabricated from a metal, such as aluminum or an alloy of aluminum. As another example, the bar 1806 is fabricated from ceramic. The roller 1804 is made from the cleaning material. For example, the roller 1804 has the cleaning layer 456 (FIG. 4C) or the cleaning layer 804 (FIG. 10) or the cleaning layer 1202 or 1206 or 1210 or 1214 or 1218 or 1222 or 1226 (FIGS. 12A-12G) wrapped around the bar 1806.

The roller 1804 has a uniform or a substantially uniform outer diameter. For example, a diameter of an outer surface 1803 of the roller 1804 along a center axis 1810 of the bar 1806 is within 1-2% of a pre-determined diameter. The center axis 1810 that passes through a centroid of the bar 1806. The outer surface 1803 is opposite to an inner surface 1805 of the roller 1804. The inner surface 1805 is adjacent to the bar 1806 and the outer surface 1803 is not adjacent to the bar 1806. The inner surface 1805 is closer to the center axis 1810 compared to the inner surface 1805. A gap is created between the inner surface 1805 and the bar 1806 to facilitate rotation of, such as a rolling motion of, the roller 1804 around the bar 1806 for cleaning the showerhead 108.

The bar 1806 is attached to the inside surface portions 1808A and 1808B of the cleaning assembly 1800. The roller 1804 is wrapped around the bar 1806 to roll around the center axis 1810 of the bar 1806. For example, one edge of the roller 1804 is attached to, such as glued to or chemically bonded, an opposite edge of the roller 1804 after being rolled around the bar 1806 to wrap the roller 1804 around the bar 1806. As another example, the roller 1804 is fabricated using a molding machine to have a hole passing along a length of the roller 1804 to allow passage of the bar 1806 through the hole. The roller 1804 rolls with respect to the center axis 1810 with rotation of the spindle 212 (FIG. 2) around the axis 216 (FIG. 2), or with rotation of the rotation of the rotational section 408 (FIG. 4A) around the axis 413 (FIG. 4A), or a combination thereof. The roller 1804 rolls to clean the showerhead 108.

Figure 18B:
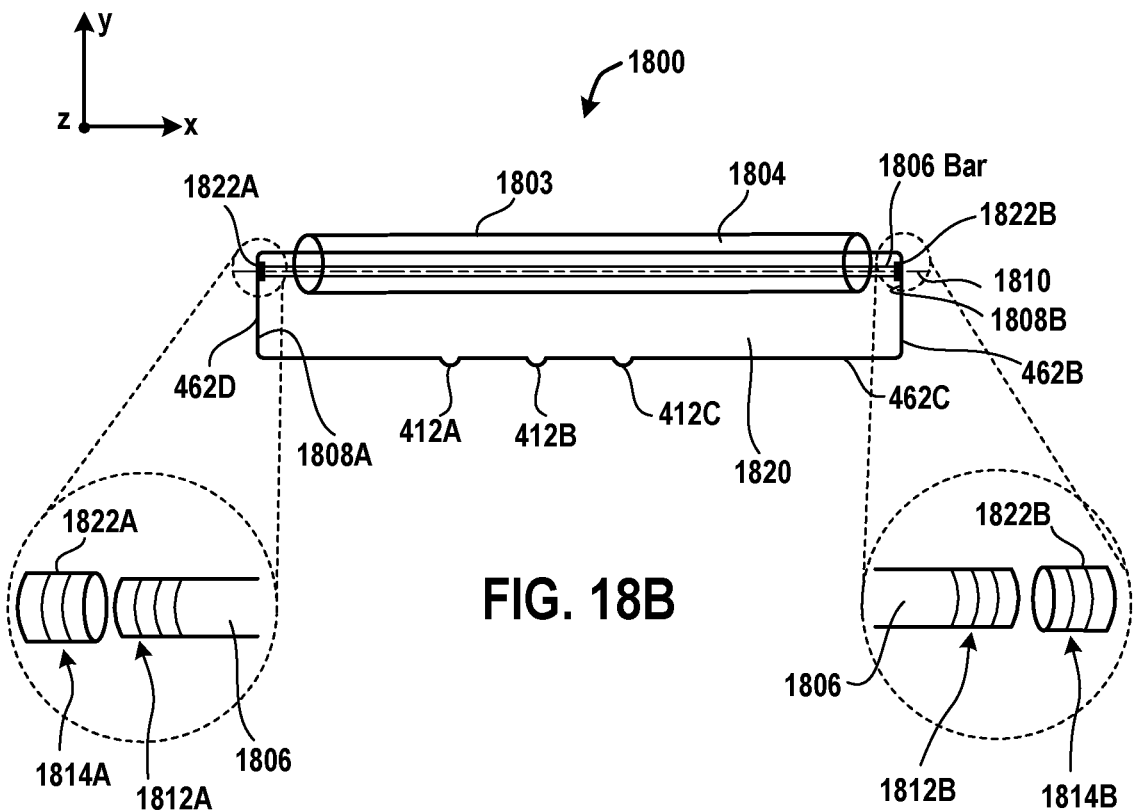
FIG. 18B is a side view of an embodiment of the cleaning assembly of FIG. 18A.

FIG. 18B is a side view of an embodiment of the cleaning assembly 1800. The housing 1820 (FIG. 18A) of the cleaning assembly 1800 includes the side surface portions 462B and 462D and the bottom surface 462C. The housing 1820 also has the protrusions 412A-412C that extend from the flat portion of the bottom surface 462C. The opening 1823 of the housing 1820 is surrounded by the inside surface of the cleaning assembly 1800 and the bottom surface 462C. The opening 1823 is not enclosed by a top surface of the housing 1820.

A receptor attachment 1822A of the roller system 1802 is attached, such as screwed to, to the inside surface portion 1808A of the housing 1820 and another receptor attachment 1822B of the roller system 1802 is attached to the inside surface portion 1808B. The receptor attachments 1822A and 1822B are made from a metal, such as aluminum or an alloy of aluminum. The receptor attachment 1822A has screw threads 1814A and the receptor attachment 1822B has screw threads 1814B.

The bar 1806 has screw threads 1812A and 1812B at each of its two ends. The bar 1806 fits with the receptor attachment 1822A when the screw threads 1812A engage with the screw threads 1814A. Similarly, the bar 1806 fits with the receptor attachment 1822B when the screw threads 1812B engage with the screw threads 1814B.

In one embodiment, instead of the bar 1806 being fixed to the inside surface portions 1808A and 1808B and the roller 1804 rotating around the bar 1806, ball bearings are inserted inside and affixed to the inner surface portions 1808A and 1808B, and the roller 1804 is fixed with respect to the bar 1806. The bar 1806 is attached to the ball bearings. For example, instead of the receptor attachments 1822A and 1822B, the ball bearings can be used. The roller 1804 is fixed with respect to the bar 1806 to have none or minimal gap between the inner surface 1805 of the roller 1804 and the bar 1806 so as to not rotate around the bar 1806. The roller 1804 and the bar 1806 rotate around the center axis 1810 with rotation of the ball bearings. The ball bearings rotate with the rotation of the spindle 212 around the axis 216 or with the rotation of the rotational section 408 around the axis 413.

Figure 19A:
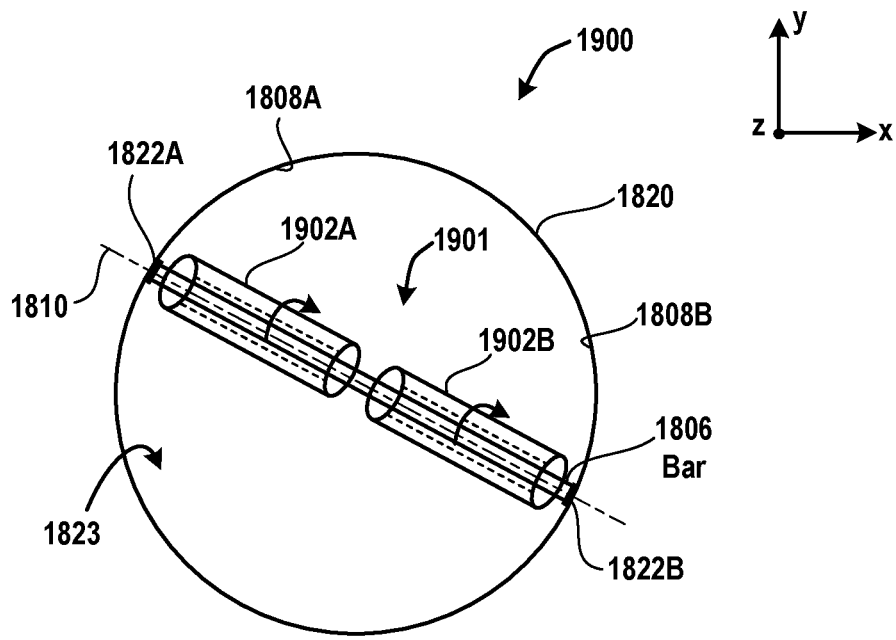
FIG. 19A is a top view of an embodiment of a cleaning assembly to illustrate a roller system with two rollers.

FIG. 19A is a diagram of an embodiment of a cleaning assembly 1900 to illustrate a roller system 1901 with two rollers 1902A and 1902B. The cleaning assembly 1900 is the same in structure as the cleaning assembly 1800 (FIG. 18A) except that the cleaning assembly 1900 has two rollers 1902A and 1902B instead of one.

Each roller 1902A and 1902B is made from the cleaning material. For example, each roller 1902A and 1902B has the cleaning layer 456 (FIG. 4C) or the cleaning layer 804 (FIG. 10) or the cleaning layer 1202 or 1206 or 1210 or 1214 or 1218 or 1222 or 1226 (FIGS. 12A-12G) wrapped around the bar 1806. Each roller 1902A and 1902B has a substantially uniform diameter or a uniform diameter in the same manner as that described above with reference to the roller 1804 (FIG. 18A).

Each roller 1902A and 1902B is wrapped around the bar 1806 to roll around the center axis 1810 of the bar 1806. For example, one edge of the roller 1902A is attached to, such as glued to or chemically bonded, an opposite edge of the roller 1902A to wrap the roller 1902A around the bar 1806 after being rolled around the bar 1806. As another example, one edge of the roller 1902B is attached in the same manner to an opposite edge of the roller 1902B after being rolled around the bar 1806 to wrap the roller 1902B around the bar 1806. As another example, the roller 1902A is fabricated using a molding machine to have a hole passing along a length of the roller 1902A to allow passage of the bar 1806 and the roller 1902B is fabricated using the molding machine to have a hole passing along a length of the roller 1902B to allow passage of the bar 1806. Each roller 1902A and 1902B rolls with respect to the center axis 1810 with rotation of the spindle 212 (FIG. 2) with respect to the axis 216 (FIG. 2), or with rotation of the rotation of the rotational section 408 (FIG. 4A) with respect to the axis 413 (FIG. 4A), or a combination thereof. Each roller 1902A and 1902B rolls to clean the showerhead 108. Each roller 1902A and 1902B is wrapped around the bar 1806 to create a gap is created between an inner surface of the roller and the bar 1806 to facilitate rotation of the roller with respect to the bar 1806. The gap between the inner surface of each roller 1902A and 1902B and the bar 1806 is created in the same manner in which the gap is created between the inner surface 1805 of the roller 1804 (FIG. 18A) and the bar 1806.

Figure 19B:
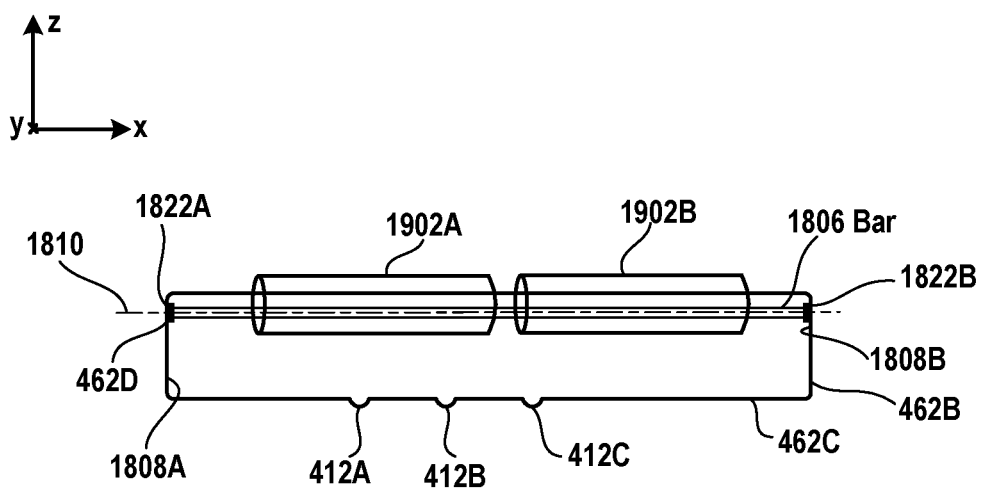
FIG. 19B is a side view of an embodiment of the cleaning assembly of FIG. 19A.

FIG. 19B is a side view of an embodiment of the cleaning assembly 1900. The housing 1820 has the receptor attachments 1822A and 1822B. The receptor attachment 1822A engages with the end of the bar 1806 having the screw threads 1812A (FIG. 18B) and the receptor attachment 1822B engages with the opposite end of the bar 1806 having the screw threads 1812B (FIG. 18B).

In one embodiment, the more than two rollers, such as three or four rollers, are wrapped around the bar 1806 to clean the showerhead 108.

In an embodiment, instead of the bar 1806 being fixed to the inside surface portions 1808A and 1808B and the rollers 1902A and 1902B rotating around the bar 1806, ball bearings are inserted inside and affixed to the inner surface portions 1808A and 1808B, and the rollers 1902A and 1902B are fixed with respect to the bar 1806. The bar 1806 is attached to the ball bearings. For example, instead of the receptor attachments 1822A and 1822B, the ball bearings can be used. The rollers 1902A and 1902B are fixed with respect to the bar 1806 to have none or minimal gap between inside surfaces of the rollers 1902A and 1902B and the bar 1806 to not rotate around the bar 1806. The rollers 1902A and 1902B and the bar 1806 rotate around the center axis 1810 with rotation of the ball bearings. The ball bearings rotated with the rotation of the spindle 212 around the axis 216 or with the rotation of the rotational section 408 around the axis 413.

Figure 20A:
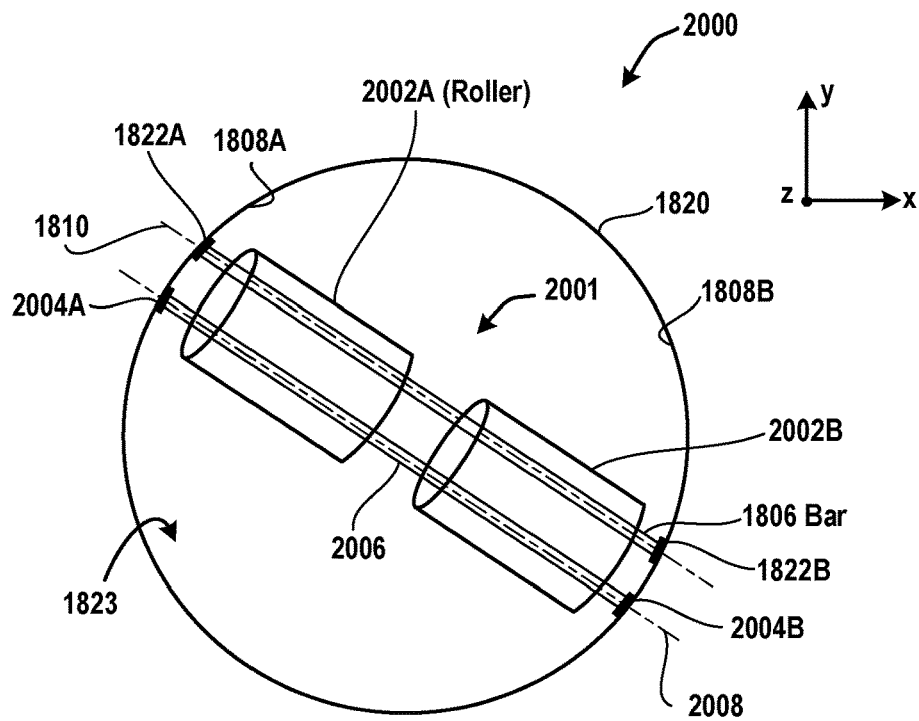
FIG. 20A is a top view of an embodiment of a cleaning assembly to illustrate a roller system in which each roller is wrapped around two bars.

FIG. 20A is a top view of an embodiment of a cleaning assembly 2000 to illustrate a roller system 2001 in which each roller is wrapped around two bars. The cleaning assembly 2000 includes the housing 1820 and has the same structure as the cleaning system 1900 (FIG. 19A) except that the cleaning assembly 2000 includes the roller system 2001. The roller system 2001 of the cleaning assembly 2000 includes the bar 1806, another bar 2006, and rollers 2002A and 2002B.

Each roller 2002A and 2002B is wrapped around the bars 1806 and 2006. For example, one edge of the roller 2002A is attached to, such as glued to or chemically bonded, an opposite edge of the roller 2002A after being rolled around the bars 1806 and 2006 to wrap the roller 2002A around the bars 1806 and 2006. As another example, one edge of the roller 2002B is attached in the same manner to an opposite edge of the roller 2002B after being rolled around the bars 1806 and 2006 to wrap the roller 2002B around the bars 1806 and 2006. As another example, the roller 2002A is fabricated using a molding machine to have a hole passing along a length of the roller 2002A to allow passage of the bars 1806 and 2006 and the roller 2002B is fabricated using the molding machine to have a hole passing along a length of the roller 2002B to allow passage of the bars 1806 and 2006. Each roller 2002A and 2002B has a substantially uniform diameter or a uniform diameter in the same manner as that described above with reference to the roller 1804 (FIG. 18A). Each roller 2002A and 2002B is wrapped around the bars 1806 and 2006 to create a gap is created between an inner surface of the roller and the bars 1806 and 2006 to facilitate rotation of the roller with respect to the bars 1806 and 2006.

The bar 2006 is fabricated from a metal, such as aluminum or an alloy of aluminum. As another example, the bar 2006 is fabricated from ceramic. Each roller 2002A and 2002B is made from the cleaning material. For example, the roller 1804 has the cleaning layer 456 (FIG. 4C) or the cleaning layer 804 (FIG. 10) or the cleaning layer 1202 or 1206 or 1210 or 1214 or 1218 or 1222 or 1226 (FIGS. 12A-12G) wrapped around the bars 1806 and 2006.

The bar 2006 is attached to the inside surface portions 1808A and 1808B in the same manner in which the bar 1806 is attached to the inside surface portions 1808A and 1808B. For example, a receptor attachment 2004A is screwed to the inside surface portion 1808A and another receptor attachment 2004B is screwed to the inside surface portion 1808B.

A first end of the rod 2006 is engaged with the receptor attachment 2004A in the same manner in which the rod 1806 is engaged with the receptor attachment 1822A. For example, screw threads at a first end of the rod 2006 engages with screw threads of the receptor attachment 2004A. Similarly, a second of the rod 2006 is engaged with the receptor attachment 2004B in the same manner in which the rod 1806 is engaged with the receptor attachment 1822B. For example, screw threads at a second end of the rod 2006 engages with screw threads of the receptor attachment 2004B. The bar 2006 has a center axis 2008 that passes through a centroid of the bar 2006.

The rollers 2002A and 2002B roll with respect to the center axes 1810 and 2008 with rotation of the spindle 212 (FIG. 2) with respect to the axis 216 (FIG. 2), or with rotation of the rotation of the rotational section 408 (FIG. 4A) with respect to the axis 413 (FIG. 4A), or a combination thereof. The rollers 2002A and 2002B roll to clean the showerhead 108.

In one embodiment, the cleaning assembly 2000 includes more than two, such as three, four, or five, rollers 2002A and 2002B, which are wrapped around the bars 1806 and 2006.

In one embodiment, instead of the bars 1806 and 2006 being fixed to the inside surface portions 1808A and 1808B and the rollers 2002A and 2002B rotating around the bars 1806 and 2006, ball bearings are inserted inside and affixed to the inner surface portions 1808A and 1808B, and the rollers 2002A and 2002B are fixed with respect to the bars 1806 and 2006. The bars 1806 and 2006 are attached to the ball bearings. For example, instead of the receptor attachments 1822A and 1822B, a pair of ball bearings can be used and instead of the receptor attachments 2004A and 2004B, another pair of ball bearings can be used. The rollers 2002A and 2002B are fixed with respect to the bars 1806 and 2006 to not rotate around the bars 1806 and 2006. For example, there is none or minimal gap between portion of inner surfaces of the rollers 2002A and 2002B and the bars 1806 and 2006 so that the rollers 2002A and 2002B fit tightly around the bars 1806 and 2006. The rollers 2002A and 2002B and the bars 1806 and 2006 rotate around the center axis 1810 with rotation of the ball bearings. The ball bearings rotate with the rotation of the spindle 212 around the axis 216 or with the rotation of the rotational section 408 around the axis 413.

Figure 20B:
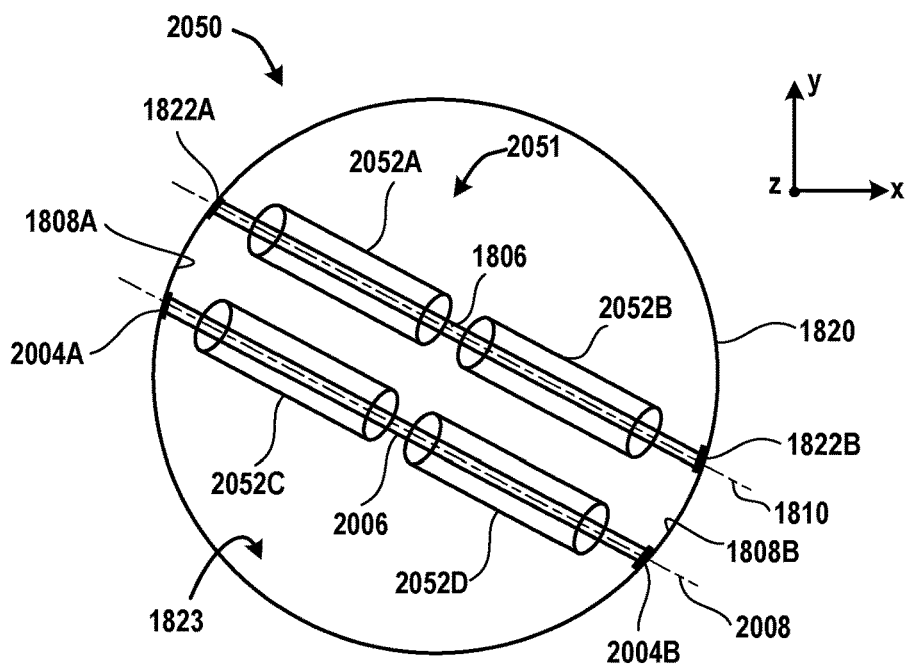
FIG. 20B is a top view of an embodiment of a cleaning assembly to illustrate a roller system having multiple bars and rollers wrapped around each of the bars.

FIG. 20B is a top view of an embodiment of a cleaning assembly 2050 to illustrate a roller system 2051 having the multiple bars 1806 and 2006 and rollers wrapped around each of the bars 1806 and 2006. The cleaning assembly 2050 includes the housing 1820 and has the same structure as the cleaning system 2000 (FIG. 20A) except that the cleaning assembly 2050 includes the roller system 2051. The roller system 2051 of the cleaning assembly 2050 includes rollers 2052A, 2052B, 2052C, and 2052D.

Each roller 2052A and 2052B is wrapped around the bar 1806 and each roller 2052C and 2052D is wrapped around the bar 2006. For example, one edge of the roller 2052A is attached to, such as glued to or chemically bonded, an opposite edge of the roller 2052A after being rolled around the bar 1806 to wrap the roller 2052A around the bar 1806. As another example, one edge of the roller 2052B is attached in the same manner to an opposite edge of the roller 2052B after being rolled around the bar 1806 to wrap the roller 2052B around the bar 1806. As another example, one edge of the roller 2052C is attached to, such as glued to or chemically bonded, an opposite edge of the roller 2052C after being rolled around the bar 2006 to wrap the roller 2052C around the bar 2006 and one edge of the roller 2052D is attached in the same manner to an opposite edge of the roller 2052D after being rolled around the bar 2006 to wrap the roller 2052B around the bar 2006. As yet another example, the roller 2052A is fabricated using a molding machine to have a hole passing along a length of the roller 2052A to allow passage of the bar 1806 and the roller 2052B is fabricated using the molding machine to have a hole passing along a length of the roller 2052B to allow passage of the bar 1806. As another example, the roller 2052C is fabricated using a molding machine to have a hole passing along a length of the roller 2052C to allow passage of the bar 2006 and the roller 2052D is fabricated using the molding machine to have a hole passing along a length of the roller 2052D to allow passage of the bar 2006.

Each roller 2052A and 2052B is wrapped around the bar 1806 to create a gap is created between an inner surface of the roller and the bar 1806 to facilitate rotation of the roller with respect to the bar 1806. The gap between the inner surface of each roller 2052A and 2052B and the bar 1806 is created in the same manner in which the gap is created between the inner surface 1805 of the roller 1804 (FIG. 18A) and the bar 1806. Similarly, each roller 2052C and 2052D is wrapped around the bar 2008 to create a gap is created between an inner surface of the roller and the bar 2008 to facilitate rotation of the roller with respect to the bar 2008.

Each roller 2052A, 2052B, 2052C, and 2052D is made from the cleaning material. For example, the roller 2052A has the cleaning layer 456 (FIG. 4C) or the cleaning layer 804 (FIG. 10) or the cleaning layer 1202 or 1206 or 1210 or 1214 or 1218 or 1222 or 1226 (FIGS. 12A-12G) wrapped around the bar 1806. Each roller 2052A, 2052B, 2052C, and 2052D has a substantially uniform diameter or a uniform diameter in the same manner as that described above with reference to the roller 1804 (FIG. 18A).

The rollers 2052A and 2052B roll with respect to the center axes 1810 and the rollers 2052C and 2052D roll with respect to the center axis 2008 with rotation of the spindle 212 (FIG. 2) with respect to the axis 216 (FIG. 2), or with rotation of the rotation of the rotational section 408 (FIG. 4A) with respect to the axis 413 (FIG. 4A), or a combination thereof. The rollers 2052A, 2052B, 2052C, and 2052D roll to clean the showerhead 108.

In one embodiment, the cleaning assembly 2050 includes more than two, such as three, four, or five, rollers 2002A and 2002B that are wrapped around each of the bars 1806 and 2006.

In an embodiment, the cleaning assembly 2050 has one roller that is wrapped around each of the bars 1806 and 2006. For example, a first roller, such as the roller 1804 (FIG. 18A) is wrapped around the bar 1806 and a second roller, such as the roller 1804, is wrapped around the bar 2006.

In one embodiment, instead of the bar 1806 being fixed to the inside surface portions 1808A and 1808B and the rollers 2052A and 2052B rotating around the bar 1806, ball bearings are inserted inside and affixed to the inner surface portions 1808A and 1808B, and the rollers 2052A and 2052B are fixed with respect to the bar 1806. The bar 1806 is attached to the ball bearings. For example, instead of the receptor attachments 1822A and 1822B, the ball bearings can be used. The rollers 2052A and 2052B are fixed with respect to the bar 1806 to have none or minimal gap between inner surfaces of the rollers 2052A and 2052B and the bar 1806 so as to not rotate around the bar 1806. The rollers 2052A and 2052B and the bar 1806 rotate around the center axis 1810 with rotation of the ball bearings. The ball bearings rotate with the rotation of the spindle 212 around the axis 216 or with the rotation of the rotational section 408 around the axis 413.

Moreover, in the embodiment, instead of the bar 2006 being fixed to the inside surface portions 1808A and 1808B and the rollers 2052C and 2052D rotating around the bar 2006, ball bearings are inserted inside and affixed to the inner surface portions 1808A and 1808B, and the rollers 2052C and 2052D are fixed with respect to the bar 2006. The bar 2006 is attached to the ball bearings. For example, instead of the receptor attachments 2004A and 2004B, the ball bearings can be used. The rollers 2052C and 2052D are fixed with respect to the bar 2006 to have none or minimal gap between inner surfaces of the rollers 2052C and 2052D and the bar 2006 so as to not rotate around the bar 2006. The rollers 2052C and 2052D and the bar 2006 rotate around the center axis 2008 with rotation of the ball bearings. The ball bearings rotate with the rotation of the spindle 212 around the axis 216 or with the rotation of the rotational section 408 around the axis 413.

FIG. 21A is a side view of an embodiment of a roller 2100 having a cleaning layer 2102 and the press plate 806. Examples of the cleaning layer 2102 include the cleaning layer 456 (FIG. 4C) or the cleaning layer 804 (FIG. 10) or the cleaning layer 1202 or 1206 or 1210 or 1214 or 1218 or 1222 or 1226 (FIGS. 12A-12G) wrapped around press plate 806.

The press plate 806 is wrapped around a bar 2106 to form a gap 2103 (FIG. 21B) between an inner surface 2105 (FIG. 21B) of the press plate 806 and the bar 2106. For example, one edge of the press plate 806 is attached to, such as glued to or chemically bonded, an opposite edge of the press plate 806 after being rolled around the bar 2106 to wrap the press plate 806 around the bar 2106. As another example, a roll of the press plate 806 is fabricated using a molding machine to have a hole passing along a length of the press plate 806 to allow passage of the bar 2106 through the hole. The bar 2106 is an example of the bar 1806 (FIG. 18A), or the bar 2008 (FIG. 20A). The bar 2106 has a center axis 2108 that passes through a centroid of the bar 2106.

It should be noted that instead of any of the rollers 1804 (FIG. 18A), 1902A (FIG. 19A), 1902B (FIG. 19A), 2052A (FIG. 20B), 2052B (FIG. 20B), 2052C (FIG. 20B), and 2052D (FIG. 20B) that has a cleaning layer without a press plate, the roller 2100 having the cleaning layer 2102 and the press plate 806 is used.

FIG. 21B is another side view of an embodiment of the roller 2100. The press plate 806 is attached to, such as glued to or chemically bonded with, the cleaning layer 2102. The press plate 806 is wrapped around the bar 1806 to create the gap 2103 between the inner surface 2105 of the press plate 806 and the bar 1806 to facilitate rotation of the press plate 806 with respect to the bar 1806. The gap 2103 between the inner surface 2105 of the press plate 806 and the bar 1806 is created in the same manner in which the gap is created between the inner surface 1805 of the roller 1804 (FIG. 18A) and the bar 1806. The gap 2103 extends along a length of the roller 2100.

In one embodiment, instead of the bar 2106 being fixed to the inside surface portions 1808A and 1808B (FIG. 18A) and the roller 2100 rotating around the bar 2106, ball bearings are inserted inside and affixed to the inner surface portions 1808A and 1808B, and the roller 2100 is fixed with respect to the bar 2106. The bar 2106 is attached to the ball bearings. For example, instead of the receptor attachments 1822A and 1822B (FIG. 18B), the ball bearings can be used. The roller 2100 is fixed with respect to the bar 2106 to have none or minimal gap between the inner surface 2105 of the press plate 806 and the bar 2106 so as to not rotate around the bar 2106. The roller 2100 and the bar 2106 rotate around the center axis 2108 with rotation of the ball bearings. The ball bearings rotate with the rotation of the spindle 212 around the axis 216 or with the rotation of the rotational section 408 around the axis 413.

FIG. 21C is a side view of an embodiment of a roller 2120 to illustrate a press plate 2122 having multiple protruded sections 2124A, 2124B, 2124C, and 2124D. The protruded sections 2124A-2124D extend from an outer surface 2130 of the press plate 2122. For example, the protruded sections 2124A-2124D extend outward or away from the center axis 2108 of the rod 2106. The roller 2120 further includes a cleaning layer 2126 having multiple receding sections 2128A, 2128B, 2128C, and 2128D.

The press plate 2122 is the same in structure as the press plate 806 (FIG. 21B) except that the press plate 2122 has the protruded sections 2124A-2124D. The press plate 2122 is wrapped around the bar 1806 to create a gap is created between an inner surface of the press plate 2122 and the bar 1806 to facilitate rotation of the press plate 2122 with respect to the bar 1806. The gap between the inner surface of the press plate 2122 and the bar 1806 is created in the same manner in which the gap is created between the inner surface 1805 of the roller 1804 (FIG. 18A) and the bar 1806.

The cleaning layer 2126 is made from the cleaning material. For example, the cleaning layer 2126 is the same in structure as the cleaning layer 2102 except that the cleaning layer 2126 has the receding sections 2128A-2128D.

Each receding section 2128A-2128B extends into an inner surface 2132 of the cleaning layer 2126. For example, the receding sections 2128A-2128B extend outward or away from the center axis 2108 of the rod 2106. The inner surface 2132 is adjacent to the outer surface 2130 of the press plate 2122.

Each protruded section of the press plate 2122 extends into a corresponding receding section of the cleaning layer 2126. For example, the protruded section 2124A extends into the receding section 2128A to fit or engage with the receding section 2128A. Similarly, each of the remaining protruded sections 2124B-2124D extends in respective ones of the receding sections 2128B-2128D to fit or engage with the receding section.

In one embodiment, in addition to the protruded sections 2124A-2124D and the receding sections 2128A-2128D, the inner surface 2132 of the cleaning layer 2126 is attached to, such as glued to or chemically bonded with, the outer surface 2130 of the press plate 2122.

In an embodiment, the press plate 2122 includes more or less than four protruded sections and the cleaning layer 2126 includes the same number of receding sections as that the press plate 2122.

In one embodiment, instead of the bar 2106 being fixed to the inside surface portions 1808A and 1808B (FIG. 18A) and the roller 2120 rotating around the bar 2106 (FIG. 21A), ball bearings are inserted inside and affixed to the inner surface portions 1808A and 1808B, and the roller 2120 is fixed with respect to the bar 2106. The bar 2106 is attached to the ball bearings. For example, instead of the receptor attachments 1822A and 1822B (FIG. 18B), the ball bearings can be used. The roller 2120 is fixed with respect to the bar 2106 to have none or minimal gap between the inner surface 2105 of the roller 2120 and the bar 2106 so as to not rotate around the bar 2106. The roller 2120 and the bar 2106 rotate around the center axis 2108 with rotation of the ball bearings. The ball bearings rotate with the rotation of the spindle 212 around the axis 216 or with the rotation of the rotational section 408 around the axis 413.

Figure 22:
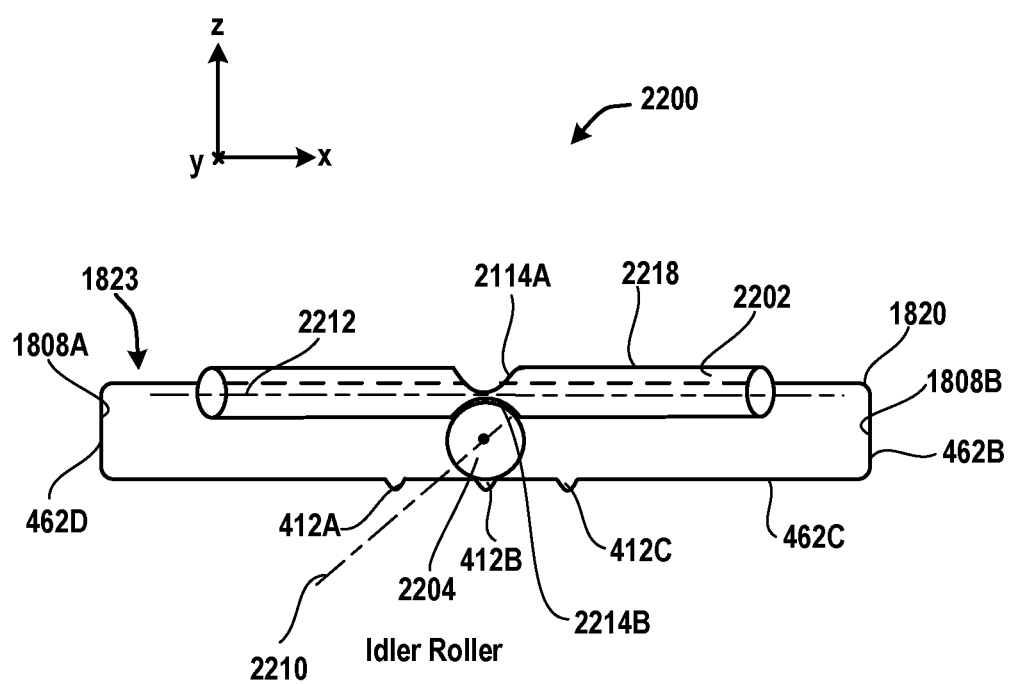
FIG. 22 is a side view of an embodiment of a cleaning assembly with an idler roller.

FIG. 22 is a side view of an embodiment of a cleaning assembly 2200 with an idler roller 2204. The cleaning assembly 2200 includes the housing 1820 and a roller 2202. The idler roller 2204 is attached to, such as glued to, chemically bonded with, or screwed to, the bottom surface 462C of the housing 1820. The idler roller 2204 is fixed with respect to the housing 1820.

The roller 2202 has multiple indentations 2214A and 2214B along the y-axis or a center axis 2210 of the idler roller 2204. For example, the indentations 2214A and 2214B extend inwards from a flat surface 2218 of the roller 2202. To illustrate, the indentations 2214A and 2214B extend toward a center axis 2212 of the roller 2202 to form concave regions in the flat surface 2218. The center axis 2212 passes through a centroid of the roller 2202 and the center axis 2210 passes through a centroid of the idler roller 2204.

The roller 2202 rolls with respect to the center axis 2212 on the idler roller 2204 and moves along the center axis 2210 in the y-direction with rotation of the spindle 212 (FIG. 2) with respect to the axis 216 (FIG. 2), or with rotation of the rotation of the rotational section 408 (FIG. 4A) with respect to the axis 413 (FIG. 4A), or a combination thereof. The roller 2202 rolls to clean the showerhead 108.

In one embodiment, instead of the idler roller 2204 being attached to the bottom surface 462C, the idler roller 2204 is attached to, such as glued to, chemically bonded with, or screwed to, the inside surface portions 1808A and 1808B, of the housing 1820.

Figure 23A:
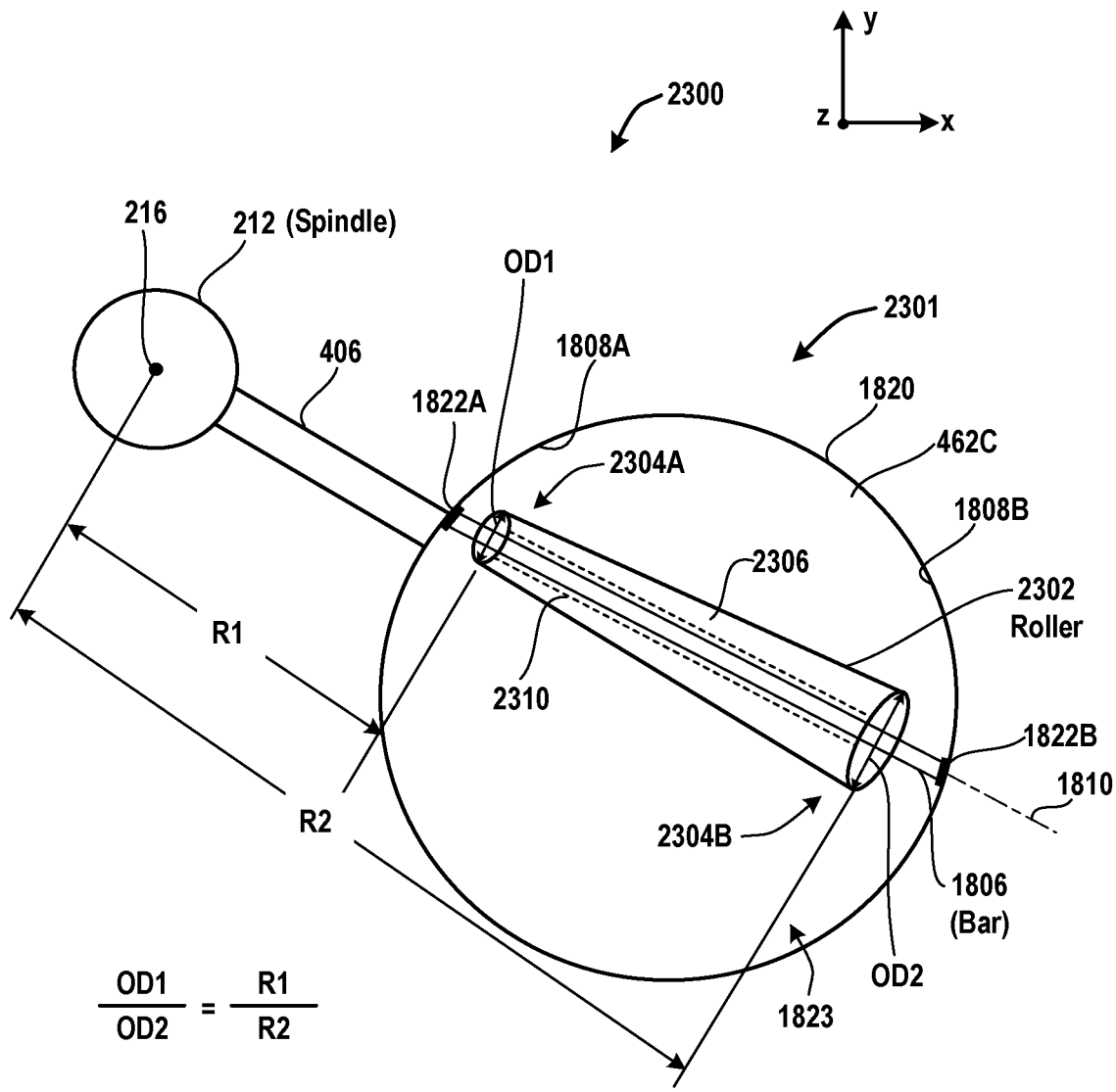
FIG. 23A is a diagram of an embodiment of a system to illustrate a cleaning assembly having a tapered roller.

FIG. 23A is a diagram of an embodiment of a system 2300 to illustrate a cleaning assembly 2301. The cleaning assembly 2301 includes the housing 1820 and a roller 2302, which is tapered. For example, the cleaning assembly 2301 has the same structure as that of the cleaning assembly 1800 (FIG. 18A) except that the cleaning assembly 2301 has the roller 2302 instead of the roller 1804.

The system 2300 includes the cleaning assembly 2301, the spindle 212, and the arm 404 (FIG. 4A) having the elongated section 406 and the rotational section 408 (FIG. 4A).

The roller 2302 has the same structure as that of the roller 1804 (FIG. 18A) except that the roller 2302 is tapered. For example, the roller 2302 has the cleaning layer 456 (FIG. 4C) or the cleaning layer 804 (FIG. 10) or the cleaning layer 1202 or 1206 or 1210 or 1214 or 1218 or 1222 or 1226 (FIGS. 12A-12G) wrapped around the bar 1806 and the cleaning layer is tapered in a manner described below. As another example, the roller 2302 has the press plate 806 and the cleaning layer 2102 (FIG. 21B) except that the cleaning layer 2102 is tapered.

The roller 2302 is tapered towards the spindle 212 to have an outer diameter OD1 of an end 2304A of the roller 2302 to be greater than an outer diameter OD2 of an opposite end 2304B of the roller 2302. A diameter of the roller 2302 is non-uniform along the center axis 1810 of the bar 1806. For example, the outer diameter OD1 is greater by 5% compared to the diameter OD2. To illustrate, the outer diameter OD2 is between 5% and 15% greater compared to the diameter OD1. As another example, the outer diameter OD2 is greater than 2% compared to the diameter OD1. To illustrate, the outer diameter OD2 is between 2% and 15% greater compared to the diameter OD1.

The end 2304A is located in a direction opposite to the end 2304B and faces the spindle 212. The end 2304B faces away from the spindle 212. For example, the end 2304A is closer to the spindle 212 than the end 2304B. As another example, the end 2304A is at a radius R1 from the axis 216 of the spindle 212 and the end 2304B is at a radius R2 from the axis 216, and the radius R2 is greater than the radius R1.

Each outer diameter OD1 and OD2 is a diameter of an outer surface 2306 of the roller 2302. Similarly, the roller 2302 has an inner surface 2310, which wraps around the bar 1806 and is adjacent to the bar 1806. The outer surface 2306 is not adjacent to the bar 1806. Also, the outer surface 2306 is at a distance away from the center axis 1810 of the bar 1806 compared to a distance of the inner surface 2310 from the center axis 1810.

The inner surface 2310 is wrapped around the bar 1806 to create a gap between the inner surface 2310 and the bar 1806 to facilitate rotation of the roller 2302 with respect to the bar 1806. The gap between the inner surface 2310 of the roller 2302 and the bar 1806 is created in the same manner in which the gap is created between the inner surface 1805 of the roller 1804 (FIG. 18A) and the bar 1806.

The roller 2302 is wrapped around the bar 1806. For example, one edge of the roller 2302 is attached to, such as glued to or chemically bonded, an opposite edge of the roller 2302 after being rolled around the bar 1806 to wrap the roller 2302 around the bar 1806. As another example, the roller 2302 is fabricated using a molding machine to have a hole passing along a length of the roller 2302 to allow passage of the bar 1806 through the hole.

The roller 2302 rolls with respect to the center axis 1810 of the bar 1806 with rotation of the spindle 212 with respect to the axis 216, or with rotation of the rotation of the rotational section 408 (FIG. 4A) with respect to the axis 413 (FIG. 4A), or a combination thereof. The roller 2302 rolls to clean the showerhead 108. As an example, a ratio of the outer diameters OD1 and OD2 is the same as a ratio of the radiuses R1 and R2. The match of the ratios of the outer diameters OD1 and OD2 and the radiuses R1 and R2 facilitates uniform cleaning of the showerhead 108 with rotation of the roller 2302 around the center axis 1810.

In one embodiment, instead of the bar 1806 being fixed to the inside surface portions 1808A and 1808B and the roller 2302 rotating around the bar 1806, ball bearings are inserted inside and affixed to the inner surface portions 1808A and 1808B, and the roller 2302 is fixed with respect to the bar 1806. The bar 1806 is attached to the ball bearings. For example, instead of the receptor attachments 1822A and 1822B (FIG. 18B), the ball bearings can be used. The roller 2302 is fixed with respect to the bar 1806 to have none or minimal gap between the inner surface 2310 of the roller 2302 and the bar 1806 so as to not rotate around the bar 1806. The roller 2302 and the bar 1806 rotate around the center axis 1810 with rotation of the ball bearings. The ball bearings rotate with the rotation of the spindle 212 around the axis 216 or with the rotation of the rotational section 408 around the axis 413.

Figure 23B:
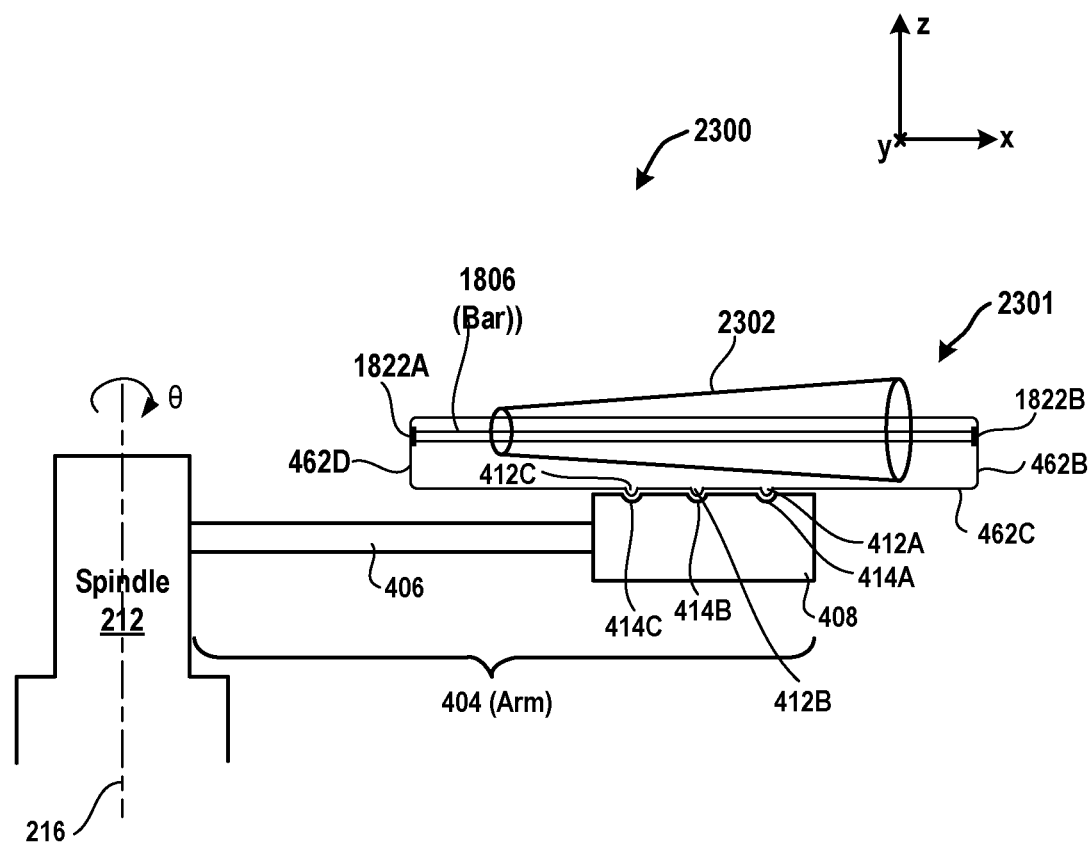
FIG. 23B is a side view of an embodiment of the system of FIG. 23A.

FIG. 23B is a side view of an embodiment of the system 2300. The system 2300 includes the cleaning assembly 2301, the spindle 212, and the arm 404. The bottom surface 462C of the cleaning assembly 2301 is supported on and fitted with respect to the rotational section 408 via the protrusions 414A-414C.

Figure 24:
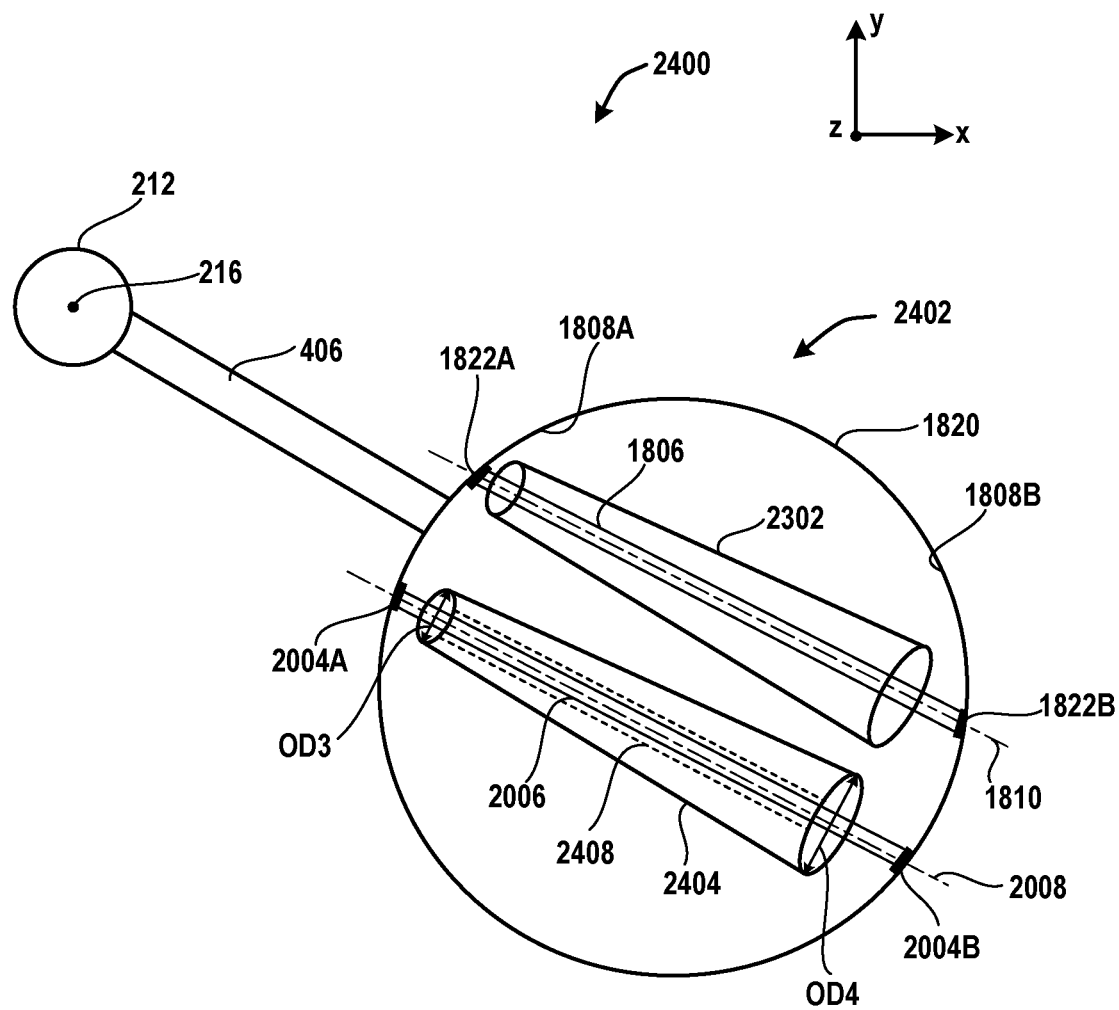
FIG. 24 is a top view of an embodiment of a system to illustrate a cleaning assembly in which two tapered rollers are used instead of one.

FIG. 24 is a top view of an embodiment of a system 2400 to illustrate a cleaning assembly 2402 in which two rollers 2404A and 2404B are used instead of one. The system 2400 includes the cleaning assembly 2402, the spindle 212, and the arm 404 (FIG. 4A). The cleaning assembly 2402 is the same in structure as the cleaning assembly 2050 (FIG. 20B) except that the cleaning assembly 2402 includes the roller 2302 and a roller 2405 instead of the rollers 2052A-2052D (FIG. 20B). For example, the cleaning assembly 2404 has the housing 1820 and the rollers 2402 and 2405. As another example, the roller 2302 is wrapped around the bar 1806 instead of the rollers 2052A and 2052B and the roller 2404 is wrapped around the bar 2006 instead of the rollers 2052C and 2052D.

The roller 2405 has the same structure as that of the roller 2302. For example, the roller 2405 is tapered towards the spindle 212 to have an outer diameter OD3 that is less than an outer diameter OD4. Also, a ratio of the outer diameters OD3 and OD4 is the same as a ratio between the radiuses R1 and R2 (FIG. 23).

An inner surface 2408 of the roller 2404 is wrapped around the bar 2006 to create a gap is created between the inner surface 2408 and the bar 2006 to facilitate rotation of the roller 2404 with respect to the bar 2006. The gap between the inner surface 2408 of the roller 2404 and the bar 2006 is created in the same manner in which the gap is created between the inner surface 1805 of the roller 1804 (FIG. 18A) and the bar 1806.

In one embodiment, more than two tapered rollers, such as three or four, are used in the cleaning assembly 2402.

In one embodiment, instead of the bar 2006 being fixed to the inside surface portions 1808A and 1808B and the roller 2404 rotating around the bar 2006, ball bearings are inserted inside and affixed to the inner surface portions 1808A and 1808B, and the roller 2404 is fixed with respect to the bar 2006. The bar 2006 is attached to the ball bearings. For example, instead of the receptor attachments 2004A and 2004B, the ball bearings can be used. The roller 2404 is fixed with respect to the bar 2006 to have none or minimal gap between the inner surface 2408 of the roller 2404 and the bar 2006 so as to not rotate around the bar 2006. The roller 2404 and the bar 2006 rotate around the center axis 2008 with rotation of the ball bearings. The ball bearings rotate with the rotation of the spindle 212 around the axis 216 or with the rotation of the rotational section 408 around the axis 413.

Figure 25A:
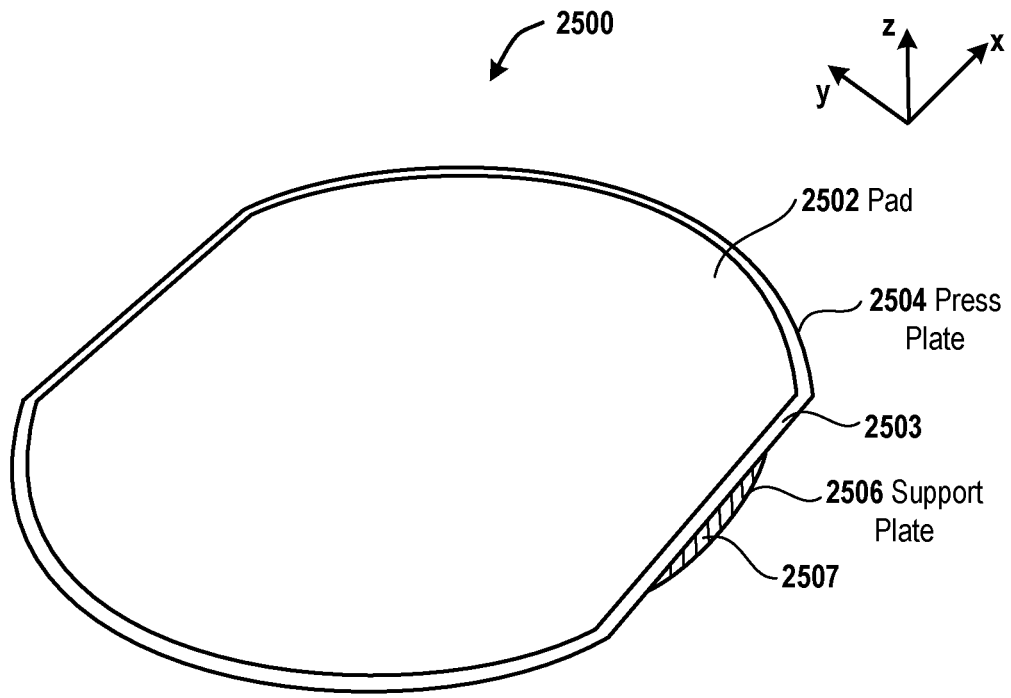
FIG. 25A is an isometric view of an embodiment of a cleaning assembly.

FIG. 25A is an isometric view of an embodiment of a cleaning assembly 2500. The cleaning assembly 2500 is an example of the cleaning assembly 220 (FIG. 2) and the cleaning assembly 222 (FIG. 2). The cleaning assembly 2500 is also an example of the cleaning assembly 550 (FIG. 5C) except that the cleaning layer 456 is replaced with a pad 252.

The cleaning assembly 2500 includes a pad 2502, a press plate 2504, and a support plate 2506. The pad 2502 is fabricated in a molding machine. An example of the pad 2502 is a polymeric pad. As an example, the pad 2502 has a thickness, along the z-axis, that is 0.03 inches or approximately 0.03 inches. For example, the pad 2502 has the thickness that ranges between 0.029 inches (0.029") and 0.031 inches. As an example, the pad 2502 weighs 0.246 pounds (lbs) or approximately 0.246 lbs. For example, the pad 2502 weighs between 0.244 lbs and 0.248 pounds.

The pad 2502 has a smaller size compared to the press plate 2504 to account for thermal expansion of the pad 2502. For example, an edge 2503 of the press plate 2504 is exposed when the pad 2502 is fitted on top of the press plate 2504. To illustrate, a width of the press plate 2504 along the y-axis is greater than a width of the pad 2502 along the y-axis. The exposed plate edge 2503 of the press plate 2504 can be used for automated centering of the cleaning assembly 2500 on the rotational section 408 (FIG. 4A) of the arm 404 (FIG. 4A).

As an example, the pad 2502 has an elongated shape that is combination of a square shape or a rectangular shape and two semi-circular shapes. One of the two semi-circular shapes is fitted to one side of a perimeter of the square shape or the rectangular shape. Another one of the two semi-circular shapes is fitted to an opposite side of the perimeter of the square shape or the rectangular shape. Similarly, the press plate 2504 has an elongated shape that is combination of a square shape and two semi-circular shapes. As an illustration, each of the semi-circular shapes of the press plate 2504 has a radius of 6.5 inches or approximately 6.5 inches. For example, each of the semi-circular shapes of the press plate 2504 has a radius between 6.3 inches and 6.7 inches.

Also, the press plate 2504 is fabricated in a molding machine, and the support plate 2506 is fabricated in a molding machine. As an example, the press plate 2504 is fabricated from alumina or ceramic. Also, as an example, the press plate 2504 has a thickness, along the z-axis, of 0.03 inches or approximately 0.03 inches. To illustrate, the press plate 2504 has the thickness that ranges between 0.029 inches and 0.031 inches. As an example, the press plate 2504 weighs 0.533 lbs or approximately 0.533 lbs. To illustrate, the press plate 2504 weighs between 0.530 pounds and 0.535 pounds.

Also, as illustrated in FIG. 25A, an edge 2507 of the support plate 2506 is exposed when the press plate 2504 is coupled to the support plate 2506. The edge 2507 of the support plate 2506 is exposed compared to the edge 2503 of the press plate 2504. To illustrate, a diameter of the support plate 2506 is greater than the width of the press plate 2504 along the y-axis. The edge 2507 is exposed for notch alignment, which is described below.

As an example, the support plate 2506 has a thickness, along the z-axis, of 0.06 inches or approximately 0.06 inches. To illustrate, the support plate 2506 has the thickness that ranges between 0.055 inches and 0.065 inches. Also as an example, the support plate 2506 weighs 0.925 lbs or approximately 0.925 lbs. To illustrate, the support plate 2506 weighs between 0.9 pounds and 1 pound. As an example, the support plate 2506 has a diameter of 300 millimeters (mm) or approximately 300 mm. For example, the support plate 3506 has the diameter that ranges between 290 mm and 310 mm.

A length of the press plate 2504, along the x-axis, is greater than the width of the press plate 2504. For example, the length of the press plate 2504 is 13 inches or approximately 13 inches and the width of the press plate 2504 is 12 inches or approximately 12 inches. To illustrate, the length of the press plate 2504 ranges between 12.5 and 13.5 inches and the width of the press plate 2504 ranges between 10 and 12 inches.

The pad 2502 is an example of the cleaning layer 804 (FIG. 8). The press plate 2504 is an example of the press plate 554 (FIG. 5C) and the press plate 806 (FIG. 8). The support plate 2506 is an example of the support section 452 (FIG. 4C). The support plate 2506 is an example of the support section 552 (FIG. 5C). The pad 2502 is fitted on to top of the press plate 2504, which is coupled to the support plate 2506.

In one embodiment, the pad 2502 is replaced with the cleaning layer 456 (FIG. 4C).

In an embodiment, the pad 2502 is an example of the flat layer 1102 (FIG. 4C) of the cleaning layer 456 and multiple pillars are formed on top of the pad 2502.

Figure 25B:
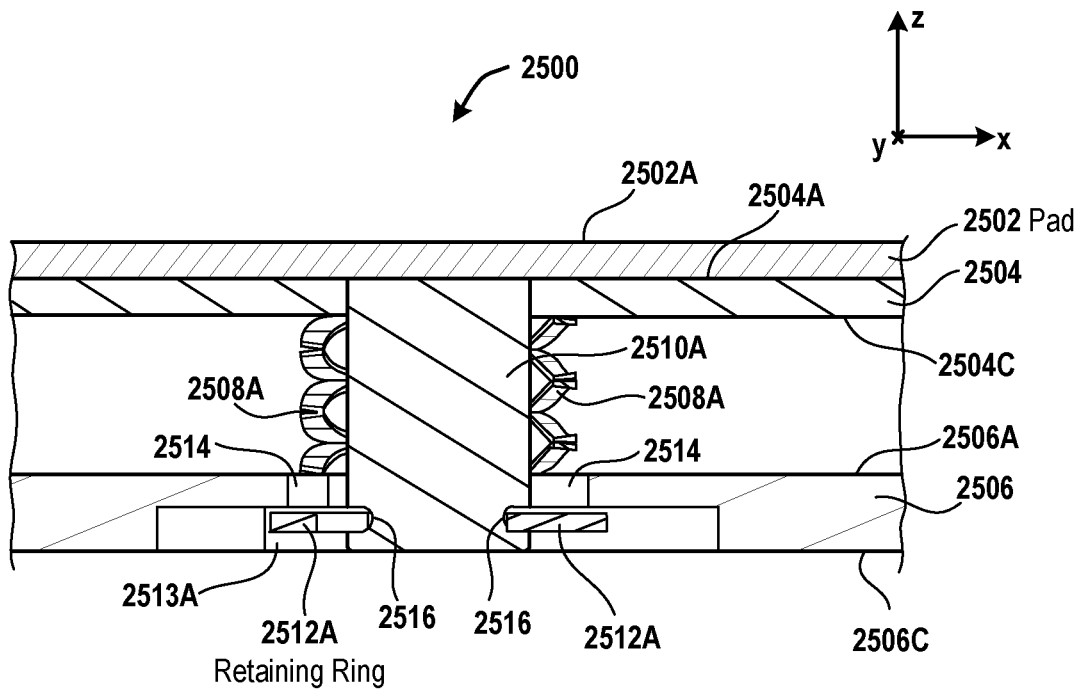
FIG. 25B is a side view of an embodiment of the cleaning assembly of FIG. 25A in a decompressed position.

FIG. 25B is a side view of an embodiment of the cleaning assembly 2500 in a decompressed position. The cleaning assembly 2500 includes a spring 2508A and a pin 2510A. An example of the spring 2508A is a metal wave spring, such as a stainless wave spring. The spring 2508A controls force that is applied to the showerhead 108 (FIG. 1) by the pad 2502. The spring 2508A wraps around the pin 2510A. For example, the pin 2510 passes through the spring 2508A, along the z-axis or along a length of the spring 2508A, so that a length of the pin 2510 is surrounded by the length of spring 2508A.

The pin 2510A is fabricated in a molding machine. The pin 2510A is attached to, such as bonded with, the press plate 2504. For example, the pin 2510A extends through a thickness, along the z-axis, of the press plate 2505 to be chemically bonded to the press plate 2504. The pin 2510A extends through the thickness of the press plate 2505 to reach the pad 2502.

The support plate 2506 includes a hole for receiving the pin 2510A and the hole extends through a depth, along the z-axis, of the support plate 2506. The support plate 2506 also includes a top portion 2514 and a bore 2513A for receiving a retaining ring 2512A. The retaining ring 2512A is fabricated in a molding machine. The pin 2510A has a slot 2516 for receiving the retaining ring 2512A and the retaining ring 2512A circles around the slot 2516 to be retained by the slot 2516. The slot 2516 is a concavity formed on a side surface of the pin 2510A.

The support plate 2506 has the top portion 2514 to which the spring 2508A is fitted. For example, the spring 2508A is attached to the top portion 2514 to fit to the top portion 2514. To illustrate, spring 2508A is attached to the top portion 2514 via screws.

The support plate 2506 has the bore 2513A at its bottom portion to allow for entry and exit of the retaining ring 2512A and the pin 2510A. The bore 2513A is a slot formed in a bottom surface 2506C of the support plate 2506. The bore 2513A is adjacent to the top portion 2514 and surrounds a portion of the pin 2510A and the retainer ring 2512A when the retainer 2512A is within the support plate 2506.

The spring 2508A, the pin 2510A, and the retaining ring 2512A is sometimes referred to herein as a spring mechanism. Multiple spring mechanisms between the press plate 2504 and the support plate 2506 are sometimes referred to herein as a compression interface.

The spring 2508A fits to a bottom surface 2504C of the press plate 2504. For example, the spring 2508A is attached to the bottom surface 2504C to fit to the bottom surface 2504C. To illustrate, the spring 2508A is attached to the bottom surface 2504C by using screws.

A total thickness, along the z-axis, of the cleaning assembly 2500 is between the bottom surface 2506C of the support section 2506 and a top surface 2502A of the pad 2502. As an example, the total thickness of the cleaning assembly 2502 is 0.245 inches or approximately 0.245 inches. To illustrate, the total thickness ranges from 0.225 inches to 0.265 inches. Also, as an example, a total weight of the cleaning assembly 2500 is 1.7 lbs or approximately 1.7 lbs. For example, the total weight of the cleaning assembly 2500 ranges between 1.65 lbs and 1.75 lbs.

The press plate 2504 and the pad 2502 are in the decompressed position, along the z-axis, with respect to the support plate 2506. Also, in the decompressed position, the retaining ring 2510A abuts or almost abuts against the top portion 2514. For example, the retaining ring 2510A is within the bore 2513A and is at a pre-determined distance, along the z-axis, from the top portion 2514 in the decompressed position of the cleaning assembly 2500.

In one embodiment, the cleaning assembly 2500 includes any number of spring mechanisms. For example, the cleaning assembly 2500 includes three spring mechanisms and the three spring mechanisms form vertices of a triangle when viewed in the z-direction.

In an embodiment, each arm 214A-214D (FIG. 2) breaks when 15 lbf force is applied to the arm. So, an amount of force applied to each arm 214A-214D can be limited to 5 lbf, which is one-third the 15 lbf force. The cleaning assembly 2500 weighs 1.7 lbs. As such, a maximum pressing force applied to each arm 214A-214D by the cleaning assembly 2500 resting on the arm remains as a difference between 5 lbf and 1.7 lbf, and the difference amounts to 3.3 lbf. A total weight of the pad 2502 and the press plate 2504 is 0.78 lbs. Hence, a maximum amount of force on each arm 214A-214D applied, at 50% compression, by pad 2502 and the press plate 2504 and the springs between the press plate 2504 and the support plate 2506 is a sum of 3.3 lbf and 0.78 lbs, which amounts to 4.08 lbf. The force of 4.08 amounts to 18.15 newtons (N) per 816 centimeter squared. The amount of force of 18.15 N/cm$^2$ is equal to 0.022 N/cm$^2$. As another example, a maximum amount of force on each arm 214A-214D applied, at 50% compression, by the pad 2502 and the press plate 2504 and the springs between the press plate 2504 and the support plate 2506 ranges between 0.01 N/cm² and 0.1 N/cm².

Figure 25C:
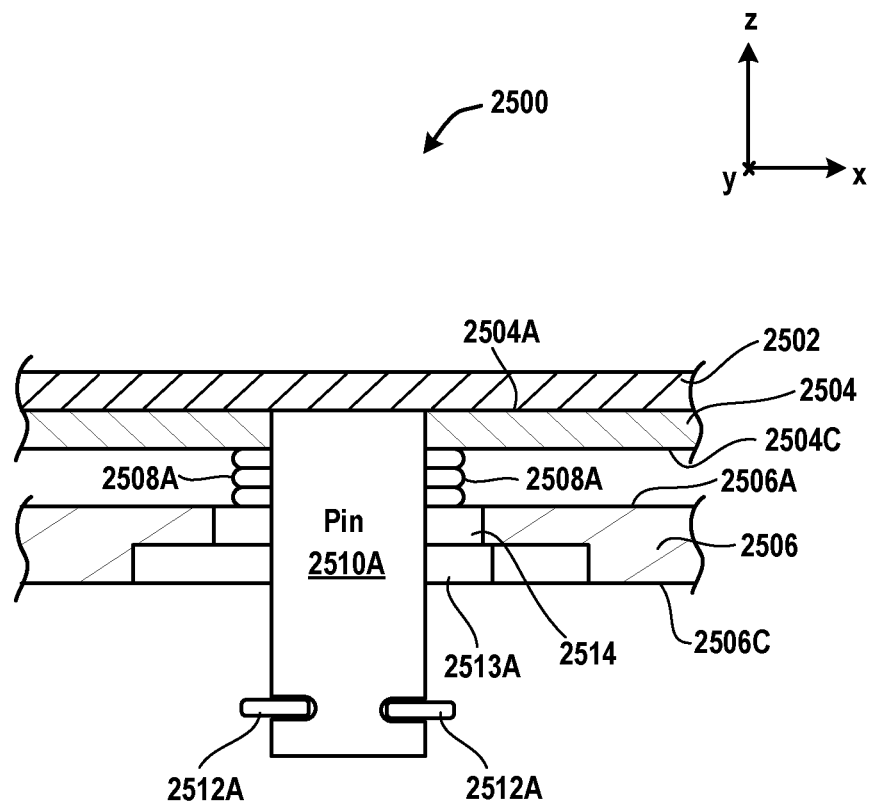
FIG. 25C is a side view of an embodiment of the cleaning assembly of FIG. 25A in a compressed position.

FIG. 25C is a side view of an embodiment of the cleaning assembly 2500 in a compressed position. The press plate 2504 and the pad 2502 are in the compressed position, along the z-axis, with respect to the support plate 2506. For example, the press plate 2504 and the pad 2502 are at a distance, along the z-axis, that is closer to the top surface 2506A of the support plate 2506 compared to a distance, along the z-axis, at which the press plate 2504 and the pad 2502 are in the compressed position. To illustrate, a distance, along the z-axis, between the press plate 2504 and the support plate 2506 in the decompressed position ranges between 0.12 inches and 0.13 inches. To further illustrate, the distance between the press plate 2504 and the support plate 2506 in the decompressed position is 0.125 inches.

Also, in the compressed position, the retaining ring 2512A is at a greater distance, along the z-axis, from the top portion 2514 of the support plate 2506 compared to the pre-determined distance, along the z-axis, from the top portion 5214 in the decompressed position. For example, in the compressed position, the retaining ring 2512A is at a farther distance, along the z-axis, from a bottom surface 2506C of the support plate 2506 compared a distance from the bottom surface 2506C in the decompressed position. As another example, the retaining ring 2512A is outside the bore 2513A in the compressed position. In the decompressed position, the retaining ring 2512A is inside the bore 2513A. In this manner, the spring 2508A provides a degree of movement to the pad 2502 during cleaning of the showerhead 108. The degree of movement is provided by transitioning between the compressed and decompressed positions of the cleaning assembly 2500.

Figure 26A:
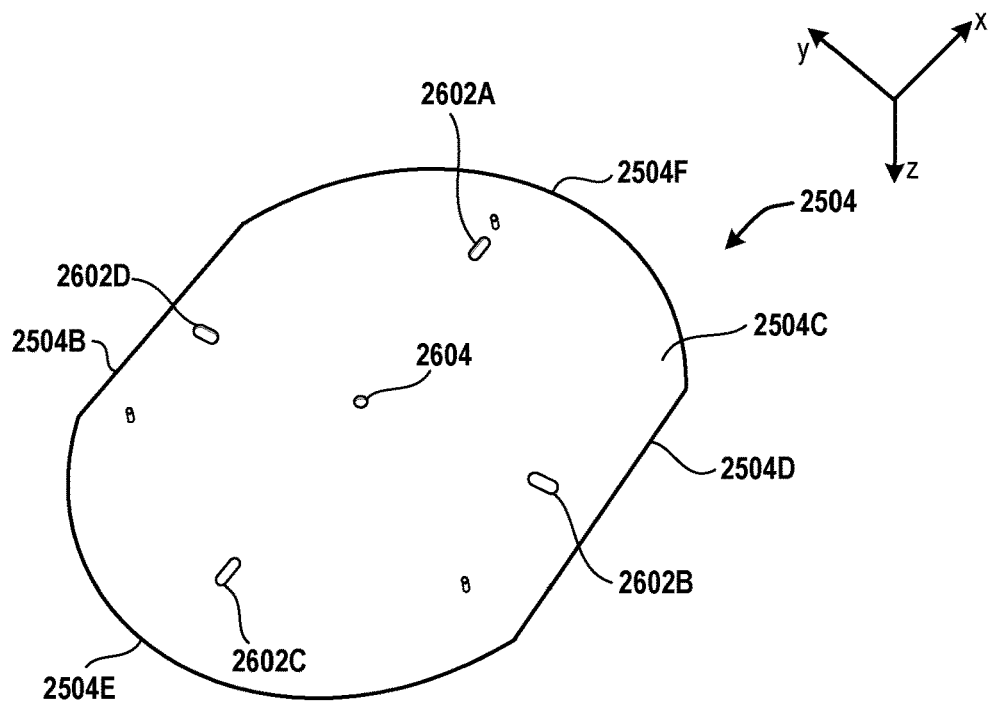
FIG. 26A is an isometric bottom view of an embodiment of a press plate of the cleaning assembly of FIG. 25A.

FIG. 26A is an isometric bottom view of an embodiment of the press plate 2504. The press plate 2504 is not circular in shape and has an elongated shape. For example, two side surfaces 2504B and 2504D of the press plate 2504 are straight and two side surfaces 2504E and 2504F of the press plate 2504 are curved to form the elongated shape. The side surface 2504D is located in a direction opposite to the side surface 2504B along the y-axis. Also, the side surface 2504E is located in a direction opposite to the side surface 2504F along the x-axis. Each of the side surfaces 2504B, 2504D, 2504E, and 2504F is perpendicular or substantially perpendicular to a bottom surface 2504C of the press plate 2504. For example, each of the side surfaces 2504B, 2504D, 2504E, and 2504F forms an angle of 90 degrees or an angle that is within a pre-determined range, e.g., ±5 degrees, from the 90 degree angle with respect to the bottom surface 2504C. Similarly, each of the side surfaces 2504B-2504F are perpendicular or substantially perpendicular to a top surface 2504A of the press plate 2504 and the top surface 2504A is parallel or substantially parallel to the bottom surface 2504C. To illustrate, the top surface 2504A that is substantially parallel to the bottom surface 2504C forms an angle that is within a pre-determined range, e.g., ±5 degrees, from the bottom surface 2504C.

The press plate 2504 includes multiple side slots 2602A, 2602B, 2602C, and 2602D that extend through a body of the press plate 2504 along the z-axis. For example, each side slot 2602A-2602D extends from the top surface 2504A through the body of the press plate 2504 to the bottom surface 2504C of the press plate 2504. The press plate 2504 further includes a center slot 2604 that extends through the body of the press plate 2504 along the z-axis. For example, the center slot 2604 extends from the top surface 2504A through the body of the press plate 2504 to the bottom surface 2504C of the press plate 2504. The center slot 2604 is at a center or a centroid of the press plate 2504, and the side slots 2602A and 2602C are positioned to be at an equal distance or a substantially equal distance from the center slot 2604 along the y-axis. An as example, the side slots 2602A and 2602C are located within ±5% from the equal distance. Also, the side slots 2602B and 2602D are positioned to be at an equal distance or a substantially equal distance from the center slot 2604 along the x-axis. An as example, the side slots 2602B and 2602D are located at a distance from the center slot 2604 and the distance is within a range between 95%-105% of the equal distance.

The side slots 2602A-2602D are elongated compared to the center slot 2604 to allow for thermal expansion of the pad 2502. For example, each of the side slots 2602A-2602D has a surface area that is larger compared to the center slot 2604. As another example, each of the side slots 2602A-2602D has an elongated shape that is combination of a square shape or a rectangular shape and two semi-circular shapes. The combination of the square shape or the rectangular shape with the two semi-circular shapes is described above. As another example, each of the side slots 2602A-2602D allows for the thermal expansion of the pad 2502 of $2.1 \times 10^{-4}$ inches or approximately $2.1 \times 10^{-4}$ inches. To illustrate, each of the side slots 2602A-2602D allows for the thermal expansion of the pad 2502 that ranges between $2.05 \times 10^{-4}$ inches and $2.18 \times 10^{-4}$ inches.

In one embodiment, the terms slot and hole are used herein interchangeably.

Figure 26B:
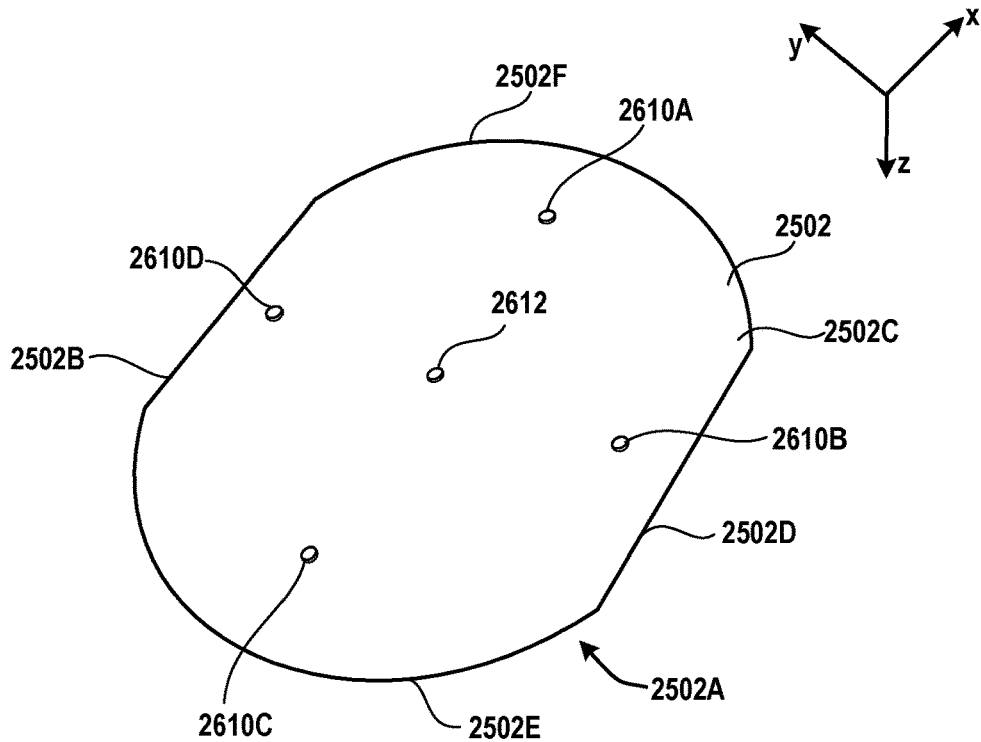
FIG. 26B is an isometric bottom view of an embodiment of a pad of the cleaning assembly of FIG. 25A.

FIG. 26B is an isometric bottom view of an embodiment of the pad 2502. Two side surfaces 2502B and 2502D of the pad 2502 are straight and two side surfaces 2502E and 2502F of the pad 2502 are curved to form an elongated shape of the pad 2502. The side surface 2502D is located in a direction opposite to the side surface 2502B along the y-axis. Also, the side surface 2502E is located in a direction opposite to the side surface 2502F along the x-axis. Each of the side surfaces 2502B, 2502D, 2502E, and 2502F is perpendicular or substantially perpendicular to a bottom surface 2502C of the pad 2502. For example, each of the side surfaces 2502B, 2502D, 2502E, and 2502F forms an angle of 90 degrees or an angle that is within a pre-determined range, e.g., ±5 degrees, from the 90 degree angle with respect to the bottom surface 2502C. Similarly, each of the side surfaces 2502B, 2502D, 2502E, and 2502F are perpendicular or substantially perpendicular to a top surface 2502A of the pad 2502 and the top surface 2502A is parallel or substantially parallel to the bottom surface 2502C. To illustrate, the top surface 2502A that is substantially parallel to the bottom surface 2502C forms an angle that is within a pre-determined range, e.g., ±5 degrees, from the bottom surface 2502C.

The pad 2502 includes multiple side foot extensions 2610A, 2610B, 2610C, and 2610D that extend from a body of the pad 2502 along the z-axis. For example, each foot extension 2610A, 2610B, 2610C, and 2610D extends from the bottom surface 2502C of the body of the pad 2502 along the z-axis. The pad 2502 further includes a center foot extension 2612 that extends from the bottom surface 2502C along the z-axis. For example, the center foot extension 2612 extends in the same direction along the z-axis as each of the side foot extensions 2610A-2610D. The center foot extension 2612 is at a center or a centroid of the pad 2502, and the side foot extensions 2610B and 2610D are positioned to be at an equal distance or a substantially equal distance from the center foot extension 2612 along the y-axis. An as example, the side foot extensions 2610B and 2610D are located within ±5% from the equal distance. Also, the side foot extensions 2610A and 2610C are positioned to be at an equal distance or a substantially equal distance from the center foot extension 2612 along the x-axis. An as example, the side foot extensions 2610A and 2610C are located at a distance from the center foot extension 2612 and the distance is within a range between 95%-105% of the equal distance.

The side foot extensions 2610A-2610D have a circular cross-sectional shape to allow for thermal expansion of the pad 2502. When the pad 2502 thermally expands at the intermediate temperature or at the high temperature, the side slot 2602A allows for a sliding movement of the side foot extension 2610A, the side slot 2602B allows for a sliding movement of the side foot extension 2610B, the side slot 2602C allows for a sliding movement of the side foot extension 2610C, and the side slot 2602D allows for a sliding movement of the side foot extension 2610D. As an example, the pad 2502 is pre-conditioned to thermally expand by bringing the pad 2502 closer to the showerhead 108 (FIG. 1) and letting the pad 2502 expand before cleaning the showerhead 108.

The side foot extension 2610A extends through the side slot 2602A, the side foot extension 2610B extends through the side slot 2602B, the side foot extension 2610C extends through the side slot 2602C, the side foot extension 2610D extends through the side slot 2602D, and the center foot extension 2612 extends through the center slot 2604 to fit the pad 2502 to the press plate 2504. There is no need for an adhesive between the pad 2502 and the press plate 2504 to fit the pad 2502 to the press plate 2502.

Figure 26C:
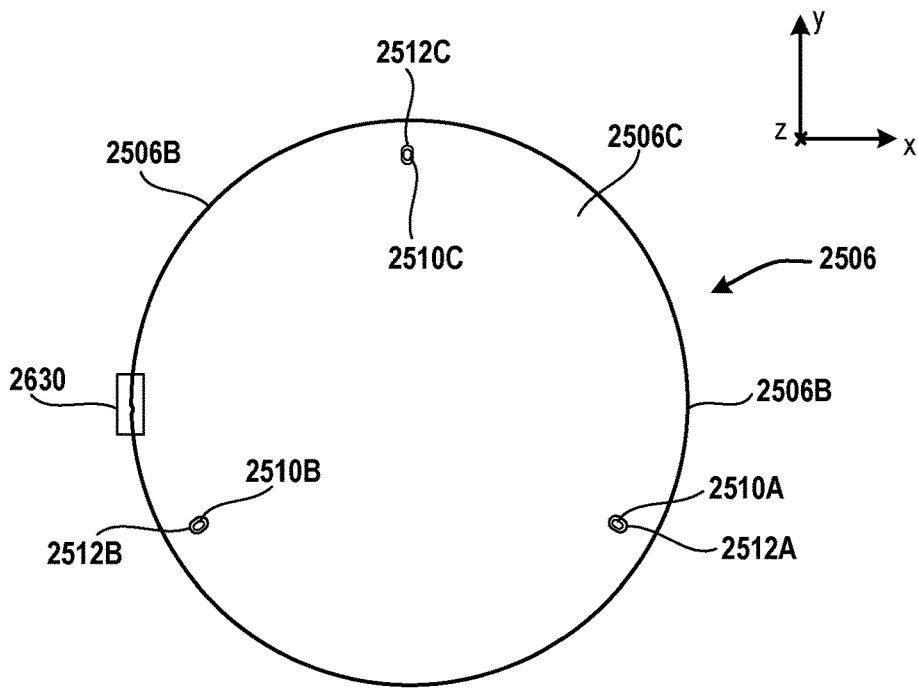
FIG. 26C is a bottom view of an embodiment of a support plate of the cleaning assembly of FIG. 25A.

FIG. 26C is a bottom view of an embodiment of the support plate 2506. The support plate 2506 has the top surface 2506A, a side surface 2506B, and the bottom surface 2506C. The side surface 2506B has a circular shape and is perpendicular or substantially perpendicular with respect to the top surface 2506A and the bottom surface 2506C. For example, the side surface 2506B forms an angle of 90 degrees or an angle that is within ±5% from 90 degrees with respect to the top surface 2506A. As another example, the side surface 2506B forms an angle of 90 degrees or an angle that is within ±5% from 90 degrees with respect to the bottom surface 2506C. The top surface 2506A is parallel or substantially parallel to the bottom surface 2506C. Examples of a top surface and a bottom surface being substantially parallel are provided above.

Visible through the bottom surface 2506C are multiple pins 2510A, 2510B and 2510C, and multiple retaining rings 2512A, 2512B, and 2512C. The retaining ring 2512B is fitted to a slot within the pin 2510B in the same manner in which the retaining ring 2512A is fitted to the slot 2516 (FIG. 25B) within the pin 2510A. Also, retaining ring 2512C is fitted to a slot within the pin 2510C in the same manner in which the retaining ring 2512A is fitted to the slot 2516 within the pin 2510A. In addition, each of the pins 2510B and 2510C extends through a length of a spring in the same manner in which the pin 2510A extends through a length of the spring 2508A is (FIG. 25B).

The pins 2510A-2510C are kinematic pins. For example, the pins 2510A-2510C are located at vertices of a triangle formed on the bottom surface 2506C. A structure of each of the pins 2510B and 2510C is the same as that of the pin 2510A. Also, a function of each of the pins 2510B and 2510C is the same as that of the pin 2510A. Similarly, a structure of each of the retaining rings 2512B and 2512C is the same as that of the retaining ring 2512A. Also, a function of each of the retaining rings 2512B and 2512C is the same as that of the retaining ring 2512A. The same structures of the pins 2510A-2510C and the same structure of the retaining rings 2512A-2512C allows for the degree of movement in the vertical direction of the pad 2502 and the press plate 2504 with respect to the support plate 2506 to compress or decompress the multiple springs between the support section 2506 and the press plate 2504 (FIG. 25A) of the cleaning assembly 2500 (FIG. 25A). The cleaning assembly 2500 also has a notch 2630 for alignment by an aligner, described below.

In one embodiment, any number of pins and retaining rings are used within the support section 2506. For example, five pins and five respective retaining rings are used within the support section 2506. As another example, seven pins and seven respective retaining rings are used within the support section 2506.

Figure 27:
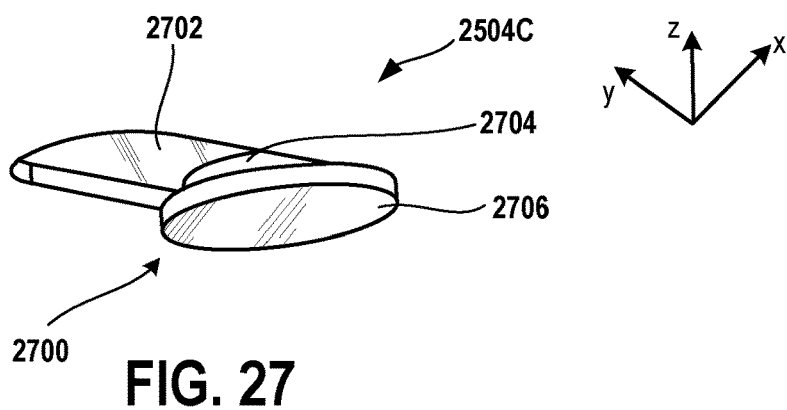
FIG. 27 is an isometric view of an embodiment of a side foot extension of the pad of FIG. 26B and the side foot extension extends below a bottom surface of the press plate of FIG. 26A.

FIG. 27 is an isometric view of an embodiment of a side foot extension 2700 extending below the bottom surface 2504C of the press plate 2504 (FIG. 25A). The foot extension 2700 extends through a side slot 2702 formed within the bottom surface 2504C. The side foot extension 2700 is an example of any of the side foot extensions 2610A-2610D (FIG. 26B). Moreover, the side slot 2702 is an example of any of the side slots 2602A-2602D (FIG. 26A).

The side foot extension 2700 has a top portion 2704 and a bottom portion 2706. The top portion 2704 is on top of the bottom portion 2706 and is integral with the bottom portion 2706. The top portion 2704 has a small circular cross-section, along the z-axis compared to the bottom portion 2706 so that when the bottom portion 2706 passes through the side slot 2702 the bottom portion 2706 abuts the bottom surface 2702 to fit the pad 2502 to the press plate 2504 (FIG. 25A). The bottom portion 2706 contracts as it passes through the side slot 2702 and expands after it passes through the side slot 2702.

Figure 28:
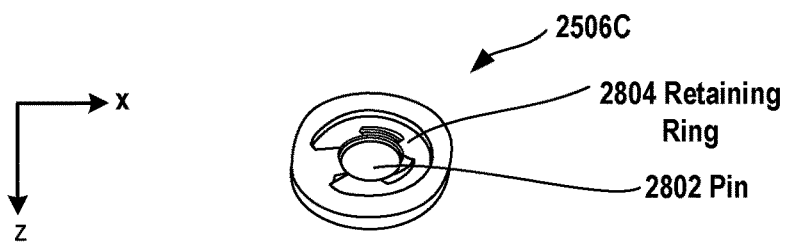
FIG. 28 is a bottom isometric view of an embodiment of an assembly including a pin and a retaining ring of the cleaning assembly of FIG. 25A.

FIG. 28 is a bottom isometric view of an embodiment of an assembly of a pin 2802 and a retaining ring 2804. The pin 2802 is an example of any of the pins 2510A-2510D (FIG. 26C). The retaining ring 2804 is an example of any of the retaining rings 2512A-2512D (FIG. 26C). The pin 2802 and the retaining ring 2804 are capable of extending outside a bore formed within the bottom surface 2506C to extend below the bottom surface 2506C.

FIG. 29A is a front side view of an embodiment of a portion of a FOUP 2900 to illustrate placement of the cleaning assembly 2500 in the FOUP 2900. The FOUP 2900 has the same structure as the FOUP 1600 (FIG. 16A) except that instead of the base layers, such as the base layer 1616 (FIG. 16A), the FOUP 2900 has supports, which are further described below.

The FOUP 2900 is an example of the pod 204A or the pod 204B (FIG. 2). The FOUP 2900 has a base 2902A and a pin 2904A. The base 2902A supports the bottom surface 2506C of the support plate 2506. For example, the bottom surface 2506C is adjacent to the base 2902A when the cleaning assembly 2500 is supported on the base 2902A. The pin 2904A extends upward in the vertical direction from a top surface of the base 2902A. The pin 2904A provides a left side boundary for placement of the cleaning assembly 2500.

FIG. 29B is a top view of an embodiment of the FOUP 2900. The FOUP 2900 includes multiple supports 2902A and 2902B. The support 2902A extends, along the x-axis, from the left side wall 1650D towards the support 2902B and the support 2902B extends, along the x-axis, from the right side wall 1650D towards the support 2902A.

The FOUP 2900 includes multiple posts 2910A and 2910B that extend upward in the vertical direction from the bottom wall 1650C (FIG. 16A) of the FOUP 2900. The FOUP 2900 also includes multiple pins 2904A and 2904B. The pin 2904B extends upward in the vertical direction from a top surface of the base 2902B. The pin 2904B provides a right side boundary for placement of the cleaning assembly 2500.

Also, the cleaning assembly 2500 extends in the FOUP 2900 until the cleaning assembly 2500 reaches the posts 2910A and 2910B. The posts 2910A and 2910B define a stop position for the cleaning assembly 2500 when the cleaning assembly 2500 is placed in the FOUP 2900.

The posts 2904A and 2904B are located behind the supports 2902A and 2902B as viewed in a direction along the y-axis. The cleaning assembly 2500 is supported on a horizontal level that is formed by the supports 2902A and 2902B. The cleaning assembly 2500 is extended via the door 1606 into an enclosure of the FOUP 2900 until the cleaning assembly 2500 abuts against the posts 2904A and 2904B.

When the cleaning assembly 2500 extends into the FOUP 2900, the cleaning assembly is bounded by the posts 2910A and 2910B and by the pins 2904A and 2904B. Also, the cleaning assembly 2500 rests on the supports 2902A and 2902B.

FIG. 30 is a diagram of an embodiment of a plasma system 3000. The plasma system 3000 includes an EFEM 3002, a load lock 3008, a vacuum transfer module (VTM) 3010, a transfer station 3012, another VTM 3014, and multiple plasma chambers 3018, 3020, 3022, and 3024.

The EFEM 3002 has multiple load ports 3006A, 3006B, and 3006C. Also, the EFEM 3002 has an aligner 3016. Each of the plasma chambers 3018-3024 has multiple stations. For example, the plasma chamber 3018 has a station 1, a station 2, a station 3, and a station 4. To illustrate, the plasma chamber 105 (FIG. 2) is an example of the plasma chamber 3018, or the plasma chamber 3020, or the plasma chamber 3022, or the plasma chamber 3024. A FOUP, such as the FOUP 204A or the FOUP 204B, is placed on one of the load ports 3006A-3006C. The EFEM 3002 moves the cleaning assembly 220 (FIG. 2) from the FOUP to the aligner 3016. The cleaning assembly 2500 (FIG. 26C), which is an example of the cleaning assembly 220, is rotated to determine whether the notch 2630 (FIG. 26C) is aligned to further determine whether the cleaning assembly 2500 is aligned.

The EFEM 3002 moves the cleaning assembly 2500 from the aligner 3016 to the load lock 3008. The load lock 3008 sends the cleaning assembly 2500 to the VTM 3010, which transfers the cleaning assembly 2500 to the plasma chamber 3018 or to the plasma chamber 3020 or to the transfer station 3012. The transfer station 3012 transfers the cleaning assembly 2500 to the VTM 3014. The VTM 3014 provides the cleaning assembly 2500 to the plasma chamber 3020 or to the plasma chamber 3022.

The load lock 3008 transfers the cleaning assembly 2500 between the EFEM 3002 and the VTM 3010. The VTM 3010 transfers the cleaning assembly 2500 between the plasma chamber 3018 and the transfer station 3012 or between the transfer station 3012 and the plasma chamber 3024 or between the plasma chambers 3018 and 3024. Also, the transfer station 3012 is used as a storage for transferring the cleaning assembly 2500 between the VTMs 3010 and 3014. The VTM 3014 transfers the cleaning assembly 2500 between the plasma chambers 3020 and 3022 or between the plasma chamber 3020 and the transfer station 3012 or between the plasma chamber 3022 and the transfer station 3012.

FIG. 31A is a front side view of an embodiment of the transfer station 3012. The transfer station 3012 includes a base 3102A. Multiple supports 3104A, 3104B, 3104C, 3104D, and 3104E extend from the base 3102A along the x-axis. The cleaning assembly 2500 is supported by any of the supports 3104A-3104E.

The transfer station 3102 has an inner top surface 3103. An example of a vertical clearance, along the z-axis, between the cleaning assembly 2500 and the inner top surface 3103 is 0.241 inches or approximately 0.241 inches. For example, the vertical clearance ranges between 0.238 inches and 0.245 inches.

FIG. 31B is an isometric view of an embodiment of the transfer station 3012. The transfer station 3012 includes another base 3102B. Multiple supports 3104F, 3104G, 3104H, 3104I, and 3104J extend from the base 3102B along the x-axis. The supports 3104A-3104E extends towards the supports 3104F-3104J and the supports 3104F-3104J extend towards the supports 3104A-3104E. The cleaning assembly 2500 is supported at a horizontal level of and by the supports 3104A and 3104F, or at a horizontal level of and by the supports 3104B and 3104G, or at a horizontal level of and by the supports 3104C and 3104H, or at a horizontal level of and by the supports 3104D and 3104I, or at a horizontal level of and by the supports 3104E and 3104J.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A cleaning assembly, comprising:
 a support section having a bottom side and an upper side, wherein the bottom side is configured to connect to one of a plurality of arms extending from a spindle of a plasma processing tool to move inside the plasma processing tool under vacuum;
a press plate coupled to the upper side of the support section via a compression interface;
a cleaning layer disposed over the press plate, the cleaning layer includes a plurality of pillars,
wherein the cleaning layer is configured to rotate with a rotation of the spindle and the plurality of arms to move in a space between a plurality of pedestals and a plurality of showerheads inside the plasma processing tool, wherein the cleaning layer is configured to contact a surface of one of the plurality of showerheads with a movement of the plurality of arms to cause particulates disposed on said surface of the one of the plurality of showerheads to migrate away from the surface of the one of the plurality of showerheads onto the cleaning layer.

2. The cleaning assembly of claim 1, wherein the compression interface includes a plurality of springs that provide a cushion to the surface when the one of the plurality of arms moves the cleaning layer onto the surface.

3. The cleaning assembly of claim 1, wherein the bottom side of the support section includes a plurality of protrusions to enable said connection to the one of the plurality of arms when said one of the plurality of arms moves the cleaning assembly.

4. The cleaning assembly of claim 1, further comprising,
a cushioning layer disposed between the press plate and the cleaning layer to provide an additional degree of compression absorption when the one of the plurality of arms presses the cleaning layer onto the surface inside of the plasma processing tool.

5. The cleaning assembly of claim 1, wherein the cleaning layer is formed from a polyimide material that is fabricated to define the plurality of pillars.

6. The cleaning assembly of claim 1, wherein the plurality of pillars are arranged in micro-structure patterns that include upper contact surfaces of the plurality of pillars and a lower non-contact surface.

7. The cleaning assembly of claim 6, wherein the movement by the one of the plurality of arms causes the upper contact surfaces to come in proximity or contact with the surface to attract said particulates from the surface and onto one or more of the plurality of pillars, and wherein some of said particulates migrate toward the lower non-contact surface.

8. The cleaning assembly of claim 6, wherein the movement by the one of the plurality of arms causes the upper contact surfaces to come in periodic contact with the surface to attract said particulates from the surface and onto one or more of the plurality of pillars, and wherein some of said particulates migrate toward the lower non-contact surface.

9. The cleaning assembly of claim 6, wherein the movement by the one of the plurality of arms causes the upper contact surfaces to come in contact with and slide in horizontal contact along the surface, and repeat said contact and said slide in horizontal contact along the surface to attract said particulates the surface and onto one or more of the plurality of pillars.

10. The cleaning assembly of claim 6, wherein the movement by the one of the plurality of arms causes the upper contact surfaces to come in contact and slide in horizontal contact in a back and forth motion along the surface to cause said particulates to be removed from the surface and onto one or more of the plurality of pillars.

11. The cleaning assembly of claim 1, wherein said plasma processing tool is interfaced with a load lock for interfacing with a pod used to hold said cleaning assembly and one or more additional cleaning assemblies,
wherein said cleaning assembly is configured to be brought into the plasma processing tool for cleaning of the surface and taken out of the plasma processing tool after the cleaning is performed, wherein said cleaning assembly is configured to be brought into the plasma processing tool and taken out of the plasma processing tool without removing the vacuum from the plasma processing tool.

12. The cleaning assembly of claim 1, wherein the one of the plurality of showerheads is a first showerhead, wherein the spindle is oriented between a set of processing stations, wherein the set of plasma processing stations includes a first plasma processing station and a second plasma processing station, the plurality of pedestals include a first pedestal and a second pedestal, and the plurality of showerheads include a second showerhead, wherein the first plasma processing station includes the first pedestal and the first showerhead and the second plasma processing station includes the second pedestal and the second showerhead.

13. The cleaning assembly of claim 1, wherein the one of the plurality of showerhead is of a processing station in the plasma processing tool.

14. The cleaning assembly of claim 1, wherein the cleaning assembly is a consumable part.

15. The cleaning assembly of claim 1, wherein each of the plurality of pillars is a dome-top pillar, or a mushroom-shaped pillar, or a cone-shaped pillar, or a flat-top pillar, or a recessive-top pillar, or a multi-surface top pillar, or a slotted-top pillar, or a protrusion-top pillar, or a combination thereof.

16. The cleaning assembly of claim 1, wherein the one of the plurality of showerheads is located above one of the plurality of pedestals.

17. The cleaning assembly of claim 1, wherein the one of the plurality of showerheads is a first showerhead, wherein the plurality of showerheads include a second showerhead, wherein the cleaning layer is configured to rotate with the rotation of the spindle and the plurality of arms to be located below the second showerhead of the plasma processing tool after being located below the first showerhead of the plasma processing tool.

18. The cleaning assembly of claim 1, wherein the plurality of pedestals include a first pedestal and a second pedestal, wherein the cleaning layer is configured to rotate with the rotation of the spindle and the plurality of arms to be located above the second pedestal of the plasma processing tool after being located above the first pedestal of the plasma processing tool.

19. The cleaning assembly of claim 1, wherein the one of the plurality of showerheads is a first showerhead, wherein the plurality of showerheads include a second showerhead, wherein the cleaning layer is configured to rotate with the rotation of the spindle and the plurality of arms to be located below the second showerhead of the plasma processing tool after being located below the first showerhead of the plasma processing tool,
wherein the plurality of pedestals include a first pedestal and a second pedestal, wherein the cleaning layer is configured to rotate with the rotation of the spindle and the plurality of arms to be located above the second pedestal of the plasma processing tool after being located above the first pedestal of the plasma processing tool, wherein the first showerhead is located above the first pedestal and the second showerhead is located above the second pedestal.

* * * * *